(12) United States Patent
Yamazaki et al.

(10) Patent No.: US 10,115,831 B2
(45) Date of Patent: *Oct. 30, 2018

(54) SEMICONDUCTOR DEVICE HAVING AN OXIDE SEMICONDUCTOR LAYER COMPRISING A NANOCRYSTAL

(71) Applicant: Semiconductor Energy Laboratory Co., Ltd., Atsugi-shi, Kanagawa-ken (JP)

(72) Inventors: Shunpei Yamazaki, Tokyo (JP); Masayuki Sakakura, Tochigi (JP); Ryosuke Watanabe, Kanagawa (JP); Junichiro Sakata, Kanagawa (JP); Kengo Akimoto, Kanagawa (JP); Akiharu Miyanaga, Kanagawa (JP); Takuya Hirohashi, Kanagawa (JP); Hideyuki Kishida, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/220,532

(22) Filed: Jul. 27, 2016

(65) Prior Publication Data

US 2016/0336456 A1    Nov. 17, 2016

Related U.S. Application Data

(63) Continuation of application No. 13/671,638, filed on Nov. 8, 2012, now Pat. No. 9,406,808, which is a
(Continued)

(30) Foreign Application Priority Data

Oct. 8, 2009  (JP) .................................. 2009-234413

(51) Int. Cl.
*H01L 29/04* (2006.01)
*H01L 29/786* (2006.01)
(Continued)

(52) U.S. Cl.
CPC ...... *H01L 29/7869* (2013.01); *H01L 27/1225* (2013.01); *H01L 29/045* (2013.01);
(Continued)

(58) Field of Classification Search
CPC ............. H01L 29/7869; H01L 27/1225; H01L 29/78693; H01L 29/4908; H01L 29/045;
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001941299 A | 4/2007 |
| CN | 101032027 A | 9/2007 |

(Continued)

OTHER PUBLICATIONS

Taiwanese Office Action (Application No. 105125774) dated Feb. 10, 2017.
(Continued)

*Primary Examiner* — Khiem D Nguyen
(74) *Attorney, Agent, or Firm* — Fish & Richardson P.C.

(57) ABSTRACT

In a channel protected thin film transistor in which a channel formation region is formed using an oxide semiconductor, an oxide semiconductor layer which is dehydrated or dehydrogenated by a heat treatment is used as an active layer, a crystal region including nanocrystals is included in a superficial portion in the channel formation region, and the rest portion is amorphous or is formed of a mixture of amor-
(Continued)

phousness/non-crystals and microcrystals, where an amorphous region is dotted with microcrystals. By using an oxide semiconductor layer having such a structure, a change to an n-type caused by entry of moisture or elimination of oxygen to or from the superficial portion and generation of a parasitic channel can be prevented and a contact resistance with a source and drain electrodes can be reduced.

14 Claims, 26 Drawing Sheets

Related U.S. Application Data continuation of application No. 12/897,419, filed on Oct. 4, 2010, now Pat. No. 8,309,961.

(51) Int. Cl.
H01L 27/12 (2006.01)
H01L 29/45 (2006.01)
(52) U.S. Cl.
CPC ........ *H01L 29/45* (2013.01); *H01L 29/78606* (2013.01); *H01L 29/78696* (2013.01)
(58) Field of Classification Search
CPC ......... H01L 29/78696; H01L 29/41733; H01L 21/02565; H01L 27/3262; H01L 21/02554
See application file for complete search history.

(56) References Cited

U.S. PATENT DOCUMENTS

| | | | |
|---|---|---|---|
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,956,265 B2 | 10/2005 | Nagano et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,265,017 B2 | 9/2007 | Nagano et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,235 B1 | 3/2008 | Yamazaki et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Lwasakit | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,821,036 B2 | 10/2010 | Ehara | |
| 7,855,379 B2 | 12/2010 | Hayashi et al. | |
| 7,910,490 B2 | 3/2011 | Akimoto et al. | |
| 7,919,365 B2 | 4/2011 | Kim et al. | |
| 7,932,521 B2 | 4/2011 | Akimoto et al. | |
| 7,935,964 B2 | 5/2011 | Kim et al. | |
| 7,977,169 B2 | 7/2011 | Hirao et al. | |
| 7,998,372 B2 | 8/2011 | Yano et al. | |
| 8,013,331 B2 | 9/2011 | Wakita | |
| 8,088,652 B2 | 1/2012 | Hayashi et al. | |
| 8,110,436 B2 | 2/2012 | Hayashi et al. | |
| 8,143,115 B2 | 3/2012 | Omura et al. | |
| 8,148,721 B2 | 4/2012 | Hayashi et al. | |
| 8,168,544 B2 | 5/2012 | Chang | |
| 8,207,756 B2 | 6/2012 | Shionoiri et al. | |
| 8,236,635 B2 | 8/2012 | Suzawa et al. | |
| 8,242,494 B2 | 8/2012 | Suzawa et al. | |
| 8,274,077 B2 | 9/2012 | Akimoto et al. | |
| 8,304,765 B2 | 11/2012 | Yamazaki et al. | |
| 8,309,961 B2 * | 11/2012 | Yamazaki | H01L 27/1225 257/59 |
| 8,319,215 B2 | 11/2012 | Yamazaki et al. | |
| 8,343,799 B2 | 1/2013 | Ito et al. | |
| 8,384,077 B2 | 2/2013 | Yano et al. | |
| 8,436,349 B2 | 5/2013 | Sano et al. | |
| 8,466,463 B2 | 6/2013 | Akimoto et al. | |
| 8,566,502 B2 | 10/2013 | Vaghani | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 9,099,562 B2 | 8/2015 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0041170 A1 * | 2/2005 | Chae | G02F 1/13458 349/43 |
| 2005/0199959 A1 | 9/2005 | Chiang et al. | |
| 2005/0263765 A1 | 12/2005 | Maekawa | |
| 2006/0035452 A1 | 2/2006 | Carcia et al. | |
| 2006/0043377 A1 | 3/2006 | Hoffman et al. | |
| 2006/0043447 A1 | 3/2006 | Ishii et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0125996 A1 | 6/2006 | Lim | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0219274 A1 | 10/2006 | Iwata | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 * | 3/2007 | Akimoto | H01L 27/1225 438/795 |
| 2007/0090365 A1 * | 4/2007 | Hayashi | H01L 29/7869 257/72 |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Lwasakit | |
| 2008/0083950 A1 * | 4/2008 | Pan | B82Y 10/00 257/347 |
| 2008/0106191 A1 | 5/2008 | Kawase | |
| 2008/0108229 A1 * | 5/2008 | Tanaka | B23K 26/0613 438/795 |
| 2008/0128689 A1 | 6/2008 | Lee et al. | |

(56) References Cited

U.S. PATENT DOCUMENTS

| | | | |
|---|---|---|---|
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0197350 | A1 | 8/2008 | Park et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2008/0315193 | A1 | 12/2008 | Kim et al. |
| 2008/0318368 | A1 | 12/2008 | Ryu et al. |
| 2009/0001374 | A1 | 1/2009 | Inoue et al. |
| 2009/0008638 | A1 | 1/2009 | Kang et al. |
| 2009/0008639 | A1 | 1/2009 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0140438 | A1 | 6/2009 | Yamazaki et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2010/0051949 | A1 | 3/2010 | Yamazaki et al. |
| 2010/0065839 | A1 | 3/2010 | Yamazaki et al. |
| 2010/0065840 | A1 | 3/2010 | Yamazaki et al. |
| 2010/0065844 | A1 | 3/2010 | Tokunaga |
| 2010/0072467 | A1 | 3/2010 | Yamazaki et al. |
| 2010/0084648 | A1 | 4/2010 | Watanabe |
| 2010/0084650 | A1 | 4/2010 | Yamazaki et al. |
| 2010/0092800 | A1 | 4/2010 | Itagaki et al. |
| 2010/0102312 | A1 | 4/2010 | Yamazaki et al. |
| 2010/0105163 | A1 | 4/2010 | Ito et al. |
| 2010/0109002 | A1 | 5/2010 | Itagaki et al. |
| 2010/0117075 | A1 | 5/2010 | Akimoto et al. |
| 2010/0123136 | A1 | 5/2010 | Lee et al. |
| 2010/0136743 | A1 | 6/2010 | Akimoto et al. |
| 2010/0283049 | A1 | 11/2010 | Sato et al. |
| 2010/0295042 | A1 | 11/2010 | Yano et al. |
| 2010/0301329 | A1 | 12/2010 | Asano et al. |
| 2011/0058116 | A1 | 3/2011 | Yamazaki et al. |
| 2011/0062433 | A1 | 3/2011 | Yamazaki |
| 2011/0062436 | A1 | 3/2011 | Yamazaki et al. |
| 2011/0104851 | A1 | 5/2011 | Akimoto et al. |
| 2011/0117698 | A1 | 5/2011 | Suzawa et al. |
| 2011/0121290 | A1 | 5/2011 | Akimoto et al. |
| 2012/0168750 | A1 | 7/2012 | Hayashi et al. |
| 2012/0295399 | A1 | 11/2012 | Kim et al. |
| 2013/0146452 | A1 | 6/2013 | Yano et al. |
| 2015/0340513 | A1 | 11/2015 | Akimoto et al. |

FOREIGN PATENT DOCUMENTS

| | | |
|---|---|---|
| CN | 101170085 A | 4/2008 |
| CN | 101335212 A | 12/2008 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2264770 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-183854 A | 7/1989 |
| JP | 04-299571 * | 10/1992 ........... H01L 29/784 |
| JP | 04-299571 A | 10/1992 |
| JP | 05-251705 A | 9/1993 |
| JP | 08-264794 A | 10/1996 |
| JP | 10-093099 A | 4/1998 |
| JP | 10-093100 A | 4/1998 |
| JP | 11-505377 | 5/1999 |
| JP | 11-233781 A | 8/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-051139 A | 2/2005 |
| JP | 2006-120382 A | 5/2006 |
| JP | 2006-310759 A | 11/2006 |
| JP | 2007-073559 A | 3/2007 |
| JP | 2007-096055 A | 4/2007 |
| JP | 2007-123861 A | 5/2007 |
| JP | 2007-220820 A | 8/2007 |
| JP | 2007-284342 A | 11/2007 |
| JP | 2007-316583 A | 12/2007 |
| JP | 2008-147524 A | 6/2008 |
| JP | 2008-166716 A | 7/2008 |
| JP | 2008-235871 A | 10/2008 |
| JP | 2008-281988 A | 11/2008 |
| JP | 2009-004787 A | 1/2009 |
| JP | 2009-016844 A | 1/2009 |
| JP | 2009-099847 A | 5/2009 |
| JP | 2009-099953 A | 5/2009 |
| JP | 2009-158940 A | 7/2009 |
| KR | 2009-0065271 A | 6/2009 |
| TW | 200802889 | 1/2008 |
| TW | 200915579 | 4/2009 |
| WO | WO-2004/114391 | 12/2004 |
| WO | WO-2006/025609 | 3/2006 |
| WO | WO-2007/058231 | 5/2007 |
| WO | WO-2007/094501 | 8/2007 |
| WO | WO-2007/148601 | 12/2007 |
| WO | WO-2008/069056 | 6/2008 |
| WO | WO-2008/069255 | 6/2008 |
| WO | WO-2008/105347 | 9/2008 |
| WO | WO-2008/126879 | 10/2008 |
| WO | WO-2009/034953 | 3/2009 |
| WO | WO-2009/041713 | 4/2009 |
| WO | WO-2009/072532 | 6/2009 |
| WO | WO-2009/075281 | 6/2009 |
| WO | WO-2009/093625 | 7/2009 |

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

International Search Report (Application No. PCT/JP2010/066613) dated Oct. 19, 2010.

Written Opinion (Application No. PCT/JP2010/066613) dated Oct. 19, 2010.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 33, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Carrier transport in transparent oxide semiconductor with intrinsic structural randomness proded using single-crystalline InGaO3(ZnO)5 films", Appl. Phys. Lett. (Applied Physics Letters), Sep. 13, 2004, vol. 85, No. 11, pp. 1993-1995.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 399-902.

Oba.F et al., "Defect energetics in ZnO: A hybrid Hartree-Fock density functional study", Phys. Rev. B. (Physical Review. B); 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.Sang-Hee et al., "42.3: Transparent ZnO Thin Film Transistor for the Application of High Aperture Ratio Bottom Emission AM-OLED Display)", SID Digest '03 : SID International Symposium Digest of Technical Papers, May 20, 2008, vol. 39, pp. 629-632.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID INternational Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chinese Office Action (Application No. 201080045818.5) dated Jun. 27, 2014.

Taiwanese Office Action (Application No. 104131799) dated Feb. 15, 2016.

Korean Office Action (Application No. 2017-7020800) dated Oct. 25, 2017.

Chinese Office Action (Application No. 201510551447.2) dated Sep. 28, 2017.

\* cited by examiner

FIG. 4A1
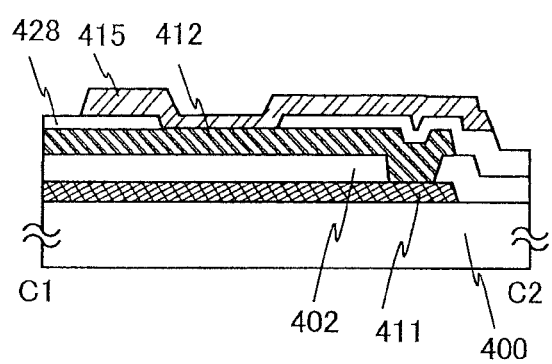
FIG. 4A2
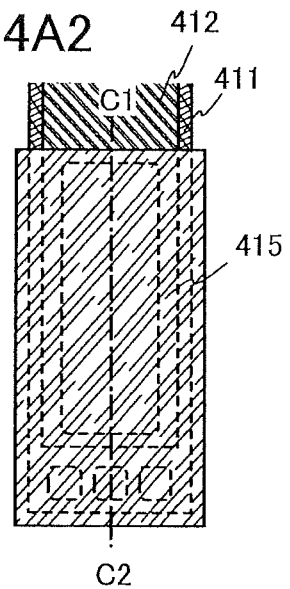
FIG. 4B1
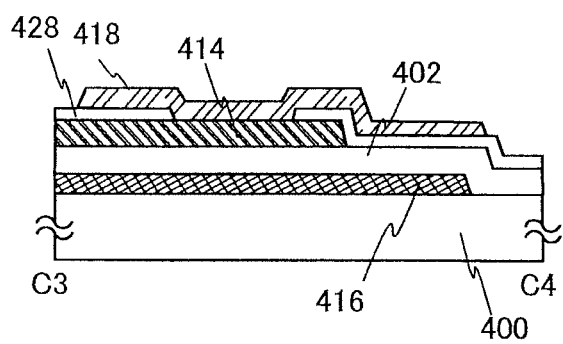
FIG. 4B2
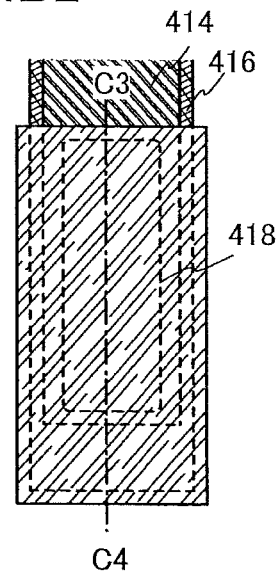

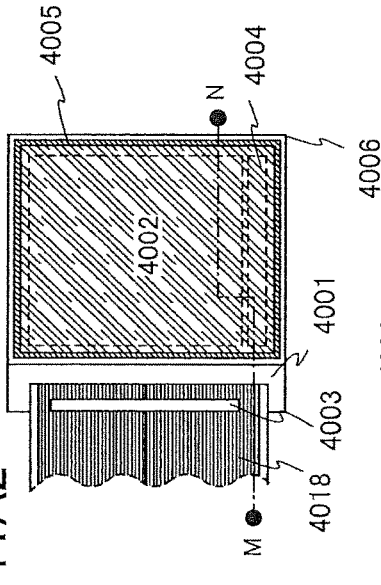
FIG. 11A1
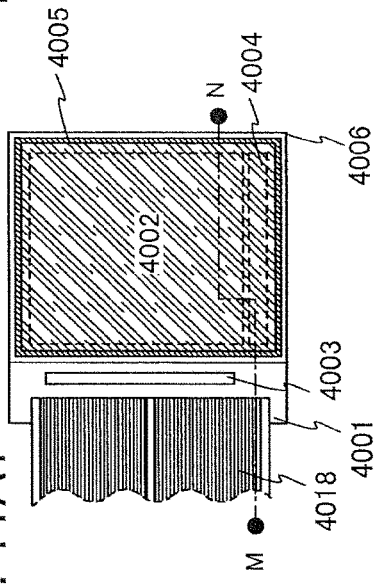
FIG. 11A2
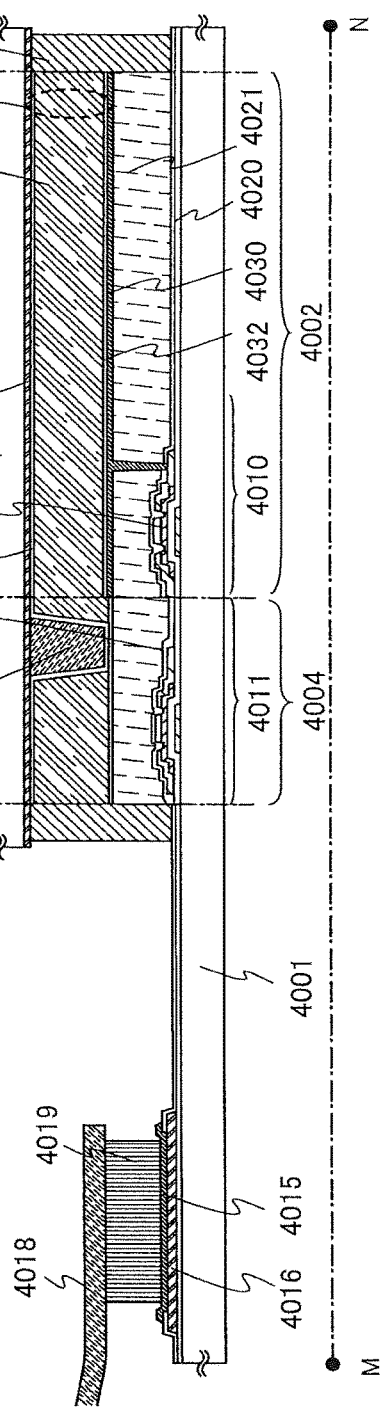
FIG. 11B driving circuit portion | pixel portion Crystal Structure of $In_2Ga_2ZnO_7$

SEMICONDUCTOR DEVICE HAVING AN OXIDE SEMICONDUCTOR LAYER COMPRISING A NANOCRYSTAL

CROSS-REFERENCE TO RELATED APPLICATIONS

This application is a continuation of U.S. application Ser. No. 13/671,638, filed Nov. 8, 2012, now U.S. Pat. No. 9,406,808 now allowed, which is a continuation of U.S. application Ser. No. 12/897,419, filed Oct. 4, 2010, now U.S. Pat. No. 8,309,961, which claims the benefit of a foreign priority application filed in Japan as Serial No. 2009-234413 on Oct. 8, 2009, all of which are incorporated by reference.

TECHNICAL FIELD

The present invention relates to a semiconductor device, a display device and an electronic appliance which use the semiconductor device.

BACKGROUND ART

In recent years, techniques to form thin film transistors (TFT) using a semiconductor thin film (with a thickness of approximately several nanometers to several hundreds of nanometers) which is formed over a substrate having an insulating surface have attracted attention. Thin film transistors are widely applied to electronic devices such as ICs and electro-optic devices and are particularly expected to be rapidly developed as switching elements of image display devices. Various metal oxides are used for a variety of applications. An indium oxide is a well-known material and is used as a transparent electrode material which is necessary for liquid crystal displays and the like.

Some metal oxides have semiconductor characteristics. Examples of such metal oxides having semiconductor characteristics include a tungsten oxide, a tin oxide, an indium oxide, and a zinc oxide. A thin film transistor in which a channel formation region is formed using such metal oxides having semiconductor characteristics is known (Patent Documents 1 and 2).

Furthermore, TFTs using oxide semiconductors have high field effect mobility. Therefore, driver circuits of display devices and the like can also be formed using the TFTs.

REFERENCES

Patent Documents

[Patent Document 1] Japanese Published Patent Application No. 2007-123861
[Patent Document 2] Japanese Published Patent Application No. 2007-96055

DISCLOSURE OF INVENTION

In the case where a plurality of circuits which are different from each other is formed over an insulating surface, for example, when a pixel portion and a driver circuit are formed over one substrate, excellent switching characteristics such as a high on-off ratio are needed for a thin film transistor used for the pixel portion, and high operation speed is needed for a thin film transistor used for the driver circuit. In particular, as the definition of a display device is higher, writing time of a display image is reduced. Therefore, it is preferable that the thin film transistor used for the driver circuit operate at high speed.

An object of one embodiment of the present invention is to provide a highly reliable thin film transistor with good electrical characteristics and a display device including the thin film transistor as a switching element.

One embodiment of the present invention is a semiconductor device including: a gate electrode layer over a substrate; a gate insulating layer over the gate electrode layer; an oxide semiconductor layer over the gate insulating layer; an oxide insulating layer in contact with part of the oxide semiconductor layer; a source electrode layer and a drain electrode layer each in contact with part of the oxide semiconductor layer. In the oxide semiconductor layer, a region between the source electrode layer and the oxide insulating layer and a region between the drain electrode layer and the oxide insulating layer each have a thickness less than each of a region overlapping with the source electrode layer, a region overlapping with the oxide insulating layer, and a region overlapping with the drain electrode layer.

Further, a superficial portion of the oxide semiconductor layer which is in contact with the oxide insulating layer has a crystal region.

In the above structure, the gate electrode layer, the source electrode layer, and the drain electrode layer included in the semiconductor device are formed using a film which contains a metal element selected from aluminum, copper, molybdenum, titanium, chromium, tantalum, tungsten, neodymium, and scandium as its main component or a stacked film of alloy films containing any of the elements. Each of the source electrode layer and the drain electrode layer is not limited to a single layer containing any of the above-described elements and may be a stack of two or more layers.

A light-transmitting oxide conductive layer of an indium oxide, an alloy of an indium oxide and a tin oxide, an alloy of an indium oxide and a zinc oxide, a zinc oxide, a zinc aluminum oxide, a zinc aluminum oxynitride, a zinc gallium oxide, or the like can be used for the source electrode layer, the drain electrode layer, and the gate electrode layer, whereby a light-transmitting property of a pixel portion can be improved and an aperture ratio can be increased.

The oxide conductive layer can be formed between the oxide semiconductor layer and the film containing the metal element as its main component, which is for forming the source electrode layer and the drain electrode layer, whereby a thin film transistor which has low contact resistance and can operate at high speed can be formed.

In the above structure, the semiconductor device includes the oxide semiconductor layer and an oxide insulating layer over the oxide semiconductor layer. The oxide insulating layer in contact with the channel formation region of the oxide semiconductor layer functions as a channel protective layer.

In the above structure, as the oxide insulating layer which functions as the channel protective layer of the semiconductor device, an inorganic insulating film formed by a sputtering method is used; typically, a silicon oxide film, a silicon nitride oxide film, an aluminum oxide film, an aluminum oxynitride film, or the like is used.

As the oxide semiconductor layer, a thin film of $InMO_3(ZnO)_m$ (m>0 and m is not an integer) is formed. The thin film is used as an oxide semiconductor layer to form a thin film transistor. Note that M denotes one metal element or a plurality of metal elements selected from Ga, Fe, Ni, Mn, and Co. As an example, M may be Ga or may contain the above metal element in addition to Ga, for example, M may be Ga and Ni or Ga and Fe. Moreover, in the oxide semiconductor, in some cases, a transition metal element such as Fe or Ni or an oxide of the transition metal is contained as an impurity element in addition to a metal element contained as M. In this specification, among the oxide semiconductor layers whose composition formulas are represented by $InMO_3(ZnO)_m$, (m>0 and m is not an integer), an oxide semiconductor which contains Ga as M is referred to as an In—Ga—Zn—O-based oxide semiconductor, and a thin film of the In—Ga—Zn—O-based oxide semiconductor is also referred to as an In—Ga—Zn—O-based film.

As a metal oxide used for the oxide semiconductor layer, any of the following metal oxides can be used in addition to the above: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. A silicon oxide may be contained in the oxide semiconductor layer formed using the metal oxide.

For the oxide semiconductor layer, the one which is subjected to dehydration or dehydrogenation at high temperature in a short time by an RTA method or the like is used. The heating process by an RTA method or the like makes a superficial portion of the oxide semiconductor layer have a crystal region including so-called nanocrystals with a grain size of greater than or equal to 1 nm and less than or equal to 20 nm and the rest portion is amorphous or is formed of a mixture of amorphousness/non-crystals and microcrystals, where an amorphous region is dotted with microcrystals.

An oxide semiconductor layer having such a structure is used, whereby deterioration of electrical characteristics due to a change to an n-type caused by entry of moisture or elimination of oxygen to or from the superficial portion can be prevented. The superficial portion of the oxide semiconductor layer is on a back channel side and has a crystal region including nanocrystals, so that generation of a parasitic channel can be suppressed.

In the case where the oxide semiconductor layer is formed to have an island shape after dehydration or dehydrogenation, no crystal region is formed in side surface portions. Although a crystal region is formed only in a superficial portion, except for the side surface portions, an area rate of the side surface portion is small and the above effect is not prevented.

A display device can be formed using a driver circuit portion and a pixel portion which are formed using thin film transistors each of which is one embodiment of the present invention, over the same substrate, and an EL element, a liquid crystal element, an electrophoretic element, or the like.

In the display device which is one embodiment of the present invention, a plurality of thin film transistors is provided in a pixel portion, and the pixel portion has a region in which a gate electrode of one of the thin film transistors is connected to a source wiring or a drain wiring of another thin film transistor. In addition, in a driver circuit of the display device which is one embodiment of the present invention, there is a region where a gate electrode of a thin film transistor is connected to a source wiring or a drain wiring of the thin film transistor.

Since a thin film transistor is easily broken due to static electricity or the like, a protective circuit for protecting the thin film transistor for the pixel portion is preferably provided over the same substrate for a gate line or a source line. The protective circuit is preferably formed with a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

In this specification, a semiconductor device generally means a device which can function by utilizing semiconductor characteristics, and an electrooptic device, a semiconductor circuit, and an electronic appliance are all semiconductor devices.

In a thin film transistor including an oxide semiconductor layer, a superficial portion of the oxide semiconductor layer includes a crystal region in a channel formation region. Accordingly, a highly reliable thin film transistor and a highly reliable display device both with good electrical characteristics can be formed.

BRIEF DESCRIPTION OF DRAWINGS

In the accompanying drawings:

FIGS. 4A1 and 4B1 are cross-sectional views and FIGS. 4A2 and 4B2 are top views illustrating one embodiment of the present invention;

FIGS. 11A1 and 11A2 are plan views and FIG. 11B is a cross-sectional view illustrating one embodiment of the present invention;

BEST MODE FOR CARRYING OUT THE INVENTION

Figure 1:
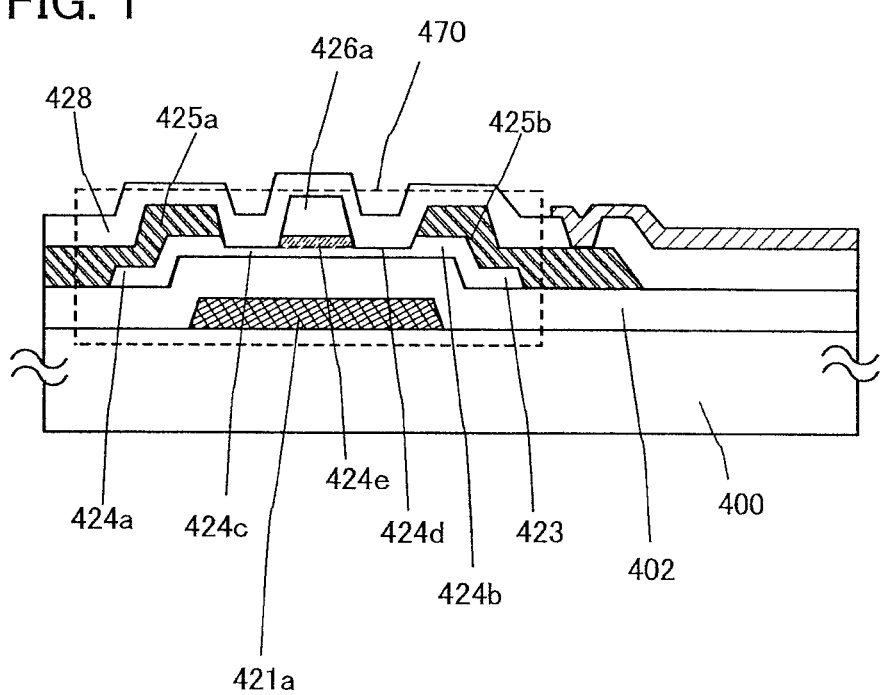
FIG. 1 is a cross-sectional view illustrating one embodiment of the present invention.

Embodiments will be described with reference to drawings. Note that the present invention is not limited to the following description, and it will be easily understood by those skilled in the art that the modes and details of the present invention can be modified in various ways without departing from the spirit and scope of the present invention. Therefore, the present invention should not be construed as being limited to the following description of the embodiments. Note that in structures of the present invention described below, the same portions or portions having similar functions are denoted by the same reference numerals in different drawings, and description thereof is omitted.

Embodiment 1

In this embodiment, a structure of a thin film transistor will be described with reference to FIG. 1.

A channel protected thin film transistor of this embodiment is illustrated in FIG. 1.

In a thin film transistor 470 illustrated in FIG. 1, over a substrate 400 having an insulating surface, a gate electrode layer 421a, a gate insulating layer 402, an oxide semiconductor layer 423 including a channel formation region, a source electrode layer 425a, a drain electrode layer 425b, and an oxide insulating layer 426a functioning as a channel protective layer are provided.

The gate electrode layer 421a can be formed with a single-layer structure or a stacked-layer structure using any of metal materials such as aluminum, copper, molybdenum, titanium, chromium, tantalum, tungsten, neodymium, and scandium; an alloy material containing any of these metal materials as its main component; or a nitride containing any of these metal materials. It is preferable that the gate electrode layer be formed with the use of a low-resistance metal material such as aluminum or copper, which is effective, though it is to be noted that the low-resistance metal material is preferably used in combination with a refractory metal material because it has disadvantages such as low heat resistance and a tendency to be corroded. As the refractory metal material, molybdenum, titanium, chromium, tantalum, tungsten, neodymium, scandium, or the like can be used.

Further, in order to increase the aperture ratio of a pixel portion, a light-transmitting oxide conductive layer of an indium oxide, an alloy of an indium oxide and a tin oxide, an alloy of an indium oxide and a zinc oxide, a zinc aluminum oxide, a zinc aluminum oxynitride, a zinc gallium oxide, or the like may be used as the gate electrode layer 421a.

As the gate insulating layer 402, a single-layer film or a laminate film of any of a silicon oxide, a silicon oxynitride, a silicon nitride oxide, a silicon nitride, an aluminum oxide, a tantalum oxide, and the like formed by a CVD method, a sputtering method, or the like can be used.

The oxide semiconductor layer 423 is formed using an In—Ga—Zn—O-based film which contains In, Ga, and Zn and has a structure represented as $InMO_3(ZnO)_m$, (m>0). Note that M denotes one or more of metal elements selected from gallium (Ga), iron (Fe), nickel (Ni), manganese (Mn), and cobalt (Co). As an example, M may be Ga or may contain the above metal element in addition to Ga, for example, M may be Ga and Ni or Ga and Fe. Moreover, in the oxide semiconductor, in some cases, a transition metal element such as Fe or Ni or an oxide of the transition metal is contained as an impurity element in addition to a metal element contained as M.

The oxide semiconductor layer 423 is formed by a sputtering method to a thickness greater than or equal to 10 nm and less than or equal to 300 nm, preferably greater than or equal to 20 nm and less than or equal to 100 nm. Note that as illustrated in FIG. 1, in the oxide semiconductor layer 423, a third region 424c between the source electrode layer 425a and the oxide insulating layer 426a, and a fourth region 424d between the drain electrode layer 425b and the oxide insulating layer 426a each have a thickness less than each of a first region 424a overlapping with the source electrode layer 425a, a fifth region 424e overlapping with the oxide insulating layer 426a, and a second region 424b overlapping with the drain electrode layer 425b.

As the oxide semiconductor layer 423, the one subjected to dehydration or dehydrogenation at high temperature for a short time by a rapid thermal annealing (RTA) method or the like is used. Dehydration or dehydrogenation can be performed by an RTA treatment with the use of a high-temperature gas (an inert gas such as nitrogen or a rare gas) or light at a temperature higher than or equal to 500° C. and lower than or equal to 750° C. (or a temperature lower than or equal to the strain point of a glass substrate) for approximately greater than or equal to one minute and less than or equal to ten minutes, preferably at 650° C. for approximately greater than or equal to three minutes and less than or equal to six minutes. By an RTA method, dehydration or dehydrogenation can be performed in a short time; therefore, a treatment can be performed even at a temperature higher than the strain point of a glass substrate.

The oxide semiconductor layer 423 is an amorphous layer having many dangling bonds at the stage where the oxide semiconductor layer 423 is formed. Through a heating step for the dehydration or dehydrogenation, dangling bonds within a short distance are bonded to each other, so that the oxide semiconductor layer 423 can have an ordered amorphous structure. As ordering proceeds, the oxide semiconductor layer 423 comes to be formed of a mixture of amorphousness/non-crystals and microcrystals, where an amorphous region is dotted with microcrystals, or be formed of amorphousness/non-crystals. Here, a microcrystal is a so-called nanocrystal with a particle size of greater than or equal to 1 nm and less than or equal to 20 nm, which is smaller than that of a microcrystalline particle generally called a microcrystal.

It is preferable that the superficial portion of the oxide semiconductor layer 423 in the fifth region 424e overlapping with the oxide insulating layer 426a include a crystal region and nanocrystals c-axis oriented in a direction perpendicular to a surface of the oxide semiconductor layer be formed in the crystal region. In that case, the long axis is in the c-axis direction and the length in the short-axis direction is greater than or equal to 1 nm and less than or equal to 20 nm.

By using an oxide semiconductor layer which has such a structure, deterioration of electrical characteristics due to a change to an n-type caused by entry of moisture or elimination of oxygen to or from the superficial portion can be prevented because a dense crystal region including nanocrystals exists in the superficial portion of the channel formation region. Further, since the superficial portion of the oxide semiconductor layer in the channel formation region is on the back channel side, preventing the oxide semiconductor layer from being changed to an n-type is also effective for suppression of generation of a parasitic channel.

Figure 23:
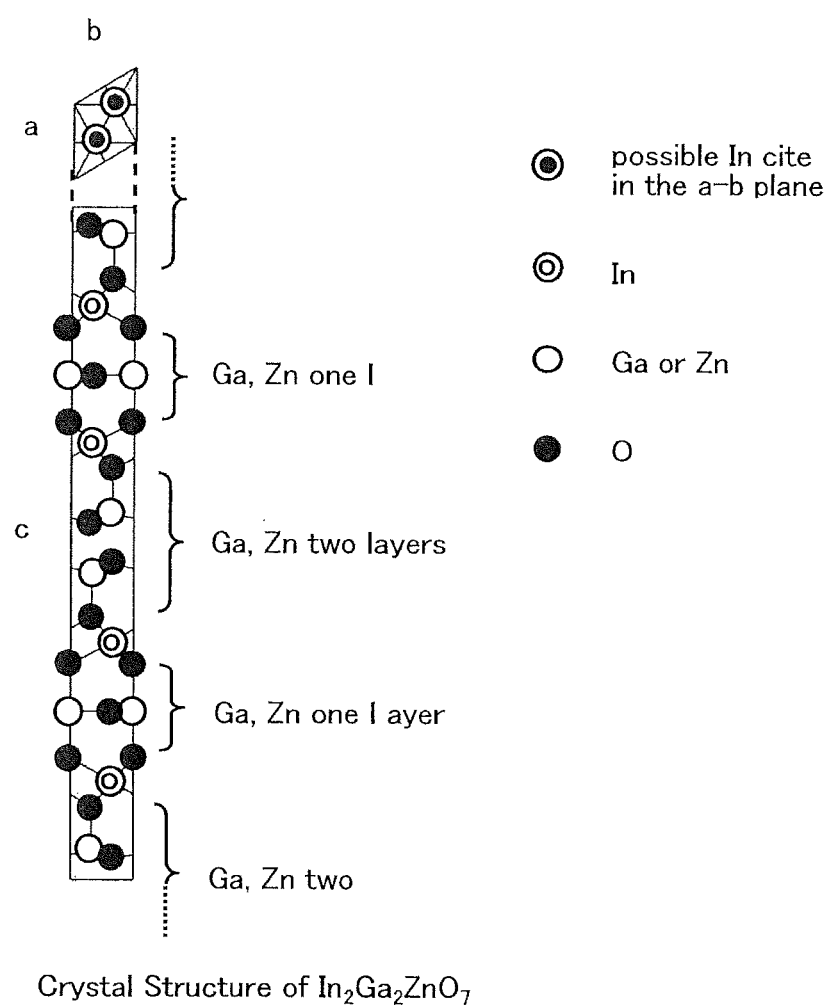
FIG. 23 is a view illustrating an example of a crystal structure of an oxide semiconductor.

Here, a crystal structure of an In—Ga—Zn—O-based film, which is likely to grow, depends on a used metal oxide target. For example, in the case where an In—Ga—Zn—O-based film is formed using a metal oxide target, which contains In, Ga, and Zn so that the molar ratio of $In_2O_3$ to $Ga_2O_3$ to ZnO is 1:1:0.5, and crystallization is performed through a heating step, a hexagonal system layered compound crystal structure in which one oxide layer or two oxide layers containing Ga and Zn are mixed between In oxide layers is likely to be formed. At this time, a crystal region is likely to have a crystal structure represented by $In_2Ga_2ZnO_7$ (see FIG. 23). The molar ratio of In to Ga to Zn in the structure of the amorphous region or the region in which amorphousness/non-crystals and microcrystals are mixed in the oxide semiconductor layer is likely to be 1:1:0.5. Alternatively, in the case where deposition is performed using a metal oxide semiconductor target, whose molar ratio of $In_2O_3$ to $Ga_2O_3$ to ZnO is 1:1:1, and crystallization is performed through a heating step, an oxide layer containing Ga and Zn interposed between In oxide layers is likely to have a two-layer structure. Since the crystal structure of the oxide layer containing Ga and Zn of the latter having a two-layer structure is stable and thus crystal growth is likely to occur, in the case where a target whose molar ratio of $In_2O_3$ to $Ga_2O_3$ to ZnO is 1:1:1 is used, and crystallization is performed through a heating step, a crystal continuous from an outer layer to an interface between a gate insulating layer and the oxide layer containing Ga and Zn is formed in some cases. Note that the molar ratio may be referred to as the ratio of atoms.

In this embodiment, the source electrode layer 425a and the drain electrode layer 425b each have a three-layer structure of a first conductive layer, a second conductive layer, and a third conductive layer. As materials of these layers, materials each similar to that of the gate electrode layer 421a can be appropriately used.

Further, the light-transmitting oxide conductive layer is used for the source and drain electrode layers 425a and 425b in a manner similar to that of the gate electrode layer 421a, whereby a light-transmitting property of the pixel portion can be improved and the aperture ratio can also be increased.

Further, the oxide conductive layer may be formed between the oxide semiconductor layer 423 and the film containing any of the above metal materials as its main component, which is to be the source and drain electrode layers 425a and 425b, so that contact resistance can be reduced.

Over the oxide semiconductor layer 423, the oxide insulating layer 426a functioning as a channel protective layer is provided in contact with the oxide semiconductor layer 423. The oxide insulating layer 426a is formed by a sputtering method using an inorganic insulating film, typically a silicon oxide film, a silicon nitride oxide film, an aluminum oxide film, an aluminum oxynitride film, or the like.

In FIG. 1, the channel formation region refers to the fifth region 424e where the oxide insulating layer 426a functioning as a channel protective layer overlaps with the gate electrode layer with the gate insulating layer 402 interposed therebetween. Note that channel length L of a thin film transistor is defined as a distance between a source electrode layer and a drain electrode layer; however, in the case of the channel protected thin film transistor 470, channel length L is equal to the width of the oxide insulating layer 426a which is in a direction parallel to a direction in which carriers flow. Note also that the channel length L of the thin film transistor 470 means the length of the oxide semiconductor layer 423 at the interface with the oxide insulating layer 426a, i.e., the base of a trapezoid which represents the oxide insulating layer 426a in the cross-sectional view of FIG. 1.

In a channel protected thin film transistor, when a source electrode layer and a drain electrode layer are provided over an oxide insulating layer having a small width which is reduced so as to shorten the channel length L of a channel formation region, a short circuit between the source electrode layer and the drain electrode layer could be formed over the oxide insulating layer. In order to solve this problem, the source electrode layer 425a and the drain electrode layer 425b are provided so that their end portions are apart from the oxide insulating layer 426a with a reduced width in the thin film transistor of FIG. 1. As the channel protected thin film transistor 470, the width of the oxide insulating layer can be reduced such that the channel length L of the channel formation region becomes as short as a length greater than or equal to 0.1 μm and less than or equal to 2 μm, whereby a thin film transistor having high operation speed is achieved.

Hereinafter, an example of a manufacturing process of a display device which includes the channel protected thin film transistor illustrated in FIG. 1 is described with reference to FIGS. 2A to 2E and FIG. 3. Note that FIG. 3 is a plan view of the display device and each of FIGS. 2A to 2E is a cross-sectional view taken along line A1-A2 and line B1-B2 of FIG. 3.

First, the substrate 400 is prepared. As the substrate 400, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, a metal substrate such as a stainless steel alloy substrate having a surface provided with an insulating film may be used.

Note that instead of the glass substrate described above, a substrate formed using an insulator, such as a ceramic substrate, a quartz substrate, or a sapphire substrate, may be used as the substrate 400. Alternatively, a crystallized glass substrate or the like can be used.

Further, as a base film, an insulating film may be formed over the substrate 400. As the base film, any of a silicon oxide film, a silicon nitride film, a silicon oxynitride film, and a silicon nitride oxide film may be formed to have a single-layer structure or a stacked-layer structure by a CVD method, a sputtering method, or the like. In the case where a substrate containing mobile ions, such as a glass substrate, is used as the substrate 400, a film containing nitrogen, such as a silicon nitride film or a silicon nitride oxide film, is used as the base film, whereby the mobile ions can be prevented from entering the oxide semiconductor layer or the semiconductor layer.

Next, a conductive film for forming a gate wiring including the gate electrode layer 421a, a capacitor wiring 421b, and a first terminal 421c is formed over an entire surface of the substrate 400 by a sputtering method or a vacuum evaporation method. Next, after the formation of the conductive film over the entire surface of the substrate 400, in a first photolithography step, a resist mask is formed and an unnecessary portion is removed by etching to form wirings and an electrode (the gate wiring including the gate electrode layer 421a, the capacitor wiring 421b, and the first terminal 421c). At this time, etching is preferably performed so that at least an end portion of the gate electrode layer 421a is tapered, in order to prevent disconnection.

The gate wiring including the gate electrode layer 421a, the capacitor wiring 421b, and the first terminal 421c in a terminal portion can be formed with a single-layer structure or a stacked-layer structure using any of metal materials such as aluminum, copper, molybdenum, titanium, chromium, tantalum, tungsten, neodymium, and scandium; an alloy material containing any of these metal materials as its main component; or a nitride containing any of these metal materials. It is preferable that the gate electrode layer be formed with the use of a low-resistance metal material such as aluminum or copper, which is effective, though it is to be noted that the low-resistance metal material is preferably used in combination with a refractory metal material because it has disadvantages such as low heat resistance and a tendency to be corroded. As the refractory metal material, molybdenum, titanium, chromium, tantalum, tungsten, neodymium, scandium, or the like can be used.

For example, as a stacked-layer structure of the gate electrode layer 421a, the following structures are preferable: a two-layer structure in which a molybdenum layer is stacked over an aluminum layer; a two-layer structure in which a molybdenum layer is stacked over a copper layer; a two-layer structure in which a titanium nitride layer or a tantalum nitride layer is stacked over a copper layer; and a two-layer structure of a titanium nitride layer and a molybdenum layer. As a three-layer structure, the following structure is preferable: a stacked-layer structure containing aluminum, an alloy of aluminum and silicon, an alloy of aluminum and titanium, or an alloy of aluminum and neodymium in a middle layer and any of tungsten, tungsten nitride, titanium nitride, and titanium in a top layer and a bottom layer.

At that time, a light-transmitting oxide conductive layer may be used for one or more of the electrode layers and the wiring layers to increase the aperture ratio. For example, the oxide conductive layer can be formed using an indium oxide, an alloy of an indium oxide and a tin oxide, an alloy of an indium oxide and a zinc oxide, a zinc oxide, a zinc aluminum oxide, a zinc aluminum oxynitride, a zinc gallium oxide, or the like.

Figure 2A:
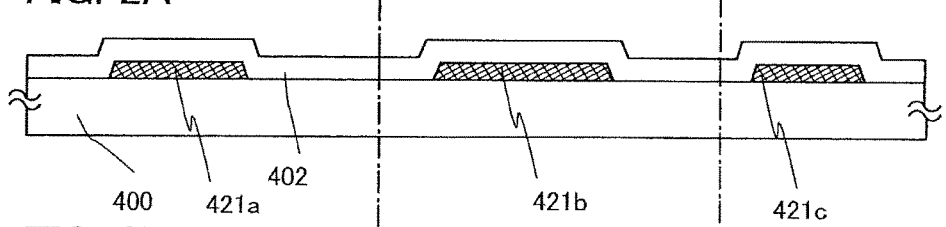
FIGS. 2A to 2E are cross-sectional process views illustrating one embodiment of the present invention.
Figure 3:
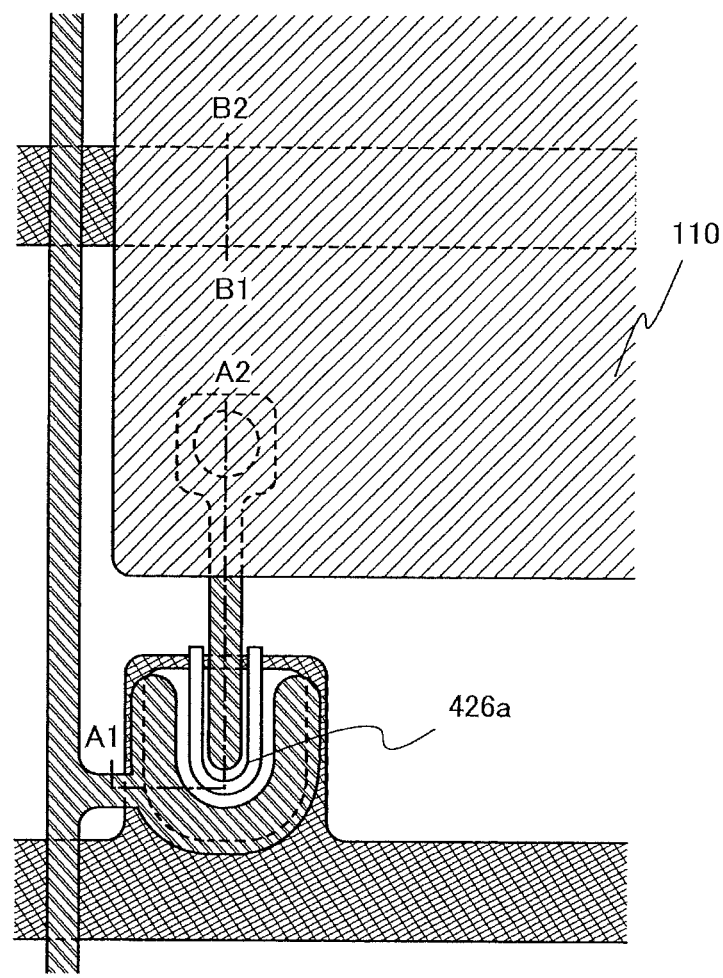
FIG. 3 is a top view illustrating one embodiment of the present invention.

Next, the gate insulating layer 402 is formed so as to cover the gate electrode layer 421a (see FIG. 2A). The gate insulating layer 402 is formed to a thickness greater than or equal to 10 nm and less than or equal to 400 nm by a CVD method, a sputtering method, or the like.

For example, as the gate insulating layer 402, a silicon oxide film with a thickness of 100 nm is formed by a CVD method, a sputtering method, or the like. Needless to say, the gate insulating layer 402 is not limited to such a silicon oxide film and may be formed to have a single-layer structure or a stacked-layer structure using any other insulating films such as a silicon oxynitride film, a silicon nitride oxide film, a silicon nitride film, an aluminum oxide film, and a tantalum oxide film.

The gate insulating layer 402 is formed using a high-density plasma apparatus. Here, a high-density plasma apparatus refers to an apparatus which can realize a plasma density greater than or equal to $1\times10^{11}/cm^3$. For example, plasma is generated by applying a microwave power of 3 kW to 6 kW so that the insulating film is formed.

A monosilane gas ($SiH_4$), nitrous oxide ($N_2O$), and a rare gas are introduced into a chamber as a source gas to generate high-density plasma at a pressure greater than or equal to 10 Pa and less than or equal to 30 Pa so that an insulating film is formed over a substrate having an insulating surface, such as a glass substrate. After that, the supply of a monosilane gas is stopped, and nitrous oxide ($N_2O$) and a rare gas are introduced without exposure to the air, so that a surface of the insulating film is subjected to a plasma treatment. The plasma treatment performed on the surface of the insulating film by introducing nitrous oxide ($N_2O$) and a rare gas is performed at least after the insulating film is formed. The insulating film formed through the above process procedure has a small thickness and corresponds to an insulating film whose reliability can be ensured even when it has a thickness less than 100 nm, for example.

In forming the gate insulating layer 402, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have a certain thickness, the insulating film has excellent step coverage. Further, as for the insulating film formed using the high-density plasma apparatus, the thickness of a thin film can be controlled precisely.

Unlike an insulating film formed using a conventional parallel plate plasma enhanced CVD apparatus in many points, the insulating film formed through the above process procedure has an etching rate which is lower than that of the insulating film formed using the conventional parallel plate plasma enhanced CVD apparatus by greater than or equal to 10% or greater than or equal to 20% in the case where the etching rates with the same etchant are compared with each other. Thus, it can be said that the insulating film obtained using a high-density plasma apparatus is a dense film.

Alternatively, the gate insulating layer 402 can be formed using a silicon oxide layer by a CVD method in which an organosilane gas is used. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Alternatively, the gate insulating layer 402 may be formed using one kind of an oxide, a nitride, an oxynitride, and a nitride oxide of aluminum, yttrium, or hafnium; or a compound containing at least two or more kinds of the above.

Note that in this specification, the term "oxynitride" refers to a substance that contains oxygen atoms and nitrogen atoms so that the number of the oxygen atoms is larger than that of the nitrogen atoms and the term "nitride oxide" refers to a substance that contains nitrogen atoms and oxygen atoms so that the number of the nitrogen atoms is larger than that of the oxygen atoms. For example, a "silicon oxynitride film" means a film that contains oxygen atoms and nitrogen atoms so that the number of the oxygen atoms is larger than that of the nitrogen atoms and, in the case where measurements are performed using Rutherford backscattering spectrometry (RBS) and hydrogen forward scattering (HFS), contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, a "silicon nitride oxide film" means a film that contains nitrogen atoms and oxygen atoms so that the number of the nitrogen atoms is larger than that of the oxygen atoms and, in the case where measurements are performed using RBS and HFS, contains oxygen, nitrogen, silicon, and hydrogen at concentrations ranging from 5 atomic % to, 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Note that before an oxide semiconductor film for forming the oxide semiconductor layer 423 is formed, dust on a surface of the gate insulating layer is preferably removed by performing reverse sputtering in which an argon gas is introduced and plasma is generated. The reverse sputtering refers to a method in which, without application of voltage to a target side, an RF power source is used for application of voltage to a substrate side in an argon atmosphere so that plasma is generated around the substrate to modify a surface. Note that instead of an argon atmosphere, a nitrogen atmosphere, a helium atmosphere, or the like may be used. Alternatively, an argon atmosphere to which oxygen, $N_2O$, or the like is added may be used. Still alternatively, an argon atmosphere to which $Cl_2$, $CF_4$, or the like is added may be used. After the reverse sputtering, the oxide semiconductor film is formed without exposure to the air, whereby adhesion of particles (dust) and moisture to an interface between the gate insulating layer 402 and the oxide semiconductor layer 423 can be prevented.

Next, an oxide semiconductor film is formed over the gate insulating layer 402 to a thickness greater than or equal to 5 nm and less than or equal to 200 nm, preferably greater than or equal to 10 nm and less than or equal to 40 nm.

As the oxide semiconductor film, any of the following oxide semiconductor films can be applied: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; a Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. Alternatively, the oxide semiconductor film can be formed by a sputtering method in a rare gas (typically argon) atmosphere, an oxygen atmosphere, or an atmosphere of a rare gas (typically argon) and oxygen. In the case of using a sputtering method, film deposition may be performed using a target containing $SiO_2$ at greater than or equal to 2 percent by weight and less than or equal to 10 percent by weight and $SiO_x$ (x>0) which inhibits crystallization may be contained in the oxide semiconductor film.

Here, the oxide semiconductor film is formed using a metal oxide target, which contains In, Ga, and Zn (the molar ratio of $In_2O_3$ to $Ga_2O_3$ to ZnO is 1:1:0.5, or the molar ratio of In to Ga to ZnO is 1:1:1 or 1:1:2), under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%). It is preferable that a pulse direct current (DC) power source is used because powder substances (also referred to as particles or dust) generated in film deposition can be reduced and the film thickness can be uniform. In this embodiment, as the oxide semiconductor film, a 30-nm-thick In—Ga—Zn—O-based film is formed by a sputtering method with the use of an In—Ga—Zn—O-based metal oxide target.

Examples of a sputtering method include an RF sputtering method in which a high-frequency power source is used as a sputtering power source, a DC sputtering method in which DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Next, in a second photolithography step, a resist mask is formed and the In—Ga—Zn—O-based film is etched. In the etching, organic acid such as citric acid or oxalic acid can be used for an etchant. Here, the In—Ga—Zn—O-based film is etched by wet etching with the use of ITO-07N (manufactured by Kanto Chemical Co., Inc.) to remove an unnecessary portion. Thus, the In—Ga—Zn-0-based film is processed to have an island shape, whereby the oxide semiconductor layer 423 is formed. The end portions of the oxide semiconductor layer 423 are etched to have tapered shapes, whereby breakage of a wiring due to a step shape can be prevented. Note that etching here is not limited to wet etching and dry etching may be performed.

Then, the oxide semiconductor layer is subjected to dehydration or dehydrogenation. A first heat treatment for the dehydration or dehydrogenation can be performed by a rapid thermal annealing (RTA) treatment with the use of a high-temperature gas (an inert gas such as nitrogen or a rare gas) or light at a temperature higher than or equal to 500° C. and lower than or equal to 750° C. (or a temperature lower than or equal to the strain point of a glass substrate) for approximately greater than or equal to one minute and less than or equal to ten minutes, preferably at 650° C. for approximately greater than or equal to three minutes and less than or equal to six minutes. By an RTA method, dehydration or dehydrogenation can be performed in a short time; therefore, a treatment can be performed even at a temperature higher than the strain point of a glass substrate. Note that the timing of the heat treatment is not limited to this timing and may be performed plural times, for example, before and after a photolithography step or a deposition step.

Here, the superficial portion of the oxide semiconductor layer 423 is crystallized by the first heat treatment and thus comes to have the crystal region 106 including nanocrystals. The rest portion of the oxide semiconductor layer 423 comes to be amorphous or be formed of a mixture of amorphousness/non-crystals and microcrystals, where an amorphous region is dotted with microcrystals. Note that the crystal region 106 is part of the oxide semiconductor layer 423 and hereinafter, the "oxide semiconductor layer 423" includes the crystal region 106.

Note that in this specification, a heat treatment in the atmosphere of an inert gas such as nitrogen or a rare gas is referred to as a heat treatment for dehydration or dehydrogenation. In this specification, "dehydration" or "dehydrogenation" does not indicate elimination of only $H_2$ or $H_2O$ by a heat treatment. For convenience, elimination of H, OH, and the like is referred to as "dehydration or dehydrogenation".

In addition, when the temperature is lowered from a heating temperature Tat which the oxide semiconductor layer is subjected to the dehydration or dehydrogenation, it is important to prevent entry of water or hydrogen by using the same furnace that has been used for the dehydration or dehydrogenation, in such a manner that the oxide semiconductor layer is not exposed to the air. When a thin film transistor is formed using an oxide semiconductor layer obtained by changing an oxide semiconductor layer into a low-resistance oxide semiconductor layer, i.e., an n-type (e.g., n⁻-type or n⁺-type) oxide semiconductor layer by performing dehydration or dehydrogenation and by changing the low-resistance oxide semiconductor layer into a high-resistance oxide semiconductor layer so that the oxide semiconductor layer becomes an i-type oxide semiconductor layer, the threshold voltage of the thin film transistor is positive, so that a switching element having a so-called normally-off property can be realized. It is preferable for a display device that a channel be formed with positive threshold voltage that is as close to 0 V as possible in a thin film transistor. If the threshold voltage of the thin film transistor is negative, it tends to have a so-called normally-on property; in other words, current flows between the source electrode and the drain electrode even when the gate voltage is 0 V. In an active matrix display device, electrical characteristics of a thin film transistor included in a circuit are important and the performance of the display device depends on the electrical characteristics. In particular, of the electrical characteristics of the thin film transistor, the threshold voltage ($V_{th}$) is important. When the threshold voltage value is high or is on the minus side even when the field effect mobility is high, it is difficult to control the circuit. In the case where a thin film transistor has a high threshold voltage and a large absolute value of its threshold voltage, the thin film transistor cannot perform a switching function as the TFT and might be a load when the thin film transistor is driven at low voltage. In the case of an n-channel thin film transistor, it is preferable that a channel be formed and drain current flows after positive voltage is applied as gate voltage. A transistor in which a channel is not formed unless driving voltage is raised and a transistor in which a channel is formed and drain current flows even when negative voltage is applied are unsuitable for a thin film transistor used in a circuit.

In addition, the gas atmosphere in which the temperature is lowered from the heating temperature T may be switched to a gas atmosphere which is different from the gas atmosphere in which the temperature is raised to the heating temperature T. For example, cooling is performed in the furnace where the heat treatment for dehydration or is performed while the furnace is filled with a high-purity oxygen gas, a high-purity $N_2O$ gas, or ultra-dry air (having a dew point lower than or equal to −40° C., preferably lower than or equal to −60° C.) without exposure to the air.

Note that in the first heat treatment, it is preferable that water, hydrogen, and the like be not contained in the atmosphere. Alternatively, the purity of an inert gas which is introduced into a heat treatment apparatus is preferably greater than or equal to 6N (99.9999%), more preferably greater than or equal to 7N (99.99999%) (that is, the impurity concentration is less than or equal to 1 ppm, preferably less than or equal to 0.1 ppm).

In the case where the heat treatment is performed in an inert gas atmosphere, the oxide semiconductor layer is changed into an oxygen-deficient oxide semiconductor layer so that the oxide semiconductor layer becomes a low-resistance oxide semiconductor layer (i.e., an n-type (e.g., n⁻-type) oxide semiconductor layer) through the heat treatment. After that, the oxide semiconductor layer is made to be in an oxygen excess state by the formation of an oxide insulating layer which is in contact with the oxide semiconductor layer. Thus, the oxide semiconductor layer is made to be i-type; that is, the oxide semiconductor layer is changed into a high-resistance oxide semiconductor layer. Accordingly, it is possible to form a highly reliable thin film transistor having favorable electrical characteristics.

Depending on a condition of the first heat treatment or a material of the oxide semiconductor layer, the oxide semiconductor layer may be partly crystallized. By the first heat treatment, the oxide semiconductor layer 423 is changed to an oxygen-deficient type and the resistance thereof is reduced. After the first heat treatment, the carrier concentration is higher than that of the oxide semiconductor film just after the film deposition, so that the oxide semiconductor layer has a carrier concentration of, preferably, greater than or equal to $1×10^{18}/cm^3$.

The first heat treatment for the oxide semiconductor layer may be performed before the oxide semiconductor film is processed into the island-shaped oxide semiconductor layer. In that case, the substrate is taken out of the heat treatment apparatus and a second photolithography step is performed after the first heat treatment. A crystal region is not formed in a side surface portion of the oxide semiconductor layer 423 and the crystal region 106 is formed only in an upper layer portion of the oxide semiconductor layer 423.

Figure 2B:
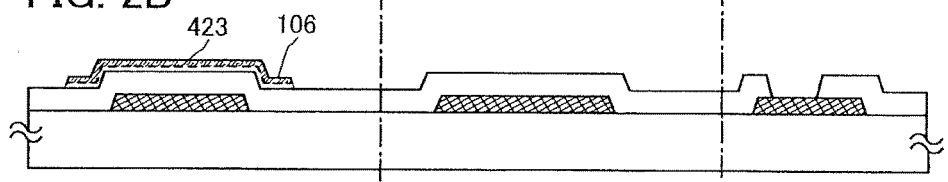
Figure 2C:
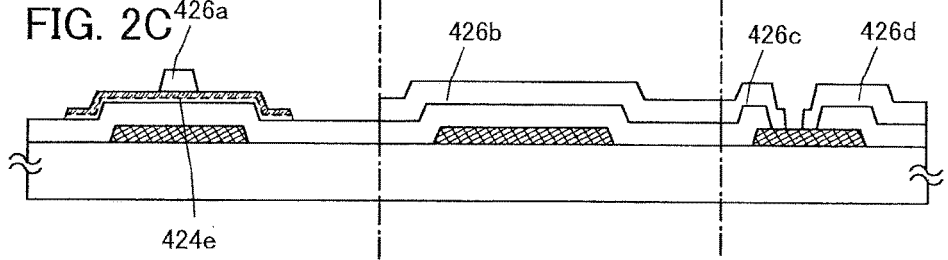

Next, in a third photolithography step, a resist mask is formed and an unnecessary portion is removed by etching to form a contact hole reaching the wiring or the electrode layer which is formed using the same material as the gate electrode layer 421a (see FIG. 2B). This contact hole is provided for direct connection with a conductive film to be formed later. For example, a contact hole is formed when a thin film transistor whose gate electrode layer is in direct contact with the source or drain electrode layer in the driver circuit portion is formed, or when a terminal that is electrically connected to a gate wiring of a terminal portion is formed.

Next, an oxide insulating film is formed over the oxide semiconductor layer 423 and the gate insulating layer 402 by a sputtering method; then, in a fourth photolithography step, a resist mask is formed and selective etching is performed thereon so as to form the oxide insulating layers 426a, 426b, 426c, and 426d. After that, the resist mask is removed (see FIG. 2C). At this stage, a region which is in contact with the oxide insulating layer 426a is formed in the oxide semiconductor layer. Within this region, a region that overlaps with the gate electrode layer with the gate insulating layer interposed therebetween and also overlaps with the oxide insulating layer 426a is the channel formation region. Further, in the fourth photolithography step, a contact hole reaching the first terminal 421c is also formed.

The oxide insulating film can be formed to a thickness at least greater than or equal to 1 nm by a method by which impurities such as water and hydrogen are not mixed into the oxide insulating film, such as a sputtering method, as appropriate. In this embodiment, a silicon oxide film is formed by a sputtering method, as the oxide insulating film. The substrate temperature in the film deposition may be higher than or equal to room temperature and lower than or equal to 300° C.; in this embodiment, the substrate temperature is 100° C. The deposition of the silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, with the use of a silicon target, a silicon oxide film can be formed by a sputtering method in an atmosphere of oxygen and a rare gas. As the oxide insulating film formed in contact with the oxide semiconductor layer whose resistance is reduced, an inorganic insulating film that does not include impurities such as water, a hydrogen ion, and OH$^-$ and blocks entry of these from the outside is used. Typically, a silicon oxide film, a silicon nitride oxide film, an aluminum oxide film, an aluminum oxynitride film, or the like is used.

In this embodiment, the film deposition is performed by a pulsed DC sputtering method using a columnar polycrystalline, boron-doped silicon target which has a purity of 6N (with a resistivity of 0.01 Ω·cm), in which the distance between the substrate and the target (T-S distance) is 89 mm, the pressure is 0.4 Pa, the direct-current (DC) power source is 6 kW, and the atmosphere is oxygen (the oxygen flow rate is 100%). The film thickness thereof is 300 nm.

Next, a conductive film is formed using a metal material over the oxide semiconductor layer 423 by a sputtering method, a vacuum evaporation method, or the like. As a material of the conductive film, a material similar to that of the gate electrode layer 421a can be used.

In this embodiment, a conductive film in which first to third conductive films are stacked is formed. For example, the first conductive film and the third conductive film are formed using titanium that is a heat-resistant conductive material, and the second conductive film is formed using an aluminum alloy containing neodymium. Such a structure can reduce generation of hillock and utilize a low resistance property of aluminum. Although a three-layer structure of the first to third conductive films is used in this embodiment, one embodiment of the present invention is not limited to this. A single-layer structure, a two-layer structure, or a stacked-layer structure of four or more layers may be employed. A structure including two layers or four or more layers may be employed. For example, a single-layer structure of a titanium film or a single-layer structure of an aluminum film containing silicon may be employed.

Note that at the time of deposition of the conductive film on and in contact with the oxide semiconductor layer, whose superficial portion has the dense crystal region 106 including nanocrystals, damage on the crystal region due to the deposition or heat by the deposition makes the crystal region 106 of the semiconductor layer amorphous in some cases. However, in the manufacturing method of a thin film transistor which is described in this embodiment, the oxide insulating layer 426a functioning as a channel protective layer is provided in contact with the region to be the channel formation region of the oxide semiconductor layer, whereby the superficial portion of the oxide semiconductor layer 423 at least in the channel formation region (the fifth region) can have the crystal region 106.

Next, in a fifth photolithography step, a resist mask is formed and unnecessary portions are removed by etching so as to form the source and drain electrode layers 425a and 425b and a connection electrode 429. Wet etching or dry etching is employed as an etching method at this time. For example, when the first conductive film and the third conductive film are formed using titanium and the second conductive film is formed using an aluminum alloy containing neodymium, wet etching can be performed using a hydrogen peroxide solution or heated hydrochloric acid as an etchant.

Figure 2D:
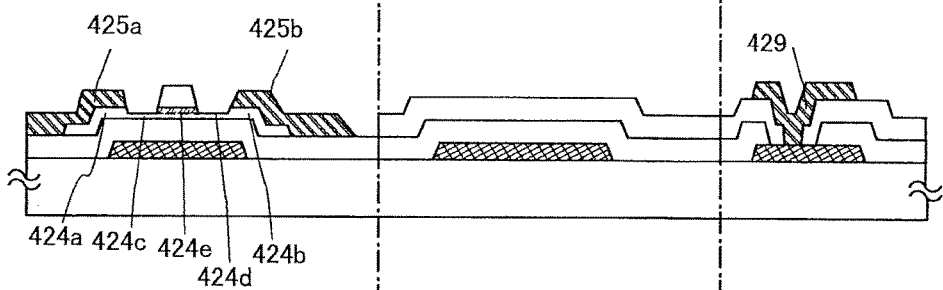

By this etching step, the oxide semiconductor layer 423 is partly etched so that the third region 424c between the source electrode layer 425a and the oxide insulating layer 426a, and the fourth region 424d between the drain electrode layer 425b and the oxide insulating layer 426a each have a thickness less than each of the first region 424a overlapping with the source electrode layer 425a, the fifth region 424e overlapping with the oxide insulating layer 426a, and the second region 424b overlapping with the drain electrode layer 425b (see FIG. 2D). Note that the fifth region 424e of the oxide semiconductor layer 423 is protected by the oxide insulating layer 426a so as not to be etched and thus the superficial portion has a dense crystal region including nanocrystals at least in the channel formation region. In the channel formation region, the superficial portion of the oxide semiconductor layer is on the back channel side and the crystal region can suppress generation of a parasitic channel.

In addition, by this fifth photolithography step, the connection electrode 429 is directly connected to the first terminal 421c of the terminal portion through a contact hole formed in the gate insulating layer. Although not illustrated, a source or drain wiring and a gate electrode of a thin film transistor of a driver circuit are directly connected to each other through the same steps as the above steps.

Figure 2E:
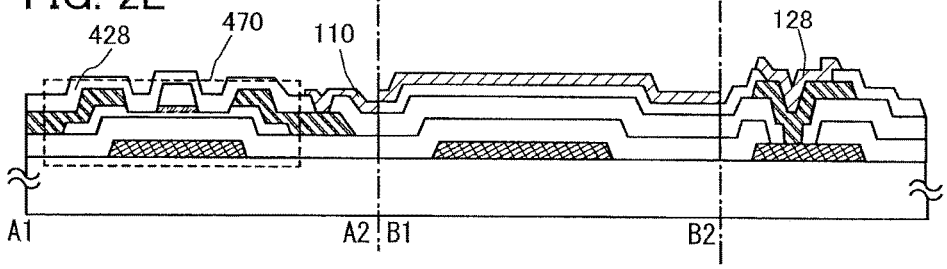

Next, an oxide insulating layer 428 which covers the thin film transistor 470 is formed (see FIG. 2E). As the oxide insulating layer 428, an oxide insulating layer formed using a silicon oxide film, a silicon oxynitride film, an aluminum oxide film, an aluminum oxynitride film, or a tantalum oxide film which is formed by a sputtering method or the like.

The oxide insulating layer can be formed by a method by which impurities such as water and hydrogen are not mixed into the oxide insulating layer, such as a sputtering method, as appropriate. In this embodiment, a silicon oxide film is formed by a sputtering method, for the oxide insulating layer. The substrate temperature in the film deposition may be higher than or equal to room temperature and lower than or equal to 300° C.; in this embodiment, the substrate temperature is 100° C. In order to prevent entry of impurities such as water and hydrogen in the film deposition, prebaking is preferably performed under reduced pressure at a temperature higher than or equal to 150° C. and lower than or equal to 350° C. for greater than or equal to two minutes and less than or equal to ten minutes before the film deposition, to form an oxide insulating layer without exposure to the air. The deposition of the silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, with the use of a silicon target, a silicon oxide film can be formed by a sputtering method in an atmosphere of oxygen and a rare gas. For the oxide insulating layer formed in contact with the oxide semiconductor layer whose resistance is reduced, an inorganic insulating film that does not include impurities such as water, a hydrogen ion, and OH⁻ and blocks entry of these from the outside is preferably used.

In this embodiment, the film deposition is performed by a pulsed DC sputtering method using a columnar polycrystalline, boron-doped silicon target which has a purity of 6N (with a resistivity of 0.01 Ω·cm), in which the distance between the substrate and the target (T-S distance) is 89 mm, the pressure is 0.4 Pa, the direct-current (DC) power source is 6 kW, and the atmosphere is oxygen (the oxygen flow rate is 100%). The film thickness thereof is 300 nm.

Next, a second heat treatment is performed in an inert gas atmosphere or a nitrogen gas atmosphere (preferably at a temperature higher than or equal to 200° C. and lower than or equal to 400° C., e.g., higher than or equal to 250° C. and lower than or equal to 350° C.). For example, the second heat treatment is performed in a nitrogen atmosphere at 250° C. for one hour. Alternatively, an RTA treatment may be performed at a high temperature for a short time as in the first heat treatment. By the second heat treatment, the oxide insulating layer and the oxide semiconductor layer overlapping with the oxide insulating layer are heated being in contact with each other. Note that by the second heat treatment, the oxide semiconductor layer 423 whose resistance is reduced by the first heat treatment is in an oxygen excess state and can be changed into a high-resistance oxide semiconductor layer (an i-type oxide semiconductor layer).

In this embodiment, the second heat treatment is performed after formation of the silicon oxide film; however, the timing of the heat treatment is not limited to the timing immediately after formation of the silicon oxide film as long as it is after formation of the silicon oxide film.

In the case where the source electrode layer 425a and the drain electrode layer 425b are formed using a heat resistant material, a step using conditions of the first heat treatment can be performed at the timing of the second heat treatment. In that case, a heat treatment may be performed once after formation of the silicon oxide film.

Then, in a sixth photolithography step, a resist mask is formed and the oxide insulating layer 428 is etched so that a contact hole that reaches the drain electrode layer 425b is formed. In addition, a contact hole that reaches the connection electrode 429 is also formed by this etching.

Next, a transparent conductive film is formed after the resist mask is removed. The transparent conductive film is formed using an indium oxide (In₂O₃), an alloy of an indium oxide and a tin oxide (In₂O₃—SnO₂, hereinafter abbreviated as ITO), or the like by a sputtering method, a vacuum evaporation method, or the like. Such a material is etched with a hydrochloric acid-based solution. Note that since a residue is likely to be generated in etching ITO in particular, an alloy of an indium oxide and a zinc oxide (In₂O₃—ZnO) may be used to improve etching processability.

Next, in a seventh photolithography step, a resist mask is formed and an unnecessary portion is removed by etching to form a pixel electrode layer 110.

In the seventh photolithography step, a storage capacitor is formed with the gate insulating layer 402, the oxide insulating layer 426b, and the oxide insulating layer 428 in the capacitor portion which are used as dielectrics, the capacitor wiring 421b, and the pixel electrode layer 110.

Further, in the seventh photolithography step, the first terminal 421c is covered with the resist mask, and a transparent conductive film 128 is left in the terminal portion. The transparent conductive film 128 serves as an electrode or a wiring connected to an FPC. The transparent conductive film 128 which is formed over the connection electrode 429 being directly connected to the first terminal 421c is a connection terminal electrode which functions as an input terminal of the gate wiring. Although not illustrated, a connection terminal electrode which functions as an input terminal of the source wiring is also formed at this time.

FIGS. 4A1 and 4A2 are a cross-sectional view of a gate wiring terminal portion at this stage and a plan view thereof, respectively. FIG. 4A1 is a cross-sectional view taken along line C1-C2 of FIG. 4A2. In FIG. 4A1, a transparent conductive film 415 formed over the oxide insulating layer 428 is a connection terminal electrode which functions as an input terminal. Further, in FIG. 4A1, in the terminal portion, a first terminal 411 formed using the same material as the gate wiring and the connection electrode 412 formed using the same material as the source wiring overlap with each other with a gate insulating layer 402 interposed therebetween and are in direct electrical connection. Furthermore, the connection electrode 412 and the transparent conductive film 415 are directly connected to each other through a contact hole formed in the oxide insulating layer 428.

FIGS. 4B1 and 4B2 are a cross-sectional view of a source wiring terminal portion and a plan view thereof, respectively. FIG. 4B1 is a cross-sectional view taken along line C3-C4 of FIG. 4B2. In FIG. 4B1, a transparent conductive film 418 formed over the oxide insulating layer 428 is a connection terminal electrode which functions as an input terminal. Further, in FIG. 4B 1, in the terminal portion, an electrode 416 formed using the same material as the gate wiring is located below and overlaps with a second terminal 414 electrically connected to the source wiring, with the gate insulating layer 402 interposed therebetween. The electrode 416 is not electrically connected to the second terminal 414, and a capacitor to prevent noise or static electricity can be formed when the electric potential of the electrode 416 is set to an electric potential different from that of the second terminal 414, such as a GND potential or 0 V, or the electrode 416 is set to be in a floating state. The second terminal 414 is electrically connected to the transparent conductive film 418 with the oxide insulating layer 428 interposed therebetween.

A plurality of gate wirings, source wirings, and capacitor wirings are provided depending on the pixel density. Also in the terminal portion, a plurality of first terminals at the same electric potential as the gate wiring, a plurality of second terminals at the same electric potential as the source wiring, a plurality of third terminals at the same electric potential as the capacitor wiring, and the like are arranged. The number of each of the terminals may be any number, and the number of the terminals may be determined by a practitioner as appropriate.

Through these seven photolithography steps, the channel protected thin film transistor 470 and the storage capacitor portion can be thus completed using the seven photomasks. These transistors and storage capacitors are arranged in matrix corresponding to respective pixels so as to form the pixel portion, whereby one of the substrates included in an active-matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed electric potential such as a GND potential or 0 V.

A pixel structure of this embodiment is not limited to the pixel structure in FIG. 3. For example, a pixel electrode may overlap with a gate wiring of an adjacent pixel with the protective insulating film and the gate insulating layer interposed therebetween to form a storage capacitor without a capacitor wiring. In this case, the capacitor wiring and the third terminal connected to the capacitor wiring can be omitted.

Figure 5A:
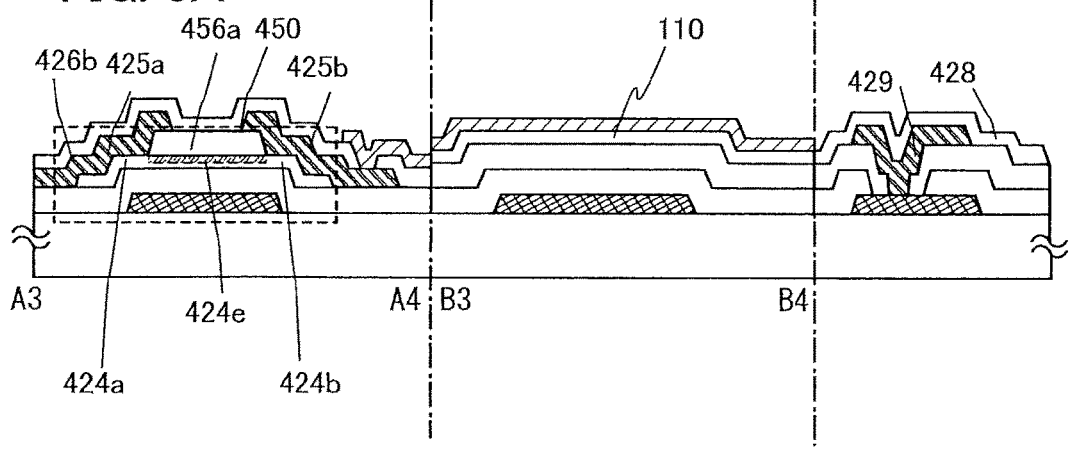
FIG. 5A is a cross sectional view and FIG. 5B is a top view illustrating one embodiment of the present invention.
Figure 5B:
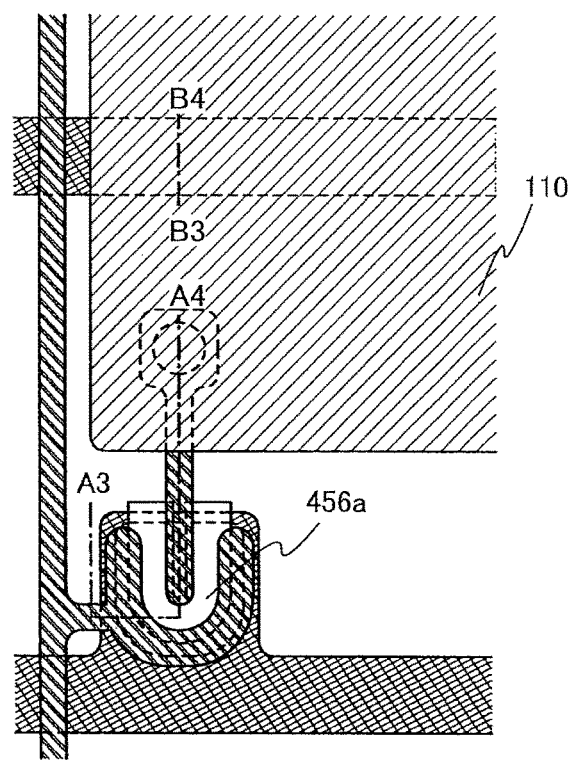

Further alternatively, the source electrode layer 425a and the drain electrode layer 425b may be over and overlap with the oxide insulating layer 456a which functions as a channel protective layer as illustrated in FIGS. 5A and 5B. In this case, the oxide semiconductor layer is not etched when the source electrode layer 425a and the drain electrode layer 425b are patterned, and therefore, a thinner region is not formed in the oxide semiconductor layer. In other words, the oxide semiconductor layer has the first region 424a overlapping with the source electrode layer 425a, the second region 424b overlapping with the drain electrode layer 425b, and the fifth region 424e which is the channel formation region which have the same thickness.

Figure 22A:
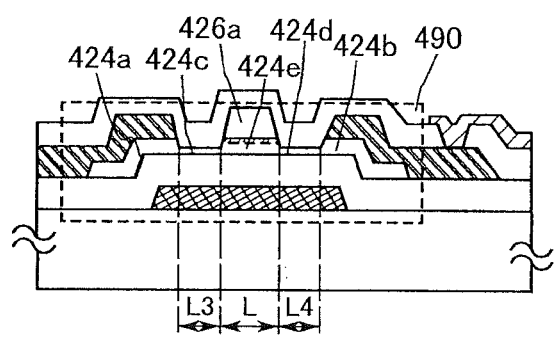
FIGS. 22A to 22D are cross-sectional views each illustrating one embodiment of the present invention.

Further alternatively, a thin film transistor 490 may be employed in which the thickness of a region which is amorphous or is formed of a mixture of amorphousness/non-crystals and microcrystals in the fifth region 424e of the oxide semiconductor layer is less than each thickness of the third region 424c and the fourth region 424d (i.e., an interface between the crystal region in the fifth region 424e and the region which is amorphous or is formed of a mixture of amorphousness/non-crystals and microcrystals is above the outermost surfaces of the third region 424c and the fourth region 424d) as illustrated in FIG. 22A. The thin film transistor 490 having such a structure can be obtained by adjusting a heating temperature or heating time of the first heat treatment so as to make the depth of the crystal region of the oxide semiconductor layer extremely shallow. By employing the structure of the thin film transistor 490 which is illustrated in FIG. 22A, off current can be reduced.

The channel length L of the channel protected thin film transistor 490 illustrated in FIG. 22A is equal to the width of the oxide insulating layer 426a which is in a direction parallel to a direction in which carriers flow. It is to be noted that the sum of the width $L_3$ in the channel length direction of the third region and the width $L_4$ in the channel length direction of the fourth region is constant in the thin film transistor 490 which is illustrated in FIG. 22A, though the width $L_3$ in the channel length direction of the third region of the oxide semiconductor layer is not necessarily equal to the width $L_4$ in the channel length direction of the fourth region.

Figure 22B:
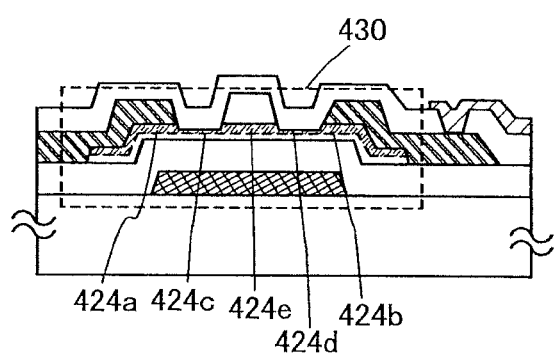

A thin film transistor 430 having a structure in which the first to fifth regions 424a to 424e of the oxide semiconductor layer have a crystal region in their superficial portions as illustrated in FIG. 22B may be alternatively employed. By employing the structure of the thin film transistor 430 which is illustrated in FIG. 22B, on current can be increased.

Figure 22C:
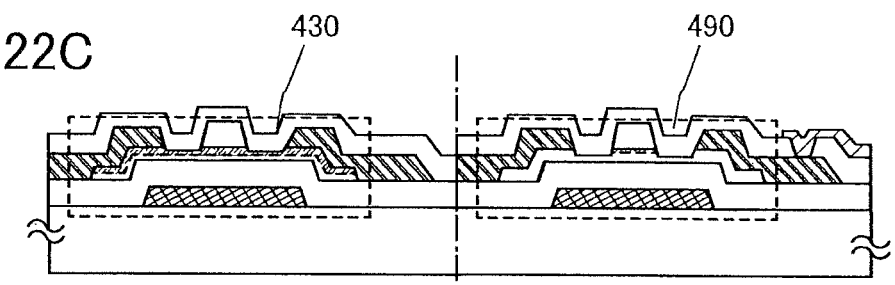
Figure 22D:
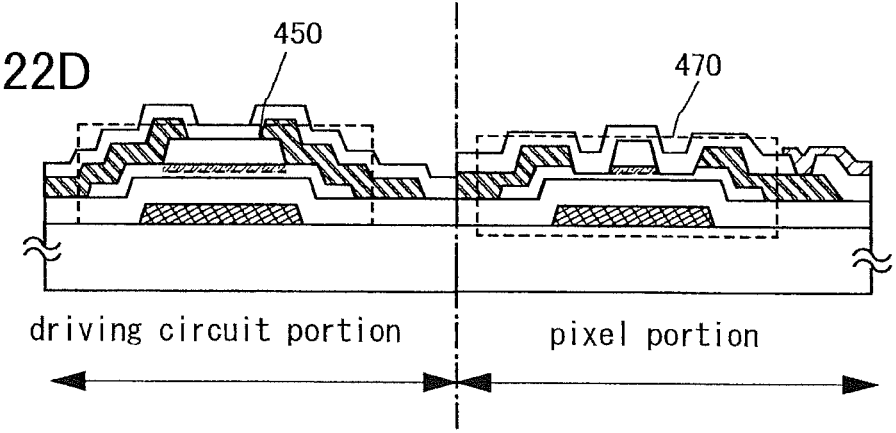

Thin film transistors having different structures, which may be selected from the thin film transistors 430, 450, 470 and 490 may be formed over one substrate. Note that in the case where a pixel portion and a driver circuit are formed over one substrate, excellent switching characteristics are needed for a thin film transistor used for the pixel portion, and high operation speed is preferable for a thin film transistor used for the driver circuit; for example, the thin film transistor 430 may be placed in the driver circuit portion and the thin film transistor 490 may be placed in the pixel portion, as illustrated in FIG. 22C. The thin film transistor 430 placed in the driver circuit portion can increase on current and thus is suitable for applications which need which high current driving capability. The thin film transistor 490 placed in the pixel portion can reduce off current and thus can improve contrast when used as a switching element in the pixel portion. Alternatively, as illustrated in FIG. 22D, the thin film transistor 450 may be placed in the driver circuit portion and the thin film transistor 470 with low off current is preferably placed in the pixel portion. Further alternatively, although not illustrated, the thin film transistor 430 and the thin film transistor 470 may be placed in the driver circuit portion and the pixel portion, respectively, or the thin film transistor 450 and the thin film transistor 490 may be placed in the driver circuit portion and the pixel portion, respectively.

Note that in each of the thin film transistors 430, 450, 470 and 490, the interface between the gate insulating layer 402 and the oxide semiconductor layer 423 which are in contact with each other is amorphous or is formed of a mixture of amorphousness/non-crystals and microcrystals and at least a superficial portion of the oxide semiconductor layer which is in contact with the oxide insulating layer 426a has a crystal region.

In an active matrix liquid crystal display device, a display pattern is formed on a screen by driving pixel electrodes arranged in matrix. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images of a liquid crystal display device, there is a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is another driving technique which is so-called double-frame rate driving. In the double-frame rate driving, a vertical synchronizing frequency is set 1.5 times or more, preferably, 2 times or more as high as a usual vertical synchronizing frequency, whereby the response speed is increased, and the grayscale to be written is selected for every plural fields in each frame which have been obtained by dividing.

Further alternatively, in order to improve the moving-image characteristics of a liquid crystal display device, a driving method may be employed, in which a plurality of LEDs (light-emitting diodes) or a plurality of EL light sources are used to form a plane light source as a backlight, and each light source of the plane light source is independently driven in a pulsed manner in one frame period. Three or more kinds of LEDs may be used or an LED that emits white light may be used. Since a plurality of LEDs can be controlled independently, the light emission timing of the LEDs can be synchronized with the timing at which a liquid crystal layer is optically modulated. According to this driving method, LEDs can be partly turned off; therefore, an effect of reducing power consumption can be obtained particularly in the case of displaying an image having a large black display region occupied in one screen.

By combining these driving methods, the display characteristics of a liquid crystal display device, such as moving-image characteristics, can be improved as compared with those of conventional liquid crystal display devices.

The n-channel transistor obtained in this embodiment includes an In—Ga—Zn—O-based film in a channel formation region and has good dynamic characteristics. Thus, these driving methods can be applied in combination to the transistor of this embodiment.

In manufacturing a light-emitting display device, one electrode (also referred to as a cathode) of an organic light-emitting element is set to a low power supply potential such as a GND potential or 0 V; thus, a terminal portion is provided with a fourth terminal for setting the cathode to a low power supply potential such as a GND potential or 0 V. Also in manufacturing a light-emitting display device, a power supply line is provided in addition to a source wiring and a gate wiring. Accordingly, the terminal portion is provided with a fifth terminal electrically connected to the power supply line.

Through the above steps, a highly reliable thin film transistor having favorable electrical characteristics and a display device including the thin film transistor can be provided.

The thin film transistor described in this embodiment is a thin film transistor using an oxide semiconductor layer. At least the superficial portion of the oxide semiconductor layer in the channel formation region has a crystal region and the rest portion of the oxide semiconductor layer can be amorphous or be formed of a mixture of amorphousness/non-crystals and microcrystals, which enables the thin film transistor to suppress generation of a parasitic channel.

Note that the structure described in this embodiment can be combined with any of the structures described in other embodiments as appropriate.

Embodiment 2

In this embodiment, an example of a manufacturing process of a display device different from that in Embodiment 1 is described with reference to FIGS. 6A to 6E. Note that in this embodiment, the same portions as those in Embodiment 1 and portions having functions similar to those in Embodiment 1 can be treated as in Embodiment 1, and the same or similar steps as or to those in Embodiment 1 can be performed as in Embodiment 1. Thus, repeated description is omitted.

First, over the substrate 400 having an insulating surface, a conductive film for forming the gate wiring including the gate electrode layer 421a, the capacitor wiring 421b, and the first terminal 421c is formed by a sputtering method or a vacuum evaporation method. Next, after the formation of the conductive film over the entire surface of the substrate 400, in a first photolithography step, a resist mask is formed and an unnecessary portion is removed by etching to form wirings and an electrode (the gate wiring including the gate electrode layer 421a, the capacitor wiring 421b, and the first terminal 421c).

Next, over the gate electrode layer 421a, the capacitor wiring 421b, and the first terminal 421c, the gate insulating layer 402 is formed; then, over the gate insulating layer 402, an oxide semiconductor film 103 is formed to a thickness greater than or equal to 5 nm and less than or equal to 200 nm, preferably, greater than or equal to 10 nm and less than or equal to 40 nm. Note that the above steps can be performed as in Embodiment 1.

Figure 6A:
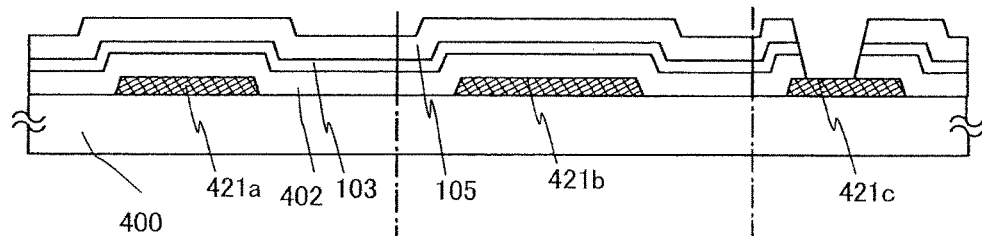
FIGS. 6A to 6E are cross-sectional process views illustrating one embodiment of the present invention.
Figure 6B:
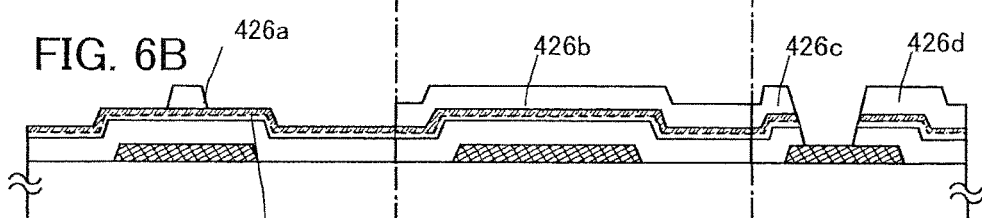

Next, over the oxide semiconductor film 103, an oxide insulating film 105 is formed by a sputtering method; then, in a second photolithography step, a resist mask is formed and selective etching is performed thereon so that a contact hole reaching the first terminal 421c is formed (see FIG. 6A). The oxide insulating film 105 can be formed in a manner similar to that of the oxide insulating film to be the oxide insulating layer 426a described in Embodiment 1.

Then, the oxide semiconductor film 103 is subjected to dehydration or dehydrogenation. A first heat treatment for the dehydration or dehydrogenation can be performed by a rapid thermal annealing (RTA) treatment with the use of a high-temperature gas (an inert gas such as nitrogen or a rare gas) or light at a temperature higher than or equal to 500° C. and lower than or equal to 750° C. (or a temperature lower than or equal to the strain point of a glass substrate) for approximately greater than or equal to one minute and less than or equal to ten minutes, preferably at 650° C. for approximately greater than or equal to three minutes and less than or equal to six minutes. By an RTA treatment, dehydration or dehydrogenation can be performed in a short time; therefore, a treatment can be performed even at a temperature higher than the strain point of a glass substrate. Note that the timing of the heat treatment is not limited to this timing and may be performed plural times, for example, before and after a photolithography step or a deposition step.

Here, the superficial portion of the oxide semiconductor film 103 is crystallized by the first heat treatment and thus comes to have the dense crystal region 106 including nanocrystals. The rest portion of the oxide semiconductor film 103 comes to be amorphous or be formed of a mixture of amorphousness/non-crystals and microcrystals, where an amorphous region is dotted with microcrystals. Note that the crystal region 106 is part of the oxide semiconductor film 103 and hereinafter, the "oxide semiconductor film 103" includes the crystal region 106.

In addition, when the temperature is lowered from the heating temperature Tat which the oxide semiconductor film is subjected to the dehydration or dehydrogenation, it is important to prevent entry of water or hydrogen by using the same furnace that has been used for the dehydration or dehydrogenation, in such a manner that the oxide semiconductor layer is not exposed to the air. In addition, the gas atmosphere in which the temperature is lowered from the heating temperature T may be switched to a gas atmosphere which is different from the gas atmosphere in which the temperature is raised to the heating temperature T. For example, cooling is performed in the furnace where the heat treatment for dehydration or dehydrogenation is performed while the furnace is filled with a high-purity oxygen gas, a high-purity $N_2O$ gas, or ultra-dry air (having a dew point lower than or equal to −40° C., preferably lower than or equal to −60° C.) without exposure to the air.

Note that in the first heat treatment, it is preferable that water, hydrogen, and the like be not contained in the atmosphere. Alternatively, the purity of an inert gas which is introduced into a heat treatment apparatus is preferably greater than or equal to 6N (99.9999%), more preferably greater than or equal to 7N (99.99999%) (that is, the impurity concentration is less than or equal to 1 ppm, preferably less than or equal to 0.1 ppm).

By the first heat treatment, the oxide semiconductor film 103 is changed to an oxygen-deficient type and the resistance thereof is reduced. After the first heat treatment, the carrier concentration is higher than that of the oxide semiconductor film just after the film deposition, so that the oxide semiconductor film has a carrier concentration of, preferably, greater than or equal to $1\times10^{18}/cm^3$.

Then, in a third photolithography step, a resist mask is formed and the oxide insulating layers 426a, 426b, 426c, and 426d are formed by selective etching. After that, the resist mask is removed (see FIG. 6B). Here, the oxide insulating layer 426a functions as a channel protective layer of a thin film transistor. Further, in the oxide semiconductor film 103, a region overlapping with the oxide insulating layer 426a is a region to be a channel formation region in a later step.

Then, a conductive film formed using a metal material is formed over the oxide semiconductor film 103 and the oxide insulating layers 426a, 426b, 426c, and 426d by a sputtering method, a vacuum evaporation method, or the like. As a material of the conductive film, a material similar to that of the gate electrode layer 421a can be used.

In this embodiment, a conductive film in which first to third conductive films are stacked is formed. For example, the first conductive film and the third conductive film are formed using titanium that is a heat-resistant conductive material, and the second conductive film is formed using an aluminum alloy containing neodymium. Such a structure can reduce generation of hillock and utilize a low resistance property of aluminum. Although a three-layer structure of the first to third conductive films is used in this embodiment, one embodiment of the present invention is not limited to this. A single-layer structure, a two-layer structure, or a stacked-layer structure of four or more layers may be employed. A structure including two layers or four or more layers may be employed. For example, a single-layer structure of a titanium film or a single-layer structure of an aluminum film containing silicon may be employed.

Note that at the time of deposition of the conductive film on and in contact with the oxide semiconductor layer, whose superficial portion has the dense crystal region 106 including nanocrystals, damage on the crystal region due to the deposition or heat by the deposition makes the crystal region 106 of the semiconductor layer amorphous in some cases. However, in the manufacturing method of a thin film transistor which is described in this embodiment, the oxide insulating layer 426a functioning as a channel protective layer is provided in contact with the region to be the channel formation region of the oxide semiconductor layer, whereby the superficial portion of the oxide semiconductor layer 423 at least in the channel formation region can have the crystal region 106.

Figure 6C:
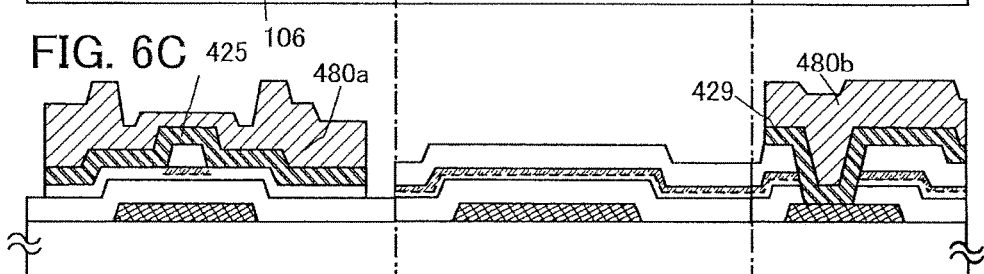
Figure 6D:
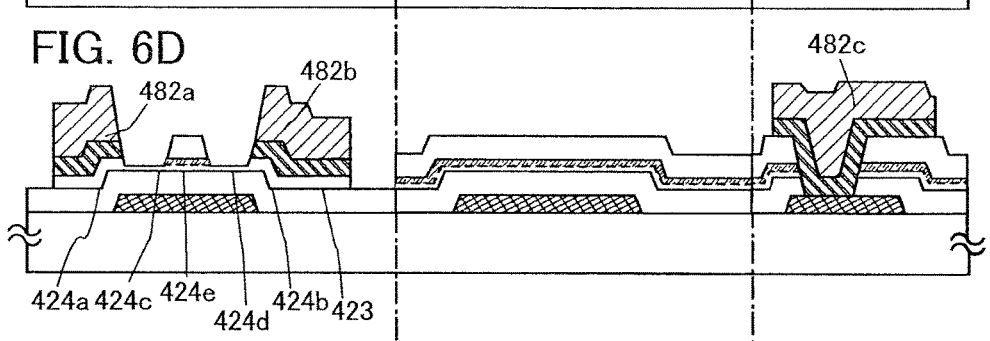

Next, in a fourth photolithography step, resist masks 480a and 480b are formed and unnecessary portions are removed by etching, so that the conductive layer 425 and the connection electrode 429 are formed (see FIG. 6C). Wet etching or dry etching is employed as an etching method at this time. For example, when the first conductive film and the third conductive film are formed using titanium and the second conductive film is formed using an aluminum alloy containing neodymium, wet etching can be performed using a hydrogen peroxide solution or heated hydrochloric acid as an etchant.

In addition, by this fourth photolithography step, the connection electrode 429 is directly connected to the first terminal 421c of the terminal portion through a contact hole formed in the gate insulating layer. Although not illustrated, a source or drain wiring and a gate electrode of a thin film transistor of a driver circuit are directly connected to each other through the same steps as the above steps.

The resist masks 480a and 480b in this embodiment can also be referred to as a resist mask having a recessed portion or a projected portion. In other words, the resist masks 480a and 480b can be referred to as a resist mask having a plurality of regions (here, two regions) with different thicknesses. In the resist masks 480a and 480b, a region with a larger thickness is referred to as a projected portion and a region with a smaller thickness is referred to as a recessed portion.

In each of the resist masks 480a and 480b, the projected portion is formed corresponding to a region of the conductive film, which is to be a source electrode layer or a drain electrode layer later, and the recessed portion is formed corresponding to a peripheral portion of an island-shaped oxide semiconductor layer which is described later.

The resist masks described in this embodiment can be formed using a multi-tone mask. The multi-tone mask is a mask capable of light exposure with multi-level light intensity, and typically, light exposure is performed with three levels of light intensity to provide an exposed region, a half-exposed region, and an unexposed region. With the use of a multi-tone mask, a resist mask with plural thicknesses (typically, two kinds of thicknesses) can be formed by one light exposure and development step. Thus, by using the multi-tone mask, the number of photomasks can be reduced.

By light exposure using the multi-tone mask and development, the resist masks 480a and 480b each of which has regions with different thicknesses can be formed. Note that without limitation thereto, the resist masks 480a and 480b may be formed without the multi-tone mask.

After the conductive layer 425 and the connection electrode 429 are formed using the resist masks 480a and 480b, the resist masks 480a and 480b are reduced (downsized) to form resist masks 482a, 482b, and 482c. In order to reduce (downsize) the resist masks 480a and 480b, ashing using oxygen plasma or the like may be performed. By the reducing (downsizing) the resist masks, a recessed portion of the resist mask 480a is disappeared and divided into the resist masks 482a and 482b. Further, the conductive layer 425 in a region between the resist mask 482a and 482b is exposed (not shown).

Next, using the resist masks 482a, 482b, and 482c, an exposed part of the conductive layer 425 is etched and the connection electrode 429 is partly etched. Accordingly, a source electrode 425a, a drain electrode 425b and an island-shaped oxide semiconductor layer 423 are formed (see FIG. 6D).

By this etching step, the oxide semiconductor film 103 is partly etched so that the third region 424c between the source electrode layer 425a and the oxide insulating layer 426a and the fourth region 424d between the drain electrode layer 425b and the oxide insulating layer 426a each have a thickness less than each of the first region 424a overlapping with the source electrode layer 425a, and the second region 424b overlapping with the drain electrode layer 425b, and the fifth region 424e overlapping with the oxide insulating layer 426a. Note that the fifth region 424e of the oxide semiconductor layer 423 is protected by the oxide insulating layer 426a so as not to be etched and thus the superficial portion has a dense crystal region including nanocrystals at least in the channel formation region. In the channel formation region, the superficial portion of the oxide semiconductor layer is on the back channel side and the crystal region can suppress generation of a parasitic channel.

Each thickness of the first region 424a and the second region 424b is equal to that of the fifth region 424e that is the channel formation region.

Figure 6E:
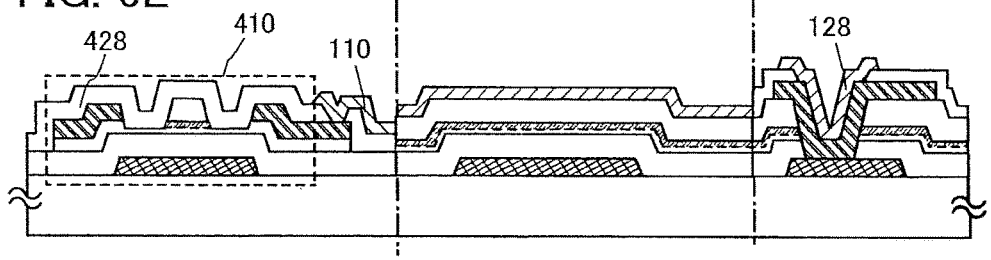

Next, the oxide insulating layer 428 which covers a thin film transistor 410 is formed (see FIG. 6E). As the oxide insulating layer 428, an oxide insulating layer formed using a silicon oxide film, a silicon oxynitride film, an aluminum oxide film, an aluminum oxynitride film, or a tantalum oxide film which is formed by a sputtering method or the like.

Next, a second heat treatment is performed in an inert gas atmosphere or a nitrogen gas atmosphere (preferably at a temperature higher than or equal to 200° C. and lower than or equal to 400° C., e.g., higher than or equal to 250° C. and lower than or equal to 350° C.). For example, the second heat treatment is performed in a nitrogen atmosphere at 250° C. for one hour. Alternatively, an RTA treatment may be performed at a high temperature for a short time as in the first heat treatment. By the second heat treatment, the oxide insulating layer and the oxide semiconductor layer overlapping with the oxide insulating layer are heated being in contact with each other. Note that by the second heat treatment, the oxide semiconductor layer 423 whose resistance is reduced by the first heat treatment is in an oxygen excess state and can be changed into a high-resistance oxide semiconductor layer (an i-type oxide semiconductor layer).

In this embodiment, the second heat treatment is performed after formation of the silicon oxide film; however, the timing of the heat treatment is not limited to the timing immediately after formation of the silicon oxide film as long as it is after formation of the silicon oxide film.

In the case where the source electrode layer 425a and the drain electrode layer 425b are formed using a heat resistant material, a step using conditions of the first heat treatment can be performed at the timing of the second heat treatment. In that case, a heat treatment may be performed once after formation of the silicon oxide film.

Note that a protective insulating layer may be formed over the oxide insulating layer 428. As the protective insulating layer, a silicon nitride film can be formed by an RF sputtering method, for example. The protective insulating layer is formed using an inorganic insulating film which does not contain impurities such as water, hydrogen ions, and OH⁻ and prevents entry of these from the outside. A silicon nitride film, an aluminum nitride film, a silicon nitride oxide film, an aluminum oxynitride film, or the like is used. Note also that the protective insulating layer can be formed successively following the oxide insulating layer 428.

Then, in a fifth photolithography step, a resist mask is formed and the oxide insulating layer 428 is etched so that a contact hole that reaches the drain electrode layer 425b is formed. In addition, a contact hole that reaches the connection electrode 429 is also formed by this etching.

Next, a transparent conductive film is formed after the resist mask is removed. The transparent conductive film is formed using an indium oxide ($In_2O_3$), an alloy of an indium oxide and a tin oxide ($In_2O_3$—$SnO_2$, hereinafter abbreviated as ITO), or the like by a sputtering method, a vacuum evaporation method, or the like. Such a material is etched with a hydrochloric acid-based solution. Note that since a residue is likely to be generated in etching ITO in particular, an alloy of an indium oxide and a zinc oxide ($In_2O_3$—ZnO) may be used to improve etching processability.

Next, in a sixth photolithography step, a resist mask is formed and an unnecessary portion is removed by etching to form the pixel electrode layer 110.

In the sixth photolithography step, a storage capacitor is formed with the gate insulating layer 402, the oxide semiconductor layer, the oxide insulating layer 426b, and the oxide insulating layer 428 in the capacitor portion which are used as dielectrics, the capacitor wiring 421b, and the pixel electrode layer 110.

Further, in the sixth photolithography step, the first terminal 421c is covered with the resist mask, and a transparent conductive film 128 is left in the terminal portion. The transparent conductive film 128 serves as an electrode or a wiring connected to an FPC. The transparent conductive film 128 which is formed over the connection electrode 429 being directly connected to the first terminal 421c is a connection terminal electrode which functions as an input terminal of the gate wiring. Although not illustrated, a connection terminal electrode which functions as an input terminal of the source wiring is also formed at this time.

Through these six photolithography steps, the channel protected thin film transistor 410 and the storage capacitor portion can be thus completed using the six photomasks.

The thin film transistor described in this embodiment is a thin film transistor using an oxide semiconductor layer. A superficial portion of the oxide semiconductor layer in the channel formation region has a crystal region and the rest portion of the oxide semiconductor layer can be amorphous or be formed of a mixture of amorphousness/non-crystals and microcrystals. With a thin film transistor having this structure, generation of a parasitic channel can be suppressed; accordingly, a highly reliable thin film transistor and a display device which have favorable electrical characteristics can be manufactured.

Note that the structure described in this embodiment can be combined with any of the structures described in other embodiments as appropriate.

Embodiment 3

In this embodiment, an example is described below in which at least part of a driver circuit and a thin film transistor to be placed in a pixel portion are formed over one substrate.

The thin film transistor placed in the pixel portion is formed according to Embodiment 1 or 2. Further, the thin film transistor described in Embodiment 1 or 2 is an n-channel TFT. Thus, some of driver circuits that can be constituted by n-channel TFTs among the driver circuits are formed over the same substrate as that for the thin film transistor in the pixel portion.

Figure 7A:
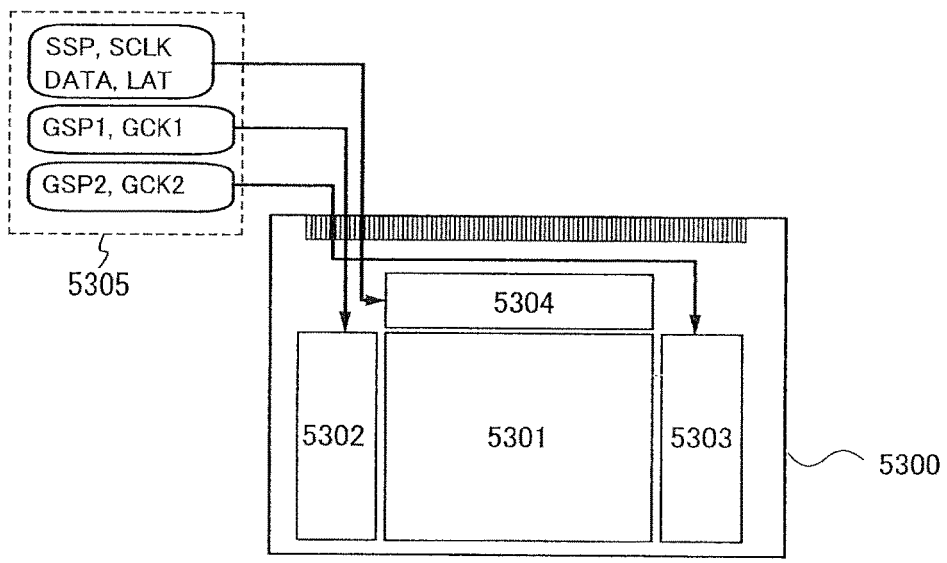
FIGS. 7A and 7B are block diagrams of a semiconductor device.

FIG. 7A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extending from the signal line driver circuit 5304 is provided, and a plurality of scan lines extending from the first scan line driver circuit 5302 and the second scan line driver circuit 5303 is provided. Note that in cross regions of the scan lines and the signal lines, pixels each having a display element are arranged in matrix. Further, the substrate 5300 of the display device is connected to a timing control circuit 5305 (also referred to as a controller or a control IC) through a connection portion of a flexible printed circuit (FPC) or the like.

In FIG. 7A, the first scan line driver circuit 5302, the second scan line driver circuit 5303, and the signal line driver circuit 5304 are formed over the same substrate 5300 as the pixel portion 5301. Accordingly, the number of parts such as driver circuits provided outside is reduced, so that cost can decrease. Moreover, the number of connections in the connection portion in the case where wirings are extended from a driver circuit provided outside the substrate 5300 can be reduced, and the reliability or yield can be improved.

Note that the timing control circuit 5305 supplies a start signal for the first scan line driver circuit (GSP1) and a clock signal for the scan line driver circuit (GCK1) to the first scan line driver circuit 5302, as an example. In addition, the timing control circuit 5305 supplies, for example, a start signal for the second scan line driver circuit (GSP2) (also referred to as a start pulse) and a clock signal for the scan line driver circuit (GCK2) to the second scan line driver circuit 5303. A start signal for the signal line driver circuit (SSP), a clock signal for the signal line driver circuit (SCK), data for a video signal (DATA) (also simply referred to as a video signal), and a latch signal (LAT) are supplied to the signal line driver circuit 5304. Note that each clock signal may be a plurality of clock signals with different phases, or may be supplied with an inverted clock signal (CKB). Note that either the first scan line driver circuit 5302 or the second scan line driver circuit 5303 can be omitted.

Figure 7B:
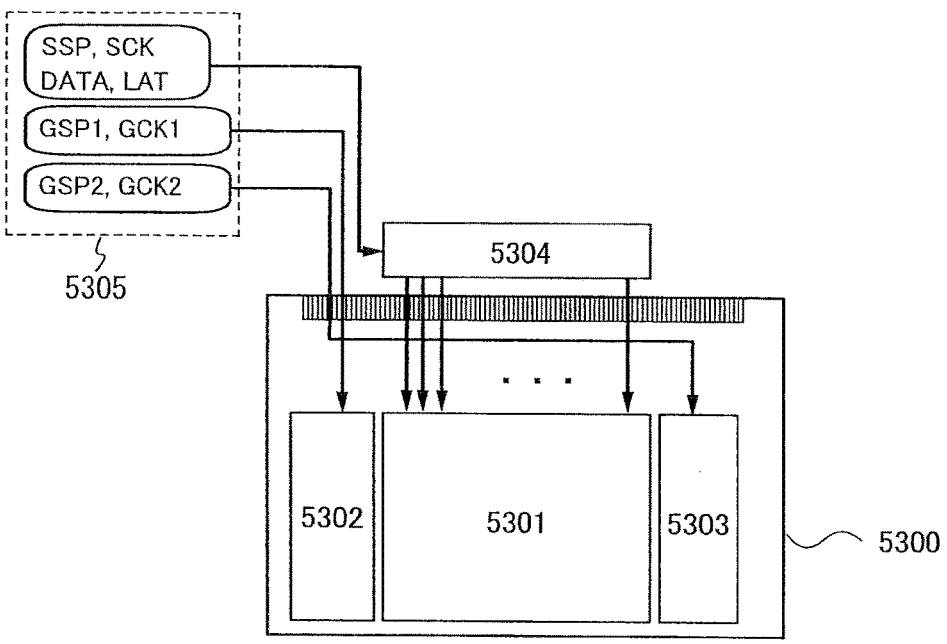

In FIG. 7B, a circuit with a low drive frequency (e.g., the first scan line driver circuit 5302 and the second scan line driver circuit 5303) is formed over the same substrate 5300 as the pixel portion 5301, and the signal line driver circuit 5304 is formed over another substrate which is different from the substrate provided with the pixel portion 5301. This structure enables a driver circuit formed over the substrate 5300 using a thin film transistor having low field effect mobility, compared with a transistor formed using a single crystal semiconductor. Accordingly, increase in the size of the display device, a reduction in the number of steps, a reduction in cost, improvement in yield, or the like can be achieved.

Figure 8A:
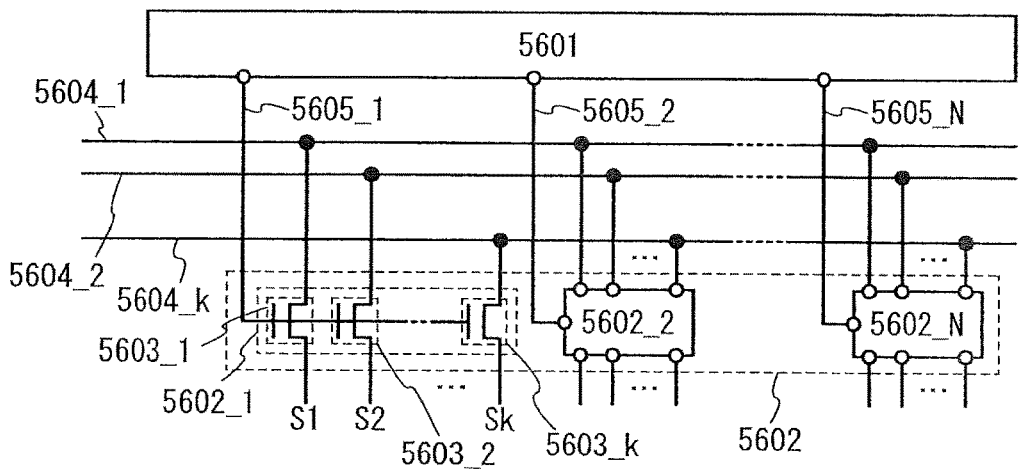
FIGS. 8A and 8B are a circuit diagram and a timing chart of a signal line driver circuit, respectively.
Figure 8B:
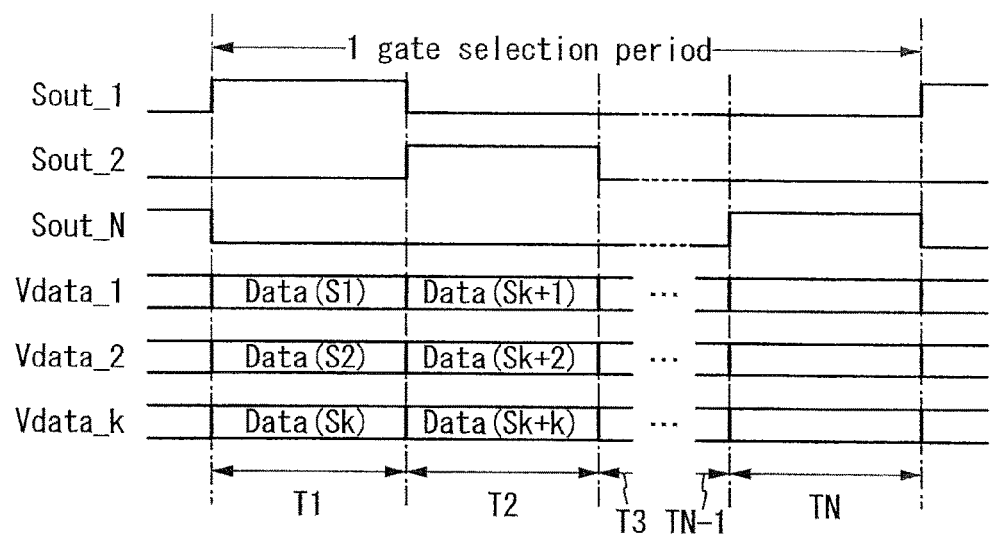

The thin film transistor described in Embodiment 1 or 2 is an n-channel TFT. In FIGS. 8A and 8B, an example of a structure and operation of a signal line driver circuit formed using an n-channel TFT is described.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example in which the thin film transistors 5603_1 to 5603_k are n-channel TFTs is described.

A connection relation of the signal line driver circuit is described by using the switching circuit 5602_1 as an example. First terminals of the thin film transistors 5603_1 to 5603_k are connected to wirings 5604_1 to 5604_K, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially outputting H level signals (also referred to as an H signal or a high power electric potential level) to the wirings 5605_1 to 5605_N, and a function of sequentially selecting the switching circuits 5602_1 to 5602_N.

The switching circuit 5602_1 has a function of controlling conduction states between the wirings 5604_1 to 5604_k and the signal lines S1 to Sk (conduction between the first terminal and the second terminal), that is, a function of controlling whether the electric potentials of the wirings 5604_1 to 5604_k are supplied or not to the signal lines S1 to Sk. In this manner, the switching circuit 5602_1 has a function of a selector. The thin film transistors 5603_1 to 5603_k have functions of controlling conduction states between the wirings 5604_1 to 5604_k and the signal lines S1 to Sk, that is, functions of supplying electric potentials of the wirings 5604_1 to 5604_k to the signal lines S1 to Sk, respectively. In this manner, each of the thin film transistors 5603_1 to 5603_k functions as a switch.

Note that the data for a video signal (DATA) is input to the wirings 5604_1 to 5604_k. The data for a video signal (DATA) is an analog signal corresponding to image data or an image signal in many cases.

Next, operation of the signal line driver circuit illustrated in FIG. 8A is described with reference to a timing chart in FIG. 8B. In FIG. 8B, an example of signals Sout_1 to Sout_N and signals Vdata_1 to Vdata_k is illustrated. The signals Sout_1 to Sout_N are examples of output signals of the shift register 5601, and the signals Vdata_1 to Vdata_k are examples of signals which are input to the wirings 5604_1 to 5604k, respectively. Note that one operation period of the signal line driver circuit corresponds to one gate selection period in a display device. For example, one gate selection period is divided into periods T1 to TN. The periods T1 to TN are periods for writing the data for a video signal (DATA) to pixels in a selected row.

In the periods T1 to TN, the shift register 5601 sequentially outputs H level signals to the wirings 5605_1 to 5605_N. For example, in the period T1, the shift register 5601 outputs a high level signal to the wiring 5605_1. Then, the thin film transistors 5603_1 to 5603_k are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in a selected row in a first to k-th columns through the thin film transistors 5603_1 to 5603k, respectively. Thus, in the periods T1 to TN, the data for a video signal (DATA) is sequentially written to the pixels in the selected row by k columns.

By writing the data for a video signal (DATA) to pixels by a plurality of columns, the number of the data for a video signal (DATA) or the number of wirings can be reduced. Accordingly, the number of connections to external circuits can be reduced. Further, by writing a video signal to pixels of a plurality of columns each time, write time can be extended, and shortage of writing of a video signal can be prevented.

Note that for the shift register 5601 and the switching circuit 5602, a circuit which is formed using the thin film transistor described in Embodiment 1 or 2 can be used. In that case, all the transistors included in the shift register 5601 can be only n-channel transistors or only p-channel transistors.

The structure of a scan line driver circuit will be described. The scan line driver circuit includes a shift register. Additionally, the scan line driver circuit may include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can feed a large amount of current is used.

One mode of a shift register which is used for part of a scan line driver circuit and/or a signal line driver circuit is described with reference to FIGS. 9A to 9C and FIGS. 10A and 10B.

Figure 9A:
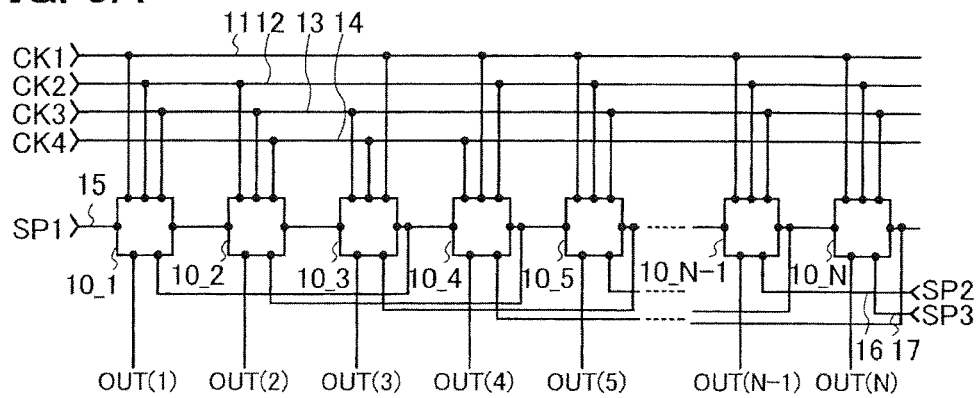
FIGS. 9A to 9C are circuit diagrams illustrating a structure of a shift register.

The shift register includes a first to Nth pulse output circuits 10_1 to 10_N (N is a natural number greater than or equal to 3) (see FIG. 9A). In the shift register illustrated in FIG. 9A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n (n is a natural number greater than or equal to 2 and less than or equal to N) in the second or later stage, a signal from the pulse output circuit in the preceding stage (such a signal is referred to as a preceding-stage signal OUT(n−1)) is input. A signal from the third pulse output circuit 10_3 in the stage that is two stages after the first pulse output circuit 10_1 is also input to the first pulse output circuit 10_1. In a similar manner, a signal from the (n+2)th pulse output circuit 10_(n+2) in the stage that is two stages after the nth pulse output circuit 10_n (such a signal is referred to as a later-stage signal OUT(n+2)) is input to the nth pulse output circuit 10_n in the second or later stage. Thus, the pulse output circuits in the respective stages output first output signals (OUT(1)(SR) to OUT (N)(SR)) to be input to the pulse output circuits in the respective subsequent stages and/or the pulse output circuits in the stages that are two stages before the respective pulse output circuits and second output signals (OUT(1) to OUT (N)) for electrical connection to other wirings or the like. Note that since the subsequent-stage signal OUT(n+2) is not input to the last two stages of the shift register as illustrated in FIG. 9A, a second start pulse SP2 from the sixth wiring 16 and a third start pulse SP3 from the seventh wiring 17 may be input to the stage before the last stage and the last stage, respectively, for example. Alternatively, a signal generated in the shift register may be additionally input. For example, a structure may be employed in which a (n+1)th pulse output circuit 10(n+1) and a (n+2)th pulse output circuit 10(n+2) which do not affect pulse output to the pixel portion (such circuits are also referred to as dummy stages) are provided so that a signal serving as a second start pulse (SP2) and a signal serving as a third start pulse (SP3) are generated from the dummy stages.

Note that a clock signal (CK) is a signal which alternates between an H level signal and an L level signal (also referred to as an L signal or a low power supply potential level) at a regular interval. Here, the first to fourth clock signals (CK1) to (CK4) are sequentially delayed by a quarter of a cycle. In this embodiment, by using the first to fourth clock signals (CK1) to (CK4), control or the like of driving of a pulse output circuit is performed. Although the clock signal is used as a GCK or an SCK in accordance with a driver circuit to which the clock signal is input, the clock signal is described as a CK here.

A first input terminal 21, a second input terminal 22, and a third input terminal 23 are electrically connected to any of the first to fourth wirings 11 to 14. For example, in FIG. 9A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 9B:
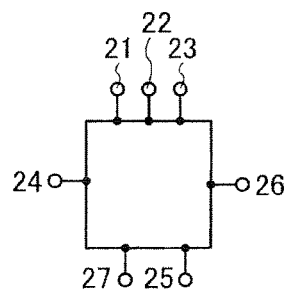

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 9B). In the first pulse output circuit 10_1, the first clock signal CK1 is input to the first input terminal 21, the second clock signal CK2 is input to the second input terminal 22, the third clock signal CK3 is input to the third input terminal 23, the start pulse is input to the fourth input terminal 24, a subsequent stage signal OUT (3) is input to the fifth input terminal 25, a first output signal OUT (1) (SR) is output from the first output terminal 26, and a second output signal OUT (1) is output from the second output terminal 27.

Next, an example of a specific circuit structure of the pulse output circuit illustrated in FIG. 9B is described with reference to FIG. 9C.

Figure 9C:
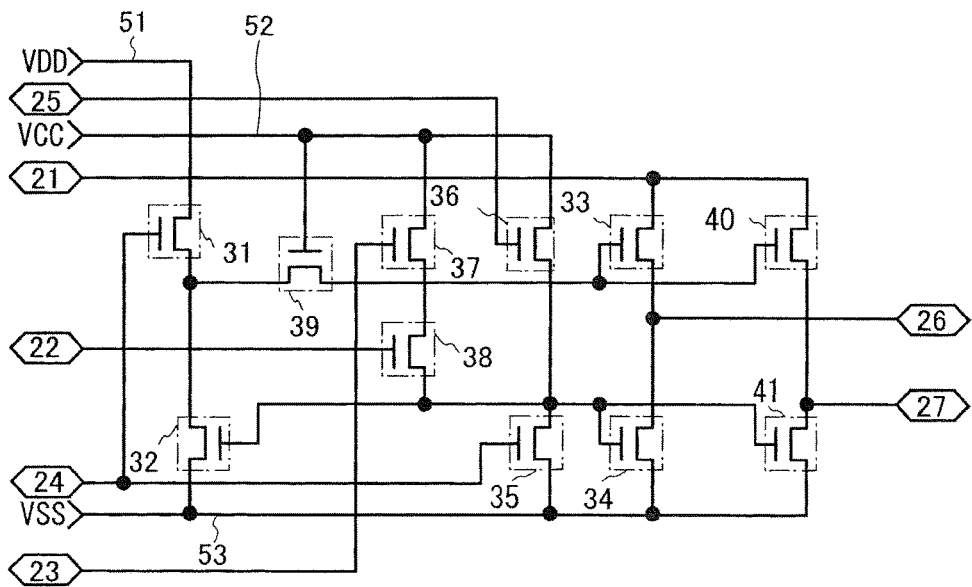

The pulse output circuit illustrated in FIG. 9C includes first to eleventh transistors 31 to 41. In addition to the first to fifth input terminals 21 to 25, the first output terminal 26, and the second output terminal 27, signals or power supply potentials are supplied to the first to eleventh transistors 31 to 41 from a power supply line 51 to which a first high power supply potential VDD is supplied, a power supply line 52 to which a second high power supply potential VCC is supplied, and a power supply line 53 to which a low power supply potential VSS is supplied. Here, the magnitude relation among power supply potentials of the power supply lines illustrated in FIG. 9C is set as follows: the first power supply potential VDD is higher than or equal to the second power supply potential VCC, and the second power supply potential VCC is higher than the third power supply potential VSS. Although the first to fourth clock signals (CK1) to (CK4) are signals which alternate between an H level signal and an L level signal at a regular interval, an electric potential is VDD when the clock signal is at an H level, and an electric potential is VSS when the clock signal is at an L level. Note that the electric potential VDD of the power supply line 51 is higher than the electric potential VCC of the power supply line 52, so that there is no effect on an operation, the electric potential applied to a gate electrode of a transistor can be low, a shift of the threshold voltage of the transistor can be reduced, and deterioration can be suppressed.

In FIG. 9C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. A first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and a gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 9C, a connection portion of the gate electrode of the third transistor 33, the gate electrode of the tenth transistor 40, and the second terminal of the ninth transistor 39 is a node A. A connection portion of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is a node B (see FIG. 10A).

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may change depending on the structure, the operating condition, and the like of the thin film transistor, it is difficult to define which is a source or a drain. Therefore, a region functioning as a source or a drain is not called the source or the drain in some cases. In such a case, for example, one of the source and the drain may be referred to as a first terminal and the other thereof may be referred to as a second terminal.

Figure 10A:
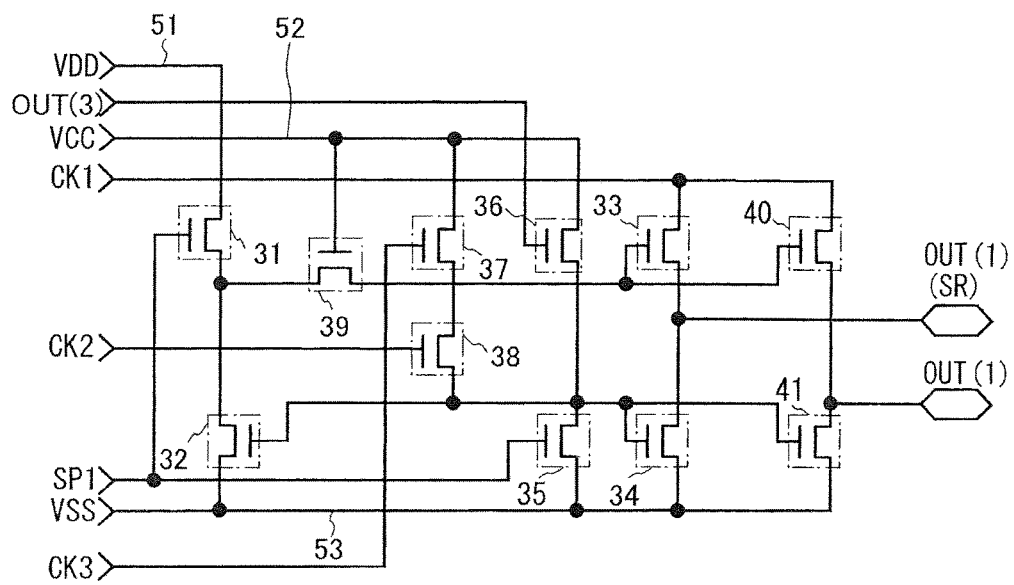
FIGS. 10A and 10B are a circuit diagram and a timing chart illustrating operation of a shift register.
Figure 10B:
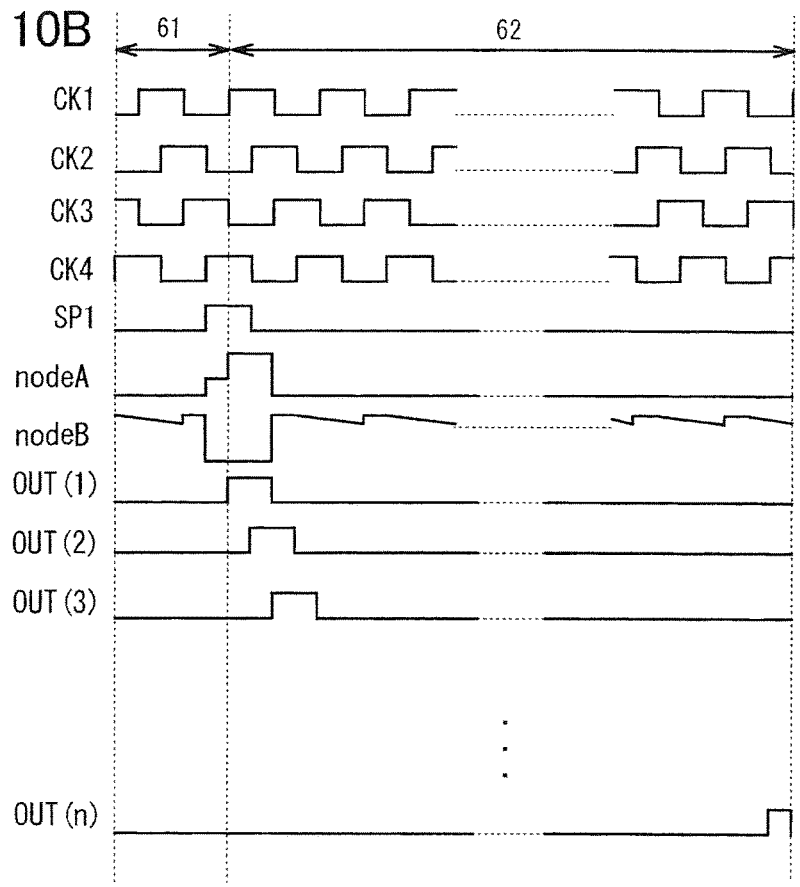

Here, a timing chart of a shift register in which a plurality of pulse output circuits illustrated in FIG. 10A is provided is illustrated in FIG. 10B. Note that in FIG. 10B, when the shift register is a scan line driver circuit, a period 61 is a vertical retrace period and a period 62 is a gate selection period.

Note that as illustrated in FIG. 10A, when the ninth transistor 39 having the gate to which the second power supply potential VCC is applied is provided, there are the following advantages before or after the bootstrap operation.

Without the ninth transistor 39 whose gate electrode is supplied with the second power supply potential VCC, when an electric potential of the node A is raised by bootstrap operation, an electric potential of a source which is the second terminal of the first transistor 31 increases to a value higher than the first power supply potential VDD. Then, the source of the first transistor 31 is switched to the first terminal side, that is, the power supply line 51 side. Therefore, in the first transistor 31, a large amount of bias voltage is applied and thus great stress is applied between a gate and a source and between the gate and a drain, which can cause deterioration in the transistor. When the ninth transistor 39 is provided whose gate electrode is supplied with the second power supply potential VCC, an electric potential of the node A is raised by bootstrap operation, but at the same time, an increase in an electric potential of the second terminal of the first transistor 31 can be prevented. In other words, with the ninth transistor 39, negative bias voltage applied between a gate and a source of the first transistor 31 can be reduced. Accordingly, with a circuit structure in this embodiment, negative bias voltage applied between a gate and a source of the first transistor 31 can be reduced, so that deterioration in the first transistor 31, which is due to stress, can be restrained.

Note that the ninth transistor 39 may be provided in any places where the ninth transistor 39 is connected between the second terminal of the first transistor 31 and the gate of the third transistor 33 through the first terminal and the second terminal. When a shift register includes a plurality of pulse output circuits in this embodiment, the ninth transistor 39 may be omitted in a signal line driver circuit which has a larger number of stages than a scan line driver circuit, and there is an advantage of decreasing the number of transistors.

Note that when oxide semiconductors are used for semiconductor layers for the first to the eleventh transistors 31 to 41, the off-state current of the thin film transistors can be reduced, the on-state current and the field effect mobility can be increased, and the degree of deterioration can be reduced, whereby malfunction of a circuit can decrease. Compared with a transistor formed using an oxide semiconductor and a transistor formed using amorphous silicon, the degree of deterioration of the transistor due to the application of a high electric potential to the gate electrode is low. Therefore, similar operation can be obtained even when the first power supply potential VDD is supplied to the power supply line which supplies the second power supply potential VCC, and the number of power supply lines which are led between circuits can decrease; therefore, the size of the circuit can be reduced.

Note that a similar function is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 are supplied from the second input terminal 22 and the third input terminal 23, respectively. In this case, in the shift register illustrated in FIG. 10A, the state is changed from the state where both the seventh transistor 37 and the eighth transistor 38 are turned on, to the state where the seventh transistor 37 is turned off and the eighth transistor 38 is turned on, and then to the state where both the seventh transistor 37 and the eighth transistor 38 are turned off; thus, the fall in an electric potential of the node B due to fall in the electric potentials of the second input terminal 22 and the third input terminal 23 is caused twice by fall in the electric potential of the gate electrode of the seventh transistor 37 and fall in the electric potential of the gate electrode of the eighth transistor 38. On the other hand, in the shift register illustrated in FIG. 10A, the state is changed from the state where both the seventh transistor 37 and the eighth transistor 38 are turned on to the state where the seventh transistor 37 is turned on and the eighth transistor 38 is turned off, and then to the state where both the seventh transistor 37 and the eighth transistor 38 are turned off. Accordingly, the fall in an electric potential of the node B due to fall in electric potentials of the second input terminal 22 and the third input terminal 23 is reduced to one, which is caused by fall in an electric potential of the gate electrode of the eighth transistor 38. Therefore, the connection relation, that is, the clock signal CK3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the change in the electric potential of the node B can be reduced and the noise can be decreased.

In this way, in a period during which the electric potential of the first output terminal 26 and the electric potential of the second output terminal 27 are each held at an L level, an H level signal is regularly supplied to the node B; therefore, malfunction of the pulse output circuit can be suppressed.

Note that the structure described in this embodiment can be combined with any of the structures described in other embodiments as appropriate.

Embodiment 4

The thin film transistor described in Embodiment 1 or 2 is manufactured, and a semiconductor device having a display function (also referred to as a display device) can be manufactured using the thin film transistor in a pixel portion and further in a driver circuit. Further, part or the whole of the driver circuit having the thin film transistor described in Embodiment 1 or 2 is formed over the same substrate as the pixel portion, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which a display element is sealed, and a module in which an IC and the like including a controller are mounted on the panel. Furthermore, an element substrate, which corresponds to an embodiment before the display element is completed in a manufacturing process of the display device, is provided with a means for supplying current to the display element in each of a plurality of pixels. The element substrate may be specifically in a state where only a pixel electrode of a display element is formed or in a state after a conductive film to be a pixel electrode is formed and before the conductive film is etched to form a pixel electrode, and can have any mode.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, the appearance and a cross section of a liquid crystal display panel, which corresponds to one mode of a semiconductor device, are described with reference to FIGS. 11A1, 11A2, and 11B. FIGS. 11A1 and 11A2 are top views of a panel in which highly reliable thin film transistors 4010 and 4011 each including the In—Ga—Zn—O-based film described in Embodiments 1 and 2 as an oxide semiconductor layer and a liquid crystal element 4013 formed over a first substrate 4001 are sealed between the first substrate 4001 and a second substrate 4006 with a sealant 4005. FIG. 11B is a cross-sectional view taken along line M-N of FIGS. 11A1 and 11A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 11A1 illustrates an example in which the signal line driver circuit 4003 is mounted by a COG method and FIG. 11A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 11B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

Any of the highly reliable thin film transistors including an In—Ga—Zn—O-based film as the oxide semiconductor layers which are described in Embodiments 1 and 2 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 which function as alignment films, respectively, and the liquid crystal layer 4008 is sandwiched between the pixel electrode layer 4030 and the counter electrode layer 4031 with the insulating layers 4032 and 4033 interposed therebetween. Although not illustrated, a color filter may be provided on either the first substrate 4001 side or the second substrate 4006 side.

Note that the first substrate 4001 and the second substrate 4006 can be formed of glass, metal (typically, stainless steel), ceramic, or plastic. As plastics, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A spacer 4035 is a columnar spacer obtained by selective etching of an insulating film and is provided in order to control the distance (a cell gap) between the pixel electrode layer 4030 and the counter electrode layer 4031. Alternatively, a spherical spacer may also be used. In addition, the counter electrode layer 4031 is electrically connected to a common potential line formed over the same substrate as the thin film transistor 4010. With the use of a common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase only appears within a narrow range of temperature, a liquid crystal composition containing a chiral agent at greater than or equal to 5 percent by weight so as to improve the temperature range is used for the liquid crystal layer 4008. The liquid crystal composition which includes a liquid crystal exhibiting a blue phase and a chiral agent has a short response time of greater than or equal to 10 µsec and less than or equal to 100 µsec, has optical isotropy, which makes the alignment process unneeded, and has a small viewing angle dependence.

Note that although an example of a transmissive liquid crystal display device is described in this embodiment, the present invention can also be applied to a reflective liquid crystal display device or a transflective liquid crystal display device.

An example of the liquid crystal display device according to this embodiment is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film functioning as a black matrix may be provided.

In this embodiment, in order to reduce the surface roughness due to the thin film transistor and to improve the reliability of the thin film transistor, the thin film transistor obtained in Embodiment 1 or 2 is covered with insulating layers (the insulating layers 4020 and 4021) functioning as a protective film and a planarizing insulating film. Note that the protective film is provided to prevent entry of contaminant impurities such as an organic substance, metal, and moisture existing in the air and is preferably a dense film. The protective film may be formed to have a single-layer structure or a stacked-layer structure using any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although this embodiment describes an example in which the protective film is formed by a sputtering method, any other method may be used.

In this embodiment, the insulating layer 4020 having a stacked-layer structure is formed as the protective film. Here, a silicon oxide film is formed by a sputtering method, as a first layer of the insulating layer 4020. The use of a silicon oxide film as a protective film has an effect of preventing hillock of an aluminum film which is used as the source and drain electrode layers.

As a second layer of the protective film, an insulating layer is formed. Here, a silicon nitride film is formed by a sputtering method, as a second layer of the insulating layer 4020. The use of the silicon nitride film as the protective film can prevent mobile ions of sodium or the like from entering a semiconductor region so that variation in electrical characteristics of the TFT can be suppressed.

After the protective film is formed, annealing (higher than or equal to 300° C. and lower than or equal to 400° C.) of the oxide semiconductor layer may be performed.

The insulating layer 4021 is formed as the planarizing insulating film. The insulating layer 4021 may be formed using an organic material having heat resistance such as acrylic, polyimide, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method of forming the insulating layer 4021, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. In the case of forming the insulating layer 4021 with the use of a liquid material, annealing (higher than or equal to 300° C. and lower than or equal to 400° C.) of the oxide semiconductor layer may be performed at the same time as a baking step. The baking step of the insulating layer 4021 also serves as annealing of the oxide semiconductor layer, whereby a semiconductor device can be manufactured efficiently.

The pixel electrode layer 4030 and the counter electrode layer 4031 can be formed using a light-transmitting conductive material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70 at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and electric potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive film that is used for the pixel electrode layer 4030 included in the liquid crystal element 4013. A terminal electrode 4016 is formed using the same conductive film that is used for the source and drain electrode layers of the thin film transistors 4010 and 4011.

The connection terminal electrode 4015 is electrically connected to a terminal included in the FPC 4018 via an anisotropic conductive film 4019.

FIGS. 11A1, 11A2, and 11B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 12:
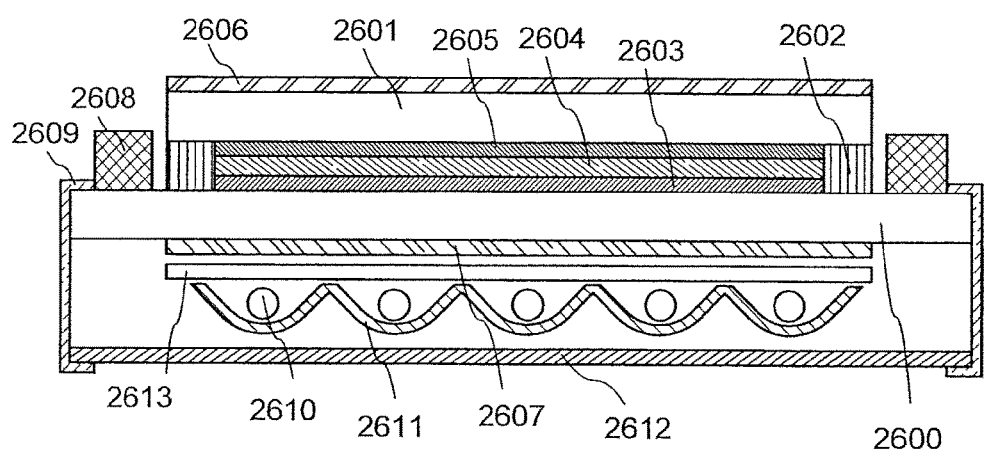
FIG. 12 is a cross-sectional view illustrating one embodiment of the present invention.

FIG. 12 illustrates an example in which a liquid crystal display module is formed as a semiconductor device, using a TFT substrate 2600 which is manufactured using the thin film transistor described in Embodiment 1 or 2.

FIG. 12 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power supply circuit. The polarizing plate and the liquid crystal layer may be stacked with a retardation plate interposed therebetween.

The liquid crystal display module can employ a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an anti ferroelectric liquid crystal (AFLC) mode, or the like.

Through the above process, a highly reliable liquid crystal display panel as a semiconductor device can be manufactured.

Note that the structure described in this embodiment can be combined with any of the structures described in other embodiments as appropriate.

Embodiment 5

In this embodiment, an example of electronic paper will be described as a semiconductor device to which the thin film transistor described in Embodiment 1 or Embodiment 2 is applied.

Figure 13:
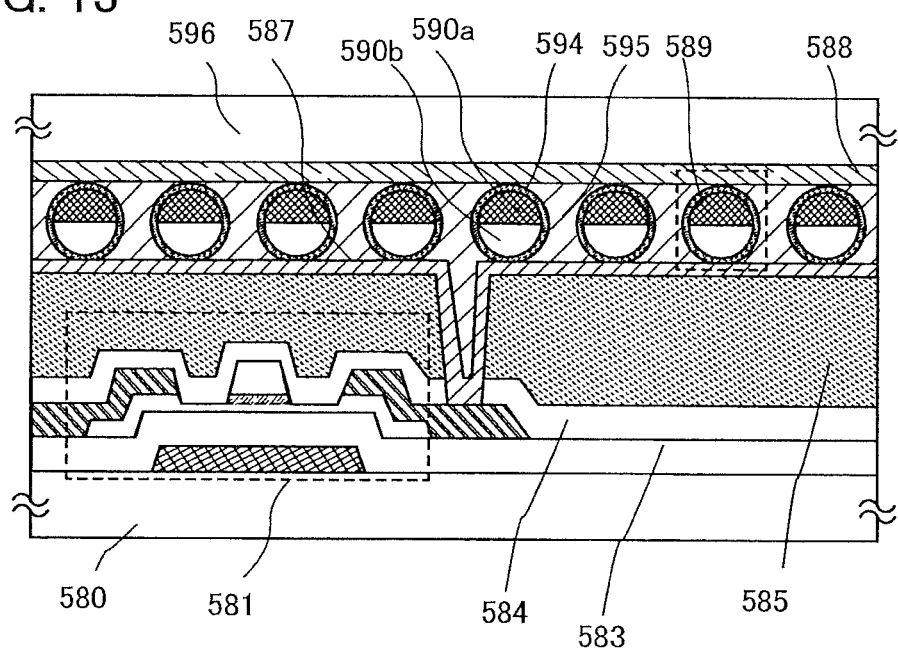
FIG. 13 is a cross-sectional view illustrating one embodiment of the present invention.

FIG. 13 illustrates active matrix electronic paper as an example of a semiconductor device. As a thin film transistor 581 used for the semiconductor device, the thin film transistor described in Embodiments 1 and 2 can be applied.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and an electric potential difference is generated between the first electrode layer and the second electrode layer to control orientation of the spherical particles, so that display is performed.

The thin film transistor 581 sealed between a substrate 580 and a substrate 596 is a thin film transistor with a bottom-gate structure, and a source or drain electrode layer thereof is in contact with a first electrode layer 587 through an opening formed in insulating layers 584 and 585, whereby the thin film transistor 581 is electrically connected to the first electrode layer 587. Between the first electrode layer 587 and a second electrode layer 588, spherical particles 589 are provided. Each spherical particle 589 includes a black region 590a and a white region 590b, and a cavity 594 filled with liquid around the black region 590a and the white region 590b. The circumference of the spherical particle 589 is filled with a filler 595 such as a resin or the like (see FIG. 13). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of the common connection portion described in Embodiment 1 or 2, the second electrode layer 588 can be electrically connected to the common potential line by conductive particles arranged between a pair of substrates.

Further, instead of the twisting ball, an electrophoretic element can also be used. A microcapsule having a diameter of approximately greater than or equal to 10 μm and less than or equal to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, a highly reliable electronic paper as a semiconductor device can be realized.

Note that the structure described in this embodiment can be combined with any of the structures described in other embodiments as appropriate.

Embodiment 6

In this embodiment, an example of a light-emitting display device will be described as a semiconductor device to which the thin film transistor described in Embodiment 1 or 2 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Because of such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 14:
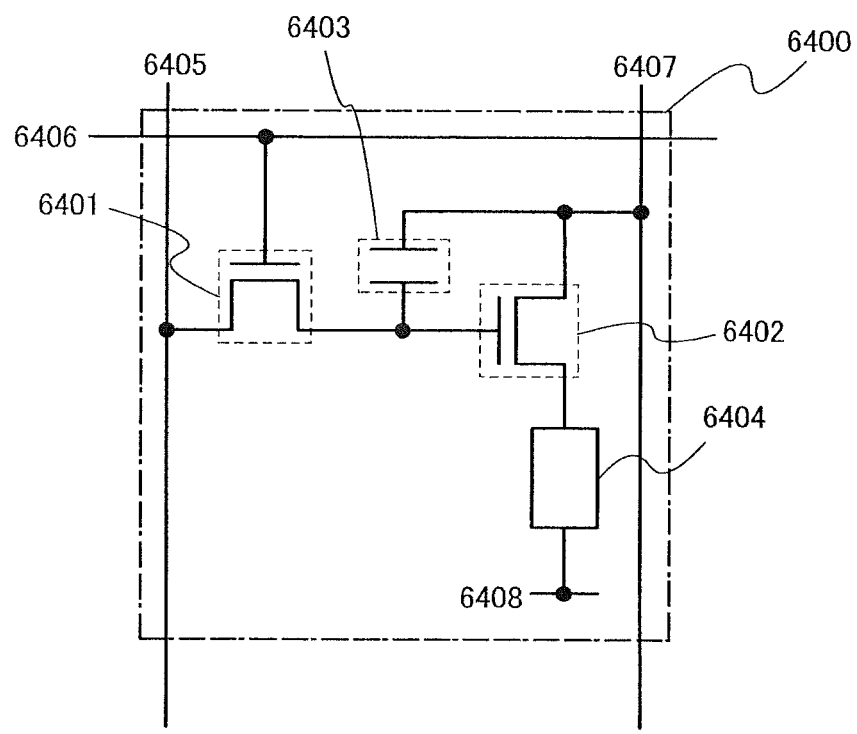
FIG. 14 is a view illustrating an equivalent circuit of a pixel of a semiconductor device.

FIG. 14 illustrates an example of a pixel structure to which digital time grayscale driving can be applied, as an example of a semiconductor device to which the present invention is applied.

A structure and operation of a pixel to which digital time grayscale driving can be applied are described. Here, an example is described in which one pixel includes two n-channel transistors each of which is described in Embodiments 1 and 2 and each of which includes an oxide semiconductor layer (In—Ga—Zn—O-based film) in the channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate. The connection portion may be used as a common connection portion.

The second electrode (common electrode 6408) of the light-emitting element 6404 is set to low power supply potential. Note that the low power supply potential is potential satisfying the low power supply potential<high power supply potential with reference to the high power supply potential that is set to the power supply line 6407. As the low power supply potential, a GND potential, 0 V, or the like may be employed, for example. An electric potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each electric potential is set so that the electric potential difference between the high power supply potential and the low power supply potential is greater than or equal to forward threshold voltage of the light-emitting element 6404.

Note that a gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, voltage greater than the voltage of the power supply line 6407 is applied to the gate of the driver transistor 6402. Note that voltage greater higher than or equal to (voltage of the power supply line+Vth of the driver transistor 6402) is applied to the signal line 6405.

In the case of performing analog grayscale driving instead of digital time grayscale driving, the same pixel configuration as FIG. 14 can be used by changing signal input.

In the case of performing analog grayscale driving, voltage greater than or equal to (forward voltage of the light-emitting element 6404+Vth of the driver transistor 6402) is applied to the gate of the driver transistor 6402. The forward voltage of the light-emitting element 6404 indicates voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the electric potential of the power supply line 6407 is set greater than the gate potential of the driver transistor 6402. When an analog video signal is used, it is possible to feed current to the light-emitting element 6404 in accordance with the video signal and perform analog grayscale driving.

Note that the pixel structure is not limited to that illustrated in FIG. 14. For example, a switch, a resistor, a capacitor, a transistor, a logic circuit, or the like may be added to the pixel illustrated in FIG. 14.

Next, structures of the light-emitting element will be described with reference to FIGS. 15A to 15C. Here, the case where a driver TFT is an n-channel transistor is illustrated, and cross-sectional structures of pixels are described. Driver TFTs 7001, 7011, and 7021 used for semiconductor devices illustrated in FIGS. 15A to 15C can be manufactured in a manner similar to that of the thin film transistor described in Embodiments 1 and 2 and are highly reliable thin film transistors each including an In—Ga—Zn—O-based film as an oxide semiconductor layer.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface on the side opposite to the substrate side; a bottom emission structure, in which light emission is extracted through the surface on the substrate side; or a dual emission structure, in which light emission is extracted through the surface on the side opposite to the substrate side and the surface on the substrate side. The pixel structure according to one embodiment of the present invention can be applied to a light-emitting element having any of these emission structures.

Next, a light-emitting element having a bottom emission structure will be described with reference to FIG. 15A.

Figure 15A:
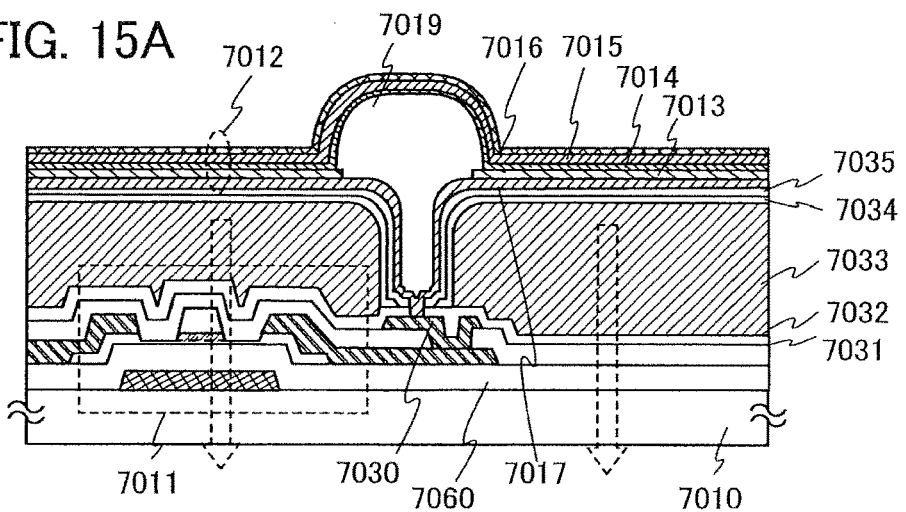
FIGS. 15A to 15C are cross-sectional views each illustrating one embodiment of the present invention.

FIG. 15A is a cross-sectional view of a pixel in the case where the driver TFT 7011 is an n-channel transistor and light generated in a light-emitting element 7012 is emitted to pass through a first electrode 7013. In FIG. 15A, the first electrode 7013 of the light-emitting element 7012 is formed over a light-transmitting conductive film 7017 which is electrically connected to the drain electrode layer of the driver TFT 7011, and an EL layer 7014 and a second electrode 7015 are stacked in that order over the first electrode 7013.

As the light-transmitting conductive film 7017, a light-transmitting conductive film such as a film of an indium oxide containing a tungsten oxide, an indium zinc oxide containing a tungsten oxide, an indium oxide containing a titanium oxide, an indium tin oxide containing a titanium oxide, an indium tin oxide, an indium zinc oxide, or an indium tin oxide to which a silicon oxide is added can be used.

Any of a variety of materials can be used for the first electrode 7013 of the light-emitting element. For example, when the first electrode 7013 serves as cathode, specifically, the first electrode 7013 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 15A, the first electrode 7013 is formed to have a thickness enough to transmit light (preferably, approximately 5 nm to 30 nm). For example, an aluminum film with a thickness of 20 nm is used as the first electrode 7013.

Alternatively, a light-transmitting conductive film and an aluminum film may be stacked and then selectively etched so as to form the light-transmitting conductive film 7017 and the first electrode 7013. In this case, the etching can be performed using the same mask, which is preferable.

The peripheral portion of the first electrode 7013 is covered with a partition 7019. The partition 7019 can be formed using an organic resin film of polyimide, acrylic, polyamide, epoxy, or the like; an inorganic insulating film; or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 which is formed over the first electrode 7013 and the partition 7019 may include at least a light-emitting layer and be formed using a single layer or a plurality of layers stacked. When the EL layer 7014 is formed using a plurality of layers, an electron-injection layer, an electron-transport layer, a light-emitting layer, a hole-transport layer, and a hole-injection layer are stacked in that order over the first electrode 7013 which functions as a cathode. Note that it is not necessary to form all of these layers.

The stacking order is not limited to the above stacking order, and a hole-injection layer, a hole-transport layer, a light-emitting layer, an electron-transport layer, and an electron-injection layer may be stacked in that order over the first electrode 7013 which functions as an anode. However, when power consumption is compared, it is preferable that the first electrode 7013 function as a cathode and an electron-injection layer, an electron-transport layer, a light-emitting layer, a hole-transport layer, and a hole-injection layer be stacked in that order over the first electrode 7013 because voltage rise in the driver circuit portion can be suppressed- and power consumption can be decreased.

As the second electrode 7015 formed over the EL layer 7014, various materials can be used. For example, when the second electrode 7015 is used as an anode, it is preferable to use a material having a high work function, such as ZrN, Ti, W, Ni, Pt, Cr, or a light-transmitting conductive material such as ITO, IZO, or ZnO. Further, a light-blocking film 7016, for example, a metal which blocks light, a metal which reflects light, or the like is provided over the second electrode 7015. In this embodiment, an ITO film is used as the second electrode 7015 and a Ti film is used as the light-blocking film 7016.

The light-emitting element 7012 corresponds to a region where the EL layer 7014 including a light-emitting layer is sandwiched between the first electrode 7013 and the second electrode 7015. In the case of the element structure illustrated in FIG. 15A, light is emitted from the light-emitting element 7012 to the first electrode 7013 side as indicated by an arrow.

Note that in FIG. 15A, light emitted from the light-emitting element 7012 passes through a color filter layer 7033, an insulating layer 7032, an oxide insulating layer 7031, a gate insulating layer 7060, and a substrate 7010 to be emitted to the outside.

The color filter layer 7033 is formed by a droplet discharge method such as an inkjet method, a printing method, an etching method with the use of a photolithography technique, or the like.

The color filter layer 7033 is covered with an overcoat layer 7034, and also covered with a protective insulating layer 7035. Although the overcoat layer 7034 is illustrated to have a small thickness in FIG. 15A, the overcoat layer 7034 has a function of reducing unevenness caused by the color filter layer 7033 with the use of a resin material such as an acrylic resin.

A contact hole which is formed in the protective insulating layer 7035 and the insulating layer 7032, and which reaches a connection electrode layer 7030 is provided in a portion which overlaps with the partition 7019.

Next, a light-emitting element having a dual emission structure will be described with reference to FIG. 15B.

Figure 15B:
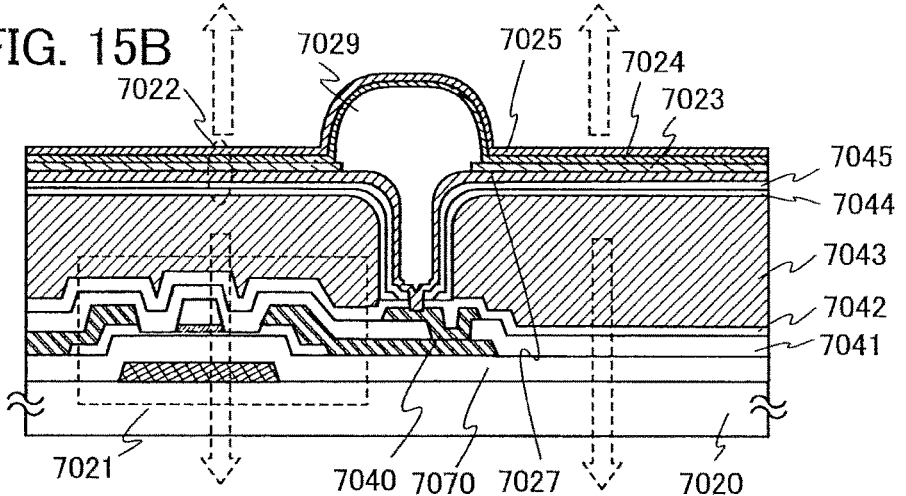

In FIG. 15B, a first electrode 7023 of a light-emitting element 7022 is formed over a light-transmitting conductive film 7027 which is electrically connected to the drain electrode layer of the driver TFT 7021, and an EL layer 7024 and a second electrode 7025 are stacked in that order over the first electrode 7023.

As the light-transmitting conductive film 7027, a light-transmitting conductive film such as a film of an indium oxide containing a tungsten oxide, an indium zinc oxide containing a tungsten oxide, an indium oxide containing a titanium oxide, an indium tin oxide containing a titanium oxide, an indium tin oxide, an indium zinc oxide, or an indium tin oxide to which a silicon oxide is added can be used.

Any of a variety of materials can be used for the first electrode 7023. For example, when the first electrode 7023 serves as a cathode, specifically, the first electrode 7023 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 serves as a cathode and the first electrode 7023 is formed to have a thickness enough to transmit light (preferably, approximately 5 nm to 30 nm). For example, an aluminum film with a thickness of 20 nm can be used as the cathode.

Alternatively, a light-transmitting conductive film and an aluminum film may be stacked and then selectively etched so as to form the light-transmitting conductive film 7027 and the first electrode 7023. In this case, the etching can be performed using the same mask, which is preferable.

The peripheral portion of the first electrode 7023 is covered with a partition 7029. The partition 7029 can be formed using an organic resin film of polyimide, acrylic, polyamide, epoxy, or the like; an inorganic insulating film; or organic polysiloxane. It is particularly preferable that the partition 7029 be formed using a photosensitive material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 which is formed over the first electrode 7023 and the partition 7029 may include at least a light-emitting layer and be formed using a single layer or a plurality of layers stacked. When the EL layer 7024 is formed using a plurality of layers, an electron-injection layer, an electron-transport layer, a light-emitting layer, a hole-transport layer, and a hole-injection layer are stacked in that order over the first electrode 7023 which functions as a cathode. Note that it is not necessary to form all of these layers.

The stacking order is not limited to the above, and the first electrode 7023 is used as an anode and a hole-injection layer, a hole-transport layer, a light-emitting layer, an electron-transport layer, and an electron-injection layer may be stacked in that order over the first electrode 7023. Note that when power consumption is compared, it is preferable that the first electrode 7023 function as a cathode and an electron-injection layer, an electron-transport layer, a light-emitting layer, a hole-transport layer, and a hole-injection layer be stacked in that order over the cathode because power consumption can be decreased.

As the second electrode 7025 formed over the EL layer 7024, various materials can be used. For example, when the second electrode 7025 is used as an anode, it is preferable to use a material having a high work function, such as a light-transmitting conductive material such as ITO, IZO, or ZnO. In this embodiment, the second electrode 7025 is used as an anode, and an ITO film containing a silicon oxide is formed.

The light-emitting element 7022 corresponds to a region where the EL layer 7024 including a light-emitting layer is sandwiched between the first electrode 7023 and the second electrode 7025. In the case of the element structure illustrated in FIG. 15B, light emitted from the light-emitting element 7022 is emitted from both the second electrode 7025 side and the first electrode 7023 side as indicated by arrows.

Note that in FIG. 15B, light emitted from the light-emitting element 7022 to the first electrode 7023 side passes through a color filter layer 7043, an insulating layer 7042, an oxide insulating layer 7041, a gate insulating layer 7070, and a substrate 7020 to be emitted to the outside.

The color filter layer 7043 is formed by a droplet discharge method such as an inkjet method, a printing method, an etching method with the use of a photolithography technique, or the like.

The color filter layer 7043 is covered with an overcoat layer 7044, and also covered with a protective insulating layer 7045.

A contact hole which is formed in the protective insulating layer 7045 and the insulating layer 7042 and which reaches a connection electrode layer 7040 is provided in a portion which overlaps with the partition 7029.

Note that in the case where the light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure will be described with reference to FIG. 15C.

Figure 15C:
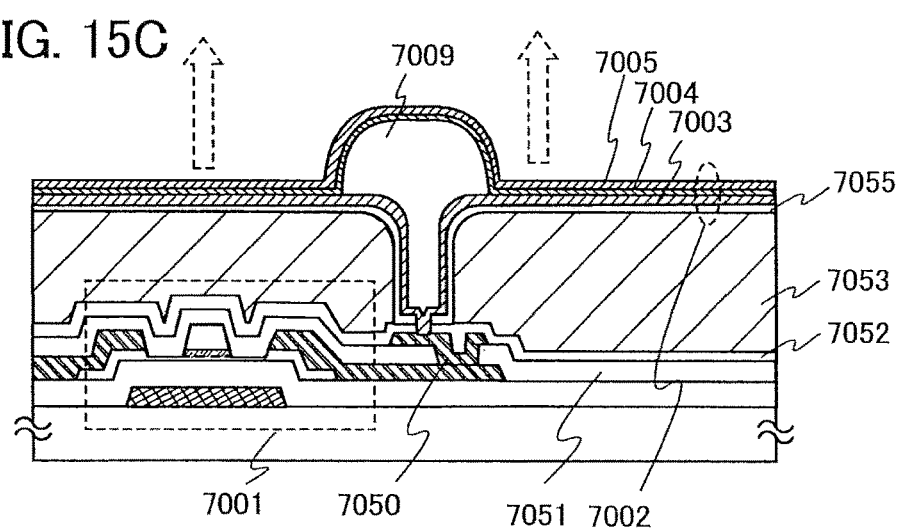

FIG. 15C is a cross-sectional view of a pixel in the case where the driver TFT 7001 is an n-channel TFT and light generated in a light-emitting element 7002 is emitted to pass through a second electrode 7005. In FIG. 15C, a first electrode 7003 of the light-emitting element 7002 is formed to be electrically connected to the drain electrode layer of the driver TFT 7001, and an EL layer 7004 and the second electrode 7005 are stacked in that order over the first electrode 7003.

The first electrode 7003 can be formed using any of a variety of materials; for example, when the first electrode 7003 is used as a cathode, it is preferable to use a material having a low work function, such as an alkali metal such as Li or Cs, an alkaline earth metal such as Mg, Ca, or Sr, an alloy containing any of these metals (e.g., Mg:Ag, Al:Li), or a rare earth metal such as Yb or Er.

The EL layer 7004 which is formed over the first electrode 7003 and the partition 7009 may include at least a light-emitting layer and be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003. Note that it is not necessary to form all of these layers.

The stacking order is not limited to the above stacking order, and a hole-injection layer, a hole-transport layer, a light-emitting layer, an electron-transport layer, and an electron-injection layer may be stacked in that order over the first electrode 7003 which is used as an anode.

In FIG. 15C, a hole-injection layer, a hole-transport layer, a light-emitting layer, an electron-transport layer, and an electron-injection layer are stacked in that order over a laminate film in which a Ti film, an aluminum film, and a Ti film are stacked in that order. Further, a stacked layer of a Mg:Ag alloy thin film and an ITO film is formed.

Note that when the TFT 7001 is an n-channel transistor, it is preferable that an electron-injection layer, an electron-transport layer, a light-emitting layer, a hole-transport layer, and a hole-injection layer be stacked in that order over the first electrode 7003 because an increase in voltage of the driver circuit can be suppressed and power consumption can be decreased.

The second electrode 7005 is formed using a light-transmitting conductive material; for example, a light-transmitting conductive film of an indium oxide containing a tungsten oxide, an indium zinc oxide containing a tungsten oxide, an indium oxide containing a titanium oxide, an indium tin oxide containing a titanium oxide, an indium tin oxide, an indium zinc oxide, an indium tin oxide to which a silicon oxide is added, or the like can be used.

The light-emitting element 7002 corresponds to a region where the EL layer 7004 including a light-emitting layer is sandwiched between the first electrode 7003 and the second electrode 7005. In the case of the element structure illustrated in FIG. 15C, light is emitted from the light-emitting element 7002 to the second electrode 7005 side as indicated by an arrow.

In FIG. 15C, the drain electrode layer of the TFT 7001 is electrically connected to the first electrode 7003 through a contact hole formed in an oxide insulating layer 7051, a protective insulating layer 7052, and an insulating layer 7055. A planarizing insulating layer 7053 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed of these materials. There is no particular limitation on the method for forming the planarizing insulating layer 7053, and the planarizing insulating layer 7053 can be formed, depending on the material, by a method such as a sputtering method, an SOG method, spin coating, dipping, spray coating, or a droplet discharge method (e.g., an ink-jet method, screen printing, or offset printing), or with a tool (equipment) such as a doctor knife, a roll coater, a curtain coater, or a knife coater.

The partition 7009 is provided so as to insulate the first electrode 7003 and the first electrode 7003 of an adjacent pixel. The partition 7009 can be formed using an organic resin film of polyimide, acrylic, polyamide, epoxy, or the like; an inorganic insulating film; or organic polysiloxane. It is particularly preferable that the partition 7009 be formed using a photosensitive resin material to have an opening over the first electrode 7003 so that a sidewall of the opening is formed as an inclined surface with continuous curvature.

In the case where a photosensitive resin material is used for the partition 7009, a step of forming a resist mask can be omitted.

In the structure illustrated in FIG. 15C, for performing full color display, the light-emitting element 7002, one of light-emitting elements adjacent to the light-emitting element 7002, and the other of the light-emitting elements are, for example, a green emissive light-emitting element, a red emissive light-emitting element, and a blue emissive light-emitting element, respectively. Alternatively, a light-emitting display device capable of full color display may be manufactured using four kinds of light-emitting elements which include a white emissive light-emitting element in addition to three kinds of light-emitting elements.

In the structure of FIG. 15C, a light-emitting display device capable of full color display may be manufactured in such a way that all of a plurality of light-emitting elements which is arranged is white emissive light-emitting elements and a sealing substrate having a color filter or the like is placed on the light-emitting element 7002. A material which exhibits a single color such as white is formed and combined with a color filter or a color conversion layer, whereby full color display can be performed.

Needless to say, display of monochromatic light can also be performed. For example, a lighting device may be formed with the use of white light emission, or an area-color light-emitting device may be formed with the use of monochromatic light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a thin film transistor (a driver TFT) which controls the driving of a light-emitting element is electrically connected to the light-emitting element; however, a structure may be employed in which a TFT for current control is connected between the driver TFT and the light-emitting element.

The structure of the semiconductor device described in this embodiment is not limited to those illustrated in FIGS. 15A to 15C and can be modified in various ways based on the spirit of techniques of the present invention.

Figures 16A, 16B:
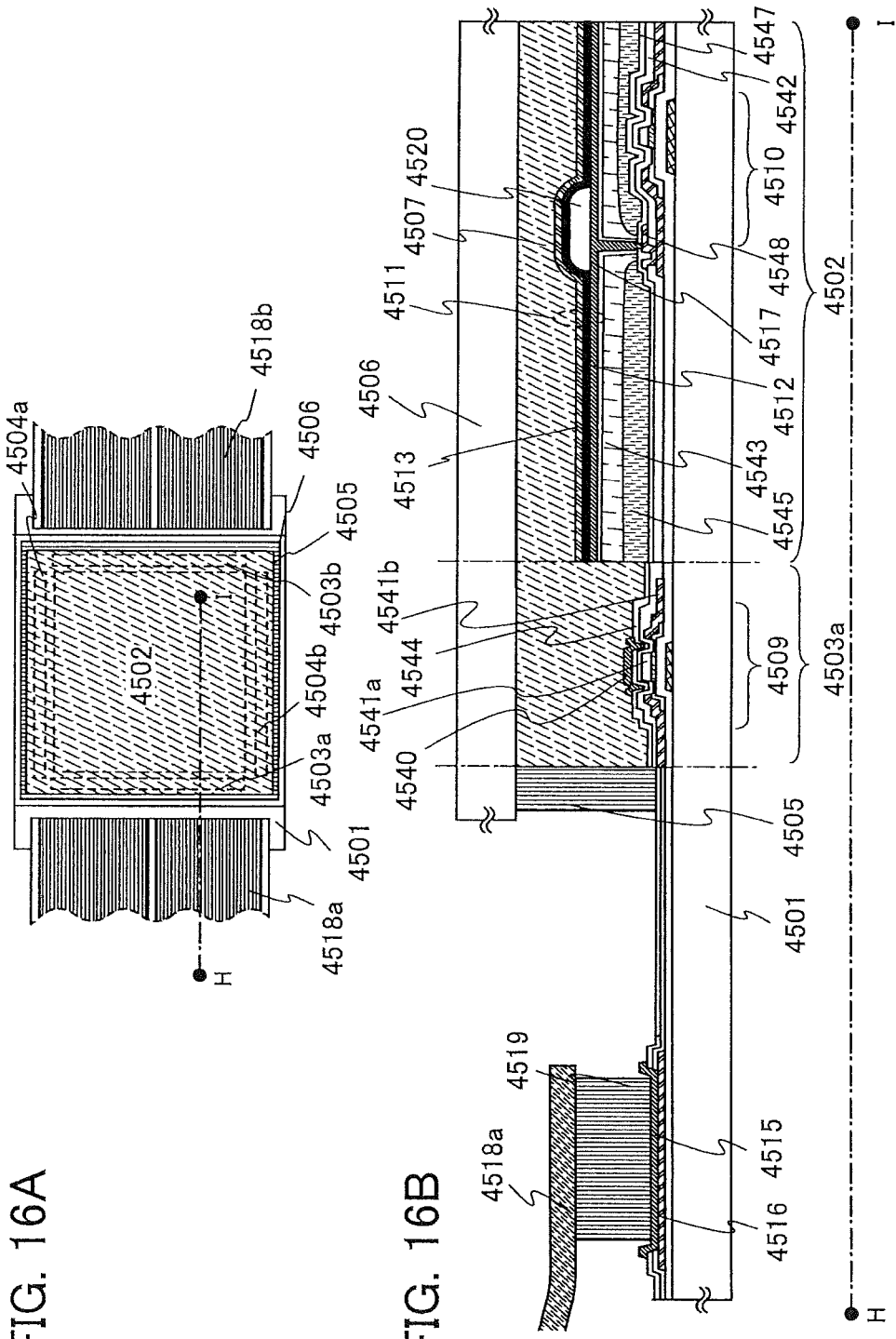
FIG. 16A is a plan view and FIG. 16B is a cross-sectional view illustrating one embodiment of the present invention.

Next, the appearance and the cross section of a light-emitting display panel (also referred to as a light-emitting panel) which corresponds to one embodiment of a semiconductor device to which the thin film transistor described in Embodiment 1 or 2 is applied are described with reference to FIGS. 16A and 16B. FIG. 16A is a top view of a panel in which thin film transistors and a light-emitting element formed over a first substrate are sealed between the first substrate and a second substrate with a sealant. FIG. 16B is a cross-sectional view taken along line H-I of FIG. 16A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 16B.

Any of the highly reliable thin film transistors including an In—Ga—Zn—O-based film as the oxide semiconductor layer which are described in Embodiments 1 and 2 can be used as the thin film transistors 4509 and 4510. In this embodiment, the thin film transistors 4509 and 4510 are n-channel thin film transistors.

Over an insulating layer 4544, a conductive layer 4540 is provided in a position overlapping with a channel formation region of an oxide semiconductor layer of the thin film transistor 4509 used for a driver circuit. By providing the conductive layer 4540 so as to overlap with the channel formation region of the oxide semiconductor layer, the amount of change in the threshold voltage of the thin film transistor 4509 between before and after the BT test can be reduced. Further, the electric potential of the conductive layer 4540 may be equal to or different from that of a gate electrode layer of the thin film transistor 4509. The conductive layer 4540 can function also as a second gate electrode layer. Alternatively, the electric potential of the conductive layer 4540 may be a GND potential or 0 V, or the conductive layer 4540 may be in a floating state.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that a structure of the light-emitting element 4511 is a stacked-layer structure of the first electrode layer 4517, an electroluminescent layer 4512, and a second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and electric potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive film that is used for the first electrode layer 4517 included in the light-emitting element 4511. A terminal electrode 4516 is formed using the same conductive film that is used for the source and drain electrode layers included in the thin film transistors 4509 and 4510.

The connection terminal electrode 4515 is electrically connected to a terminal included in the FPC 4518a via an anisotropic conductive film 4519.

The second substrate located in the direction in which light is extracted from the light-emitting element 4511 should have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, an anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. In addition, only the signal line driver circuits or part thereof, or the scan line driver circuits or part thereof may be separately formed and mounted. This embodiment is not limited to the structure illustrated in FIGS. 16A and 16B.

Through the above process, a highly reliable light-emitting display device (display panel) as a semiconductor device can be manufactured.

Note that the structure described in this embodiment can be combined with any of the structures described in other embodiments as appropriate.

Embodiment 7

A semiconductor device to which the thin film transistor described in Embodiment 1 or 2 is applied can be used as electronic paper. Electronic paper can be used for electronic devices of a variety of fields as long as they can display data. For example, electronic paper can be applied to an e-book reader (electronic book), a poster, an advertisement in a vehicle such as a train, or displays of various cards such as a credit card. Examples of the electronic devices are illustrated in FIGS. 17A and 17B and FIG. 18.

Figure 17A:
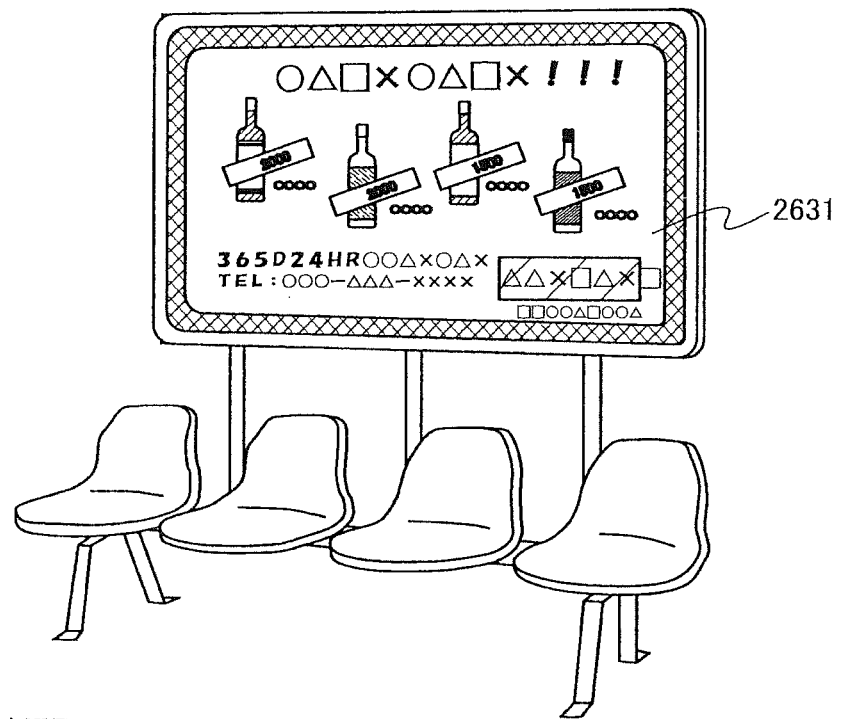
FIGS. 17A and 17B are views illustrating examples of usage patterns of electronic paper.

FIG. 17A illustrates a poster 2631 using electronic paper. In the case where an advertising medium is printed paper, the advertisement is replaced by hands; however, by using the electronic paper, the advertising display can be changed in a short time. Furthermore, stable images can be obtained without display defects. Note that the poster may have a configuration capable of wirelessly transmitting and receiving data.

Figure 17B:
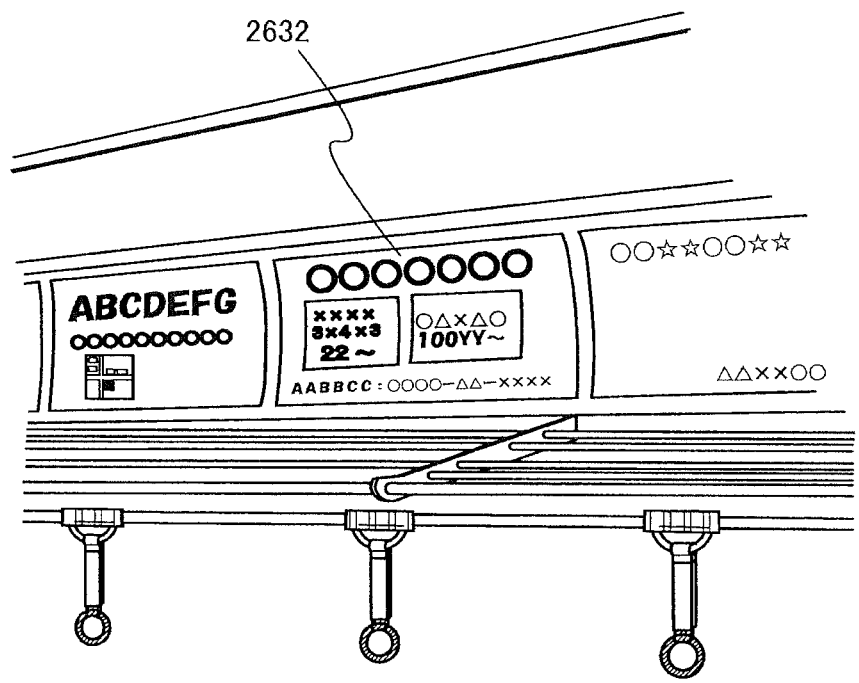

FIG. 17B illustrates an advertisement 2632 in a vehicle such as a train. In the case where an advertising medium is paper, the advertisement is replaced by hand, but in the case where it is electronic paper, much manpower is not needed and the advertising display can be changed in a short time. Furthermore, stable images can be obtained without display defects. Note that the advertisement in a vehicle may have a configuration capable of wirelessly transmitting and receiving data.

Figure 18:
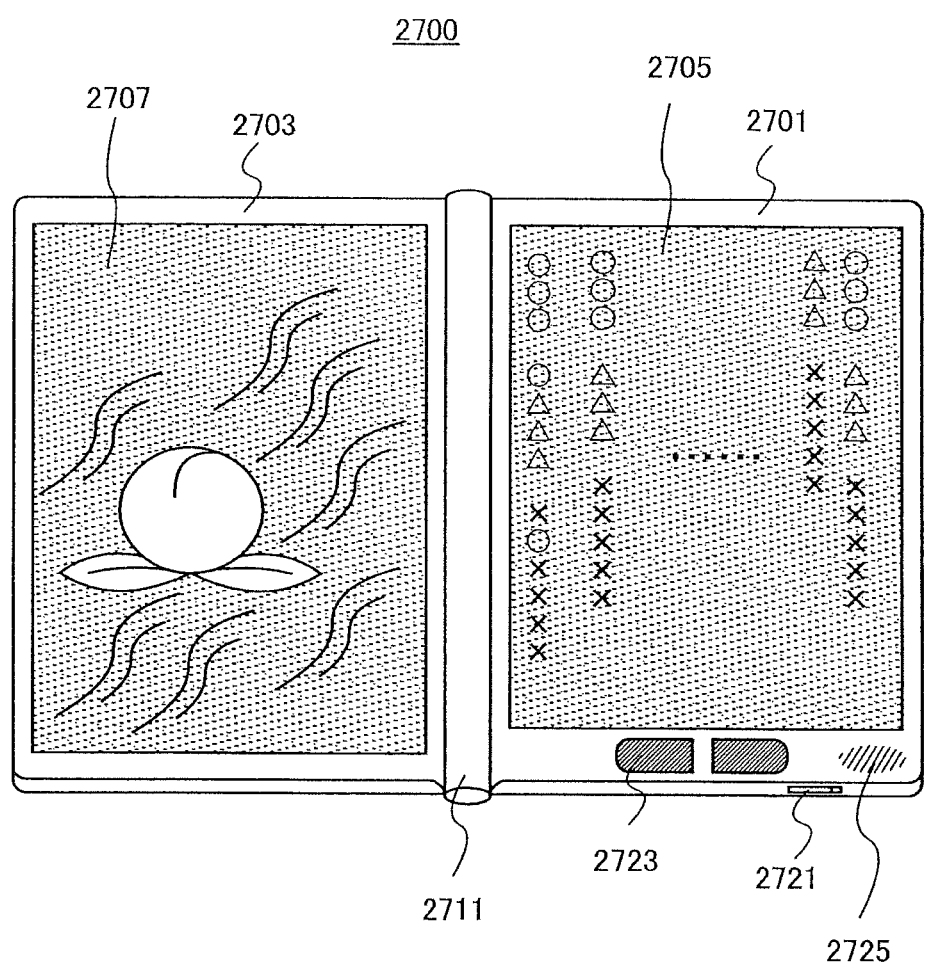
FIG. 18 is an external view of one example of an electronic book reader.

FIG. 18 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 18) can display text and the left display portion (the display portion 2707 in FIG. 18) can display an image.

In the example illustrated in FIG. 18, the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that the structure described in this embodiment can be combined with any of the structures described in other embodiments as appropriate.

Embodiment 8

A semiconductor device using the thin film transistor described in Embodiment 1 or 2 can be applied to a variety of electronic appliances (including a game machine). Examples of electronic devices are a television device (also referred to as a television or a television receiver), a monitor of a computer or the like, a camera such as a digital camera or a digital video camera, a digital photo frame, a mobile phone (also referred to as a mobile phone handset or a mobile phone device), a portable game console, a portable information terminal, an audio reproducing device, a large-sized game machine such as a pachinko machine, and the like.

Figure 19A:
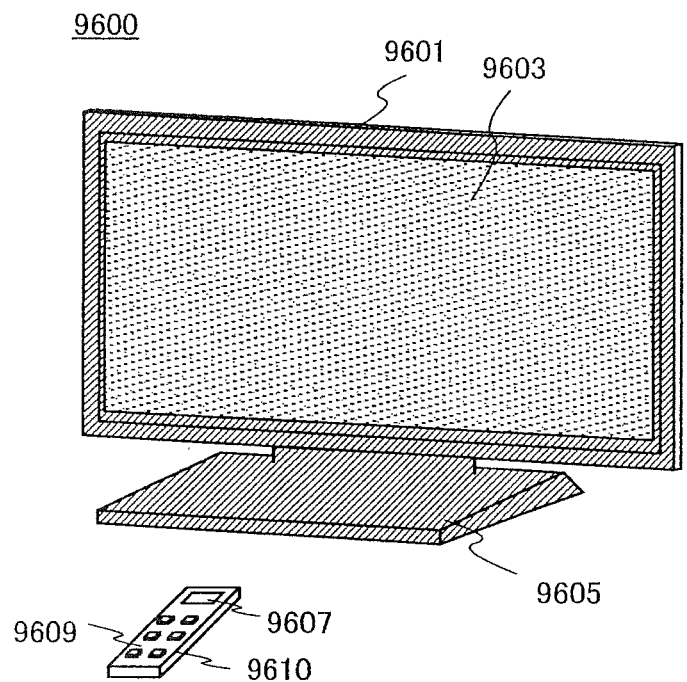
FIGS. 19A and 19B are external views illustrating examples of a television device and a digital photo frame, respectively.

FIG. 19A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Moreover, when the television device 9600 is connected to a communication network with or without wires via the modem, one-way (from a sender to a receiver) or two-way (between a sender and a receiver or between receivers) information communication can be performed.

Figure 19B:
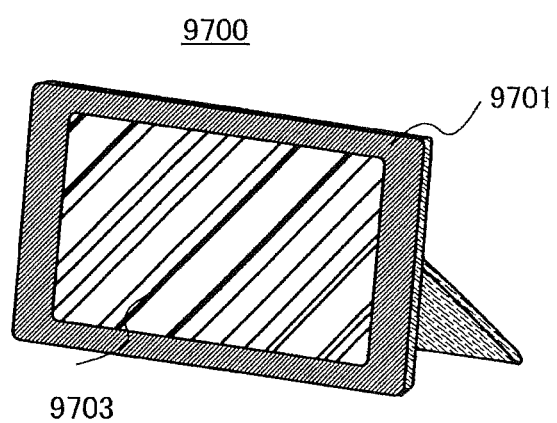

FIG. 19B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 20A:
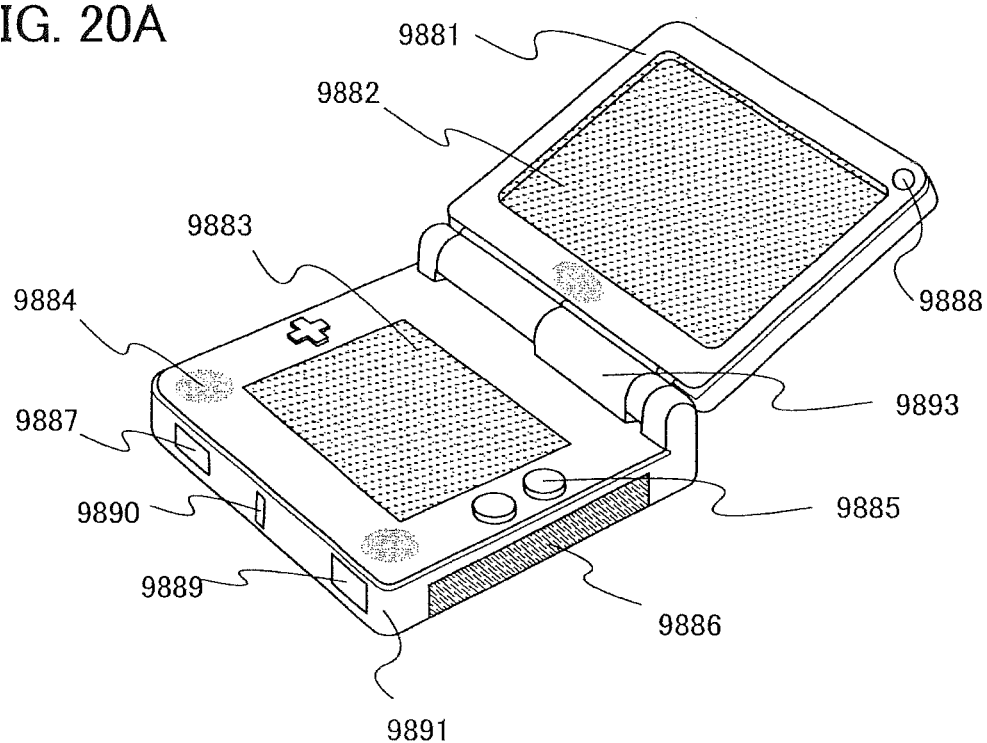
FIGS. 20A and 20B are external views illustrating examples of game machines.

FIG. 20A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 20A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to the above and other structures provided with at least a semiconductor device of the present invention may be employed. The portable game machine may include other accessories, as appropriate. The portable game machine illustrated in FIG. 20A has a function of reading a program or data stored in the recording medium to display it on the display portion, and a function of sharing information with another portable game machine by wireless communication. Note that a function of the portable game machine illustrated in FIG. 20A is not limited to the above, and the portable game machine can have a variety of functions.

Figure 20B:
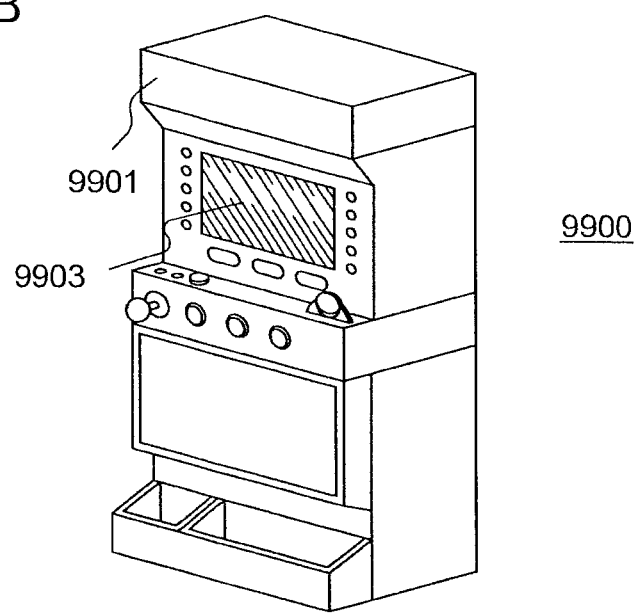

FIG. 20B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of the present invention may be employed. The slot machine 9900 may include other accessories, as appropriate.

Figure 21A:
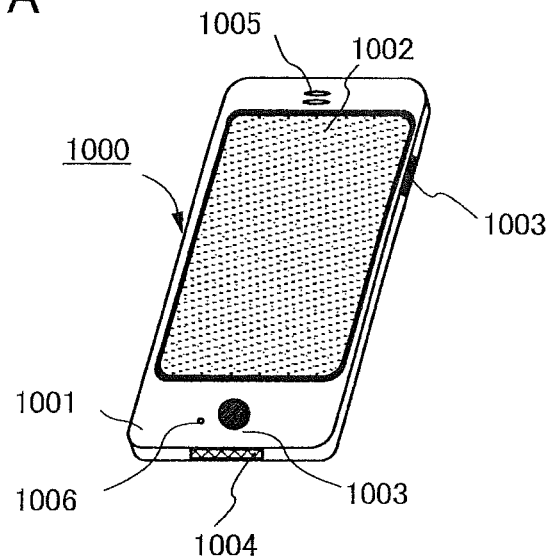
FIGS. 21A and 21B are external views illustrating examples of mobile phones.

FIG. 21A illustrates an example of a mobile phone. A mobile phone 1000 includes a display portion 1002 incorporated in a housing 1001, an operation button 1003, an external connection port 1004, a speaker 1005, a microphone 1006, and the like.

When the display portion 1002 illustrated in FIG. 21A is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 21B:
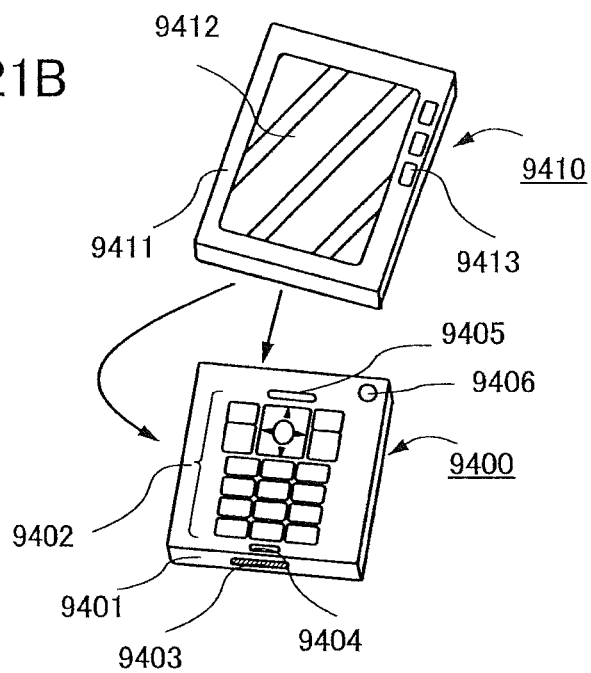

FIG. 21B also illustrates an example of a mobile phone. The mobile phone in FIG. 21B includes an a display device 9410 in which a display portion 9412 and an operation button 9413 are included in a housing 9411, and a communication device 9400 in which operation buttons 9402, an external input terminal 9403, a microphone 9404, a speaker 9405, and a light-emitting portion 9406 that emits light when a phone call is received are included in a housing 9401. The display device 9410 having a display function can be detached from or attached to the communication device 9400 having a telephone function in two directions as indicated by arrows. Thus, a short axis of the display device 9410 can be attached to a short axis of the communication device 9400, and a long axis of the display device 9410 can be attached to a long axis of the communication device 9400. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be combined with any of the structures described in other embodiments as appropriate.

Embodiment 9

In this embodiment, differences in a phenomenon in which oxygen moves when an oxide semiconductor layer is in contact with a metal layer (a conductive layer) or an oxide insulating layer between the case of an amorphous oxide semiconductor layer and the case of a crystalline oxide semiconductor layer are described using scientific computation results.

Figure 24:
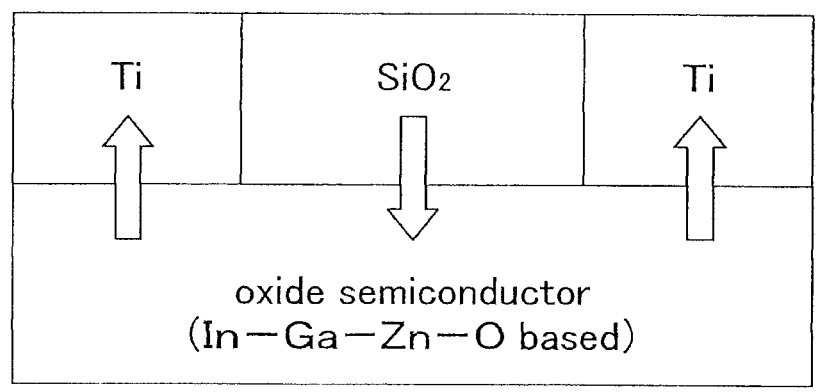
FIG. 24 is a diagram briefly illustrating scientific computing.

FIG. 24 is a schematic view of a state where an oxide semiconductor layer is in contact with a metal layer to serve as a source electrode layer and a drain electrode layer and the oxide insulating layer in a structure of a thin film transistor which is one embodiment of the present invention. The directions of arrows indicate a direction of movement of oxygen in a state where these are in contact with each other or a state where these are heated.

When oxygen vacancies occur, an i-type oxide semiconductor layer has n-type conductivity, whereas when oxygen is oversupplied, an n-type oxide semiconductor layer caused by oxygen vacancies becomes an i-type oxide semiconductor layer. This effect is utilized in an actual device process, and in the oxide semiconductor layer which is in contact with the metal layer to serve as a source electrode layer and a drain electrode layer, oxygen is pulled to the metal side, and oxygen vacancies occur in part of a region, which is in contact with the metal layer (in the case of a small thickness, in an entire region in the film thickness direction), whereby the oxide semiconductor layer becomes an n-type oxide semiconductor layer and favorable contact with the metal layer can be obtained. In addition, oxygen is supplied from the oxide insulating layer to the oxide semiconductor layer in contact with the oxide insulating layer, and part of a region of the oxide semiconductor layer, which is in contact with the oxide insulating layer (in the case of a small thickness, in the entire region in the film thickness direction), contains excessive oxygen, to be an i-type region, whereby the oxide semiconductor layer becomes an i-type oxide semiconductor layer and functions as a channel formation region of a thin film transistor.

In one embodiment of the present invention, in a region where the oxide semiconductor layer is in contact with the metal layer which serves as a source electrode layer and a drain electrode layer and the oxide insulating layer, a crystal region is formed, and differences in oxygen movement states between the case where the region is in an amorphous state and the case where the region is a crystal region were examined by scientific computing.

Figure 25A:
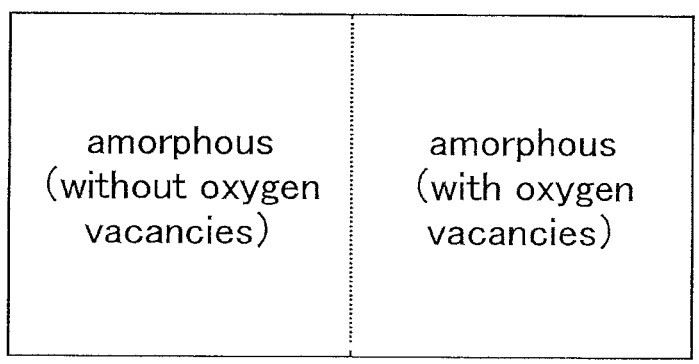
FIGS. 25A and 25B are diagrams briefly illustrating scientific computing.
Figure 25B:
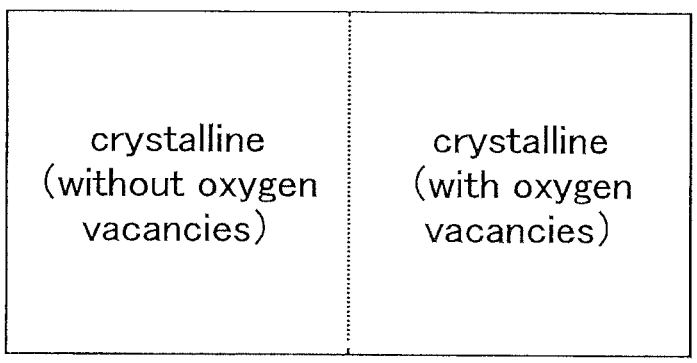

Models used for scientific computing have an In—Ga—Zn—O-based amorphous structure and an In—Ga—Zn—O-based crystal structure. In each of the models, one of regions in a longitudinal direction of a rectangular solid was deficient in oxygen by 10% as compared with the other region (see FIGS. 25A and 25B). The calculation is to compare distribution of oxygen in the In—Ga—Zn—O-based amorphous structure and the In—Ga—Zn—O-based crystal structure after ten nanoseconds under an accelerated condition of 650° C. Respective conditions are shown in Table 1 and Table 2.

TABLE 1

| | Structural Condition |
|---|---|
| Number of atoms | 317(oxgen = 192) |
| Lattice Constant | a = b = 1.3196 nm, c = 2.6101 nm, $\alpha = \beta = 90°, \gamma = 120°$ |
| Density | 6.23 g/cm$^3$ |

TABLE 2

| | Calculation Contents |
|---|---|
| Ensemble | NTV(Number of atoms, Temperature, Volume fixing) |
| Temperature | 923 K |
| Step size of time | 0.2 fs |
| Total calculate time | 10 ns |
| Potential | Applying "Born-Mayer-Huggins type" to "Metal-Oxgen & Oxygen-Oxygen" |
| Charge | In: +3, Ga: +3, Zn: +2, O: −2 |

Figure 26A:
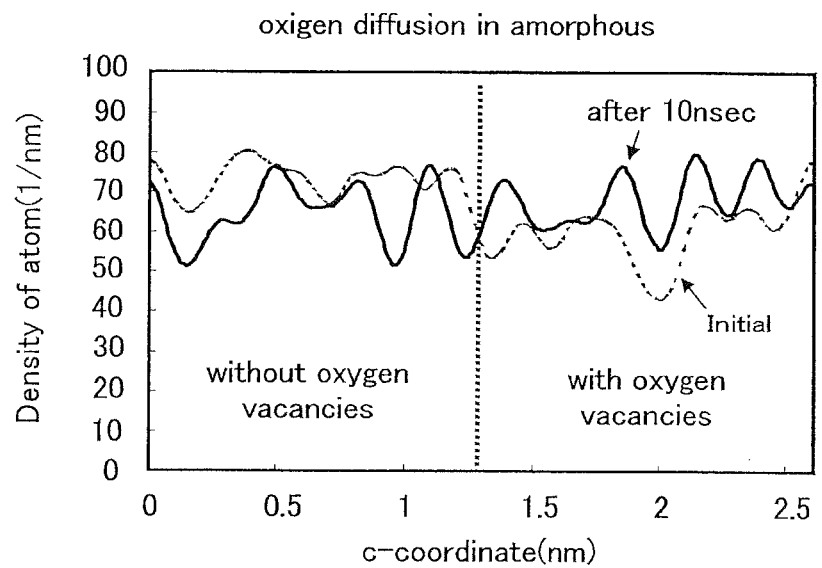
FIGS. 26A and 26B are graphs showing results of scientific computing.
Figure 26B:
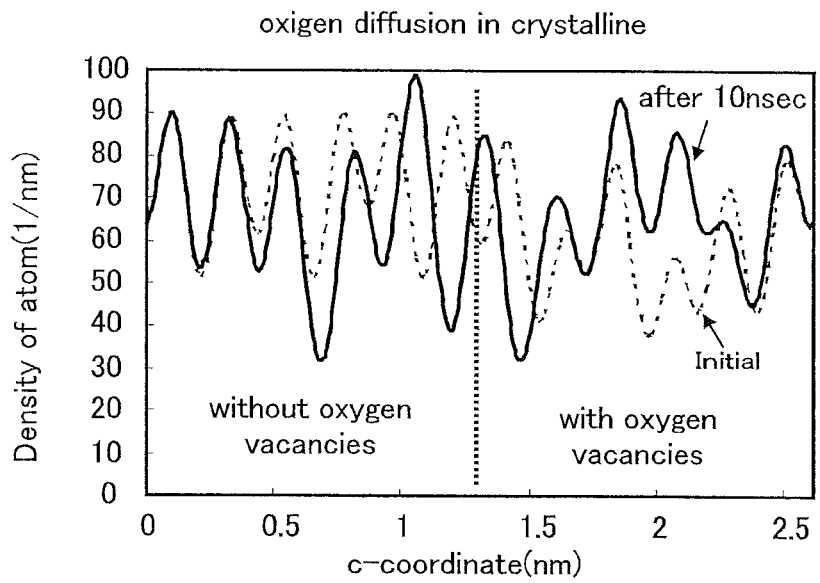

Distribution of oxygen in the case of using an amorphous oxide semiconductor layer is shown in FIG. 26A, and distribution of oxygen in the case of using a crystalline oxide semiconductor layer is shown in FIG. 26B. A dotted line indicates an initial state (Initial), and a solid line indicates a result (after ten nanoseconds). It is found that oxygen moves regardless of whether the amorphous oxide semiconductor layer or the crystalline oxide semiconductor layer is used.

The increasing rates of oxygen atoms between before and after calculation in a region having oxygen vacancies were 15.9% in the case of the amorphous oxide semiconductor layer and 11.3% in the case of the crystalline oxide semiconductor layer. That is, oxygen in the amorphous oxide semiconductor layer is more likely to move than oxygen in the crystalline oxide semiconductor layer, resulting in easily compensating for the oxygen vacancies. In other words, oxygen in the crystalline oxide semiconductor layer is relatively less likely to move than oxygen in the amorphous oxide semiconductor layer.

Therefore, it is also found that oxygen moves in the oxide semiconductor layer in one embodiment of the present invention having the crystal region, in a manner similar to that of the case of the amorphous oxide semiconductor layer. It is also found that the crystal region has an effect in which elimination of oxygen from the oxide semiconductor layer is suppressed because oxygen is relatively less likely to move in the crystalline oxide semiconductor layer than in the amorphous oxide semiconductor layer.

This application is based on Japanese Patent Application serial no. 2009-234413 filed with Japan Patent Office on Oct. 8, 2009, the entire contents of which are hereby incorporated by reference.

EXPLANATION OF REFERENCE

10: pulse output circuit, 11: wiring, 12: wiring, 13: wiring, 14: wiring, 15: wiring, 16: wiring, 17: wiring, 21: input terminal, 22: input terminal, 23: input terminal, 24: input terminal, 25: input terminal, 26: output terminal, 27: output terminal, 28: thin film transistor, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 103: oxide semiconductor film, 105: oxide insulating film, 106: crystal region, 110: pixel electrode layer, 128: transparent conductive film, 400: substrate, 402: gate insulating layer, 410: thin film transistor, 411: terminal, 412: connection electrode, 414: terminal, 415: transparent conductive film, 416: electrode, 418: transparent conductive film, 421*a*: gate electrode layer, 421*b*: capacitor wiring, 421*c*: terminal, 423: oxide semiconductor layer, 424*a*: first region, 424*b*: second region, 424*c*: third region, 424*d*: fourth region, 424*e* fifth region, 425*a*: source electrode layer, 425*b*: drain electrode layer, 426*a*: oxide insulating layer, 426*b*: oxide insulating layer, 428: oxide insulating layer, 429: connection electrode, 430: thin film transistor, 450: thin film transistor, 456*a*: oxide insulating layer, 470: thin film transistor, 480*a*: resist mask, 480*b*: resist mask, 482*a*: resist mask, 482*b*: resist mask, 482*c*: resist mask, 490: thin film transistor, 580: substrate, 581: thin film transistor, 585: insulating layer, 587: electrode layer, 588: electrode layer, 589: spherical particle, 590*a*: black region, 590*b*: white region, 594: cavity, 595: filler, 596: substrate, 1000: mobile phone, 1001: housing, 1002: display portion, 1003: operation button, 1004: external connection port, 1005: speaker, 1006: microphone, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit substrate, 2613: diffusion plate, 2631: poster, 2632: advertisement in a vehicle, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4501: substrate, 4502: pixel portion, 4503*a*: signal line driver circuit, 4503*b*: signal line driver circuit, 4504*a*: scan line driver circuit, 4504*b*: scan line driver circuit, 4505: sealant, 4506: substrate, 4507: filler, 4509: thin film transistor, 4510: thin film transistor, 4511: light-emitting element, 4512: electroluminescent layer, 4513: second electrode layer, 4515: connection terminal electrode, 4516: terminal electrode, 4517: first electrode layer, 4518*a*: FPC, 4518*b*: FPC, 4519: anisotropic conductive film, 4520: partition, 4540: conductive layer, 4544: insulating layer, 5300: substrate, 5301: pixel portion, 5302: first scan line driver circuit, 5303: second scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: driver transistor, 6403: capacitor, 6404: light-emitting element, 6405: signal line, 6406: scan line, 6407: power supply line, 6408: common electrode, 7001:

TFT, 7002: light-emitting element, 7003: first electrode, 7004: EL layer, 7005: second electrode, 7009: partition, 7010: substrate, 7011: driver TFT, 7012: light-emitting element, 7013: electrode, 7014: EL layer, 7015: electrode, 7016: light-blocking film, 7017: conductive film, 7019: partition, 7020: substrate, 7021: driver TFT, 7022: light-emitting element, 7023: first electrode, 7024: EL layer, 7025: second electrode, 7027: conductive film, 7029: partition, 7030: connection electrode layer, 7031: oxide insulating layer, 7032: insulating layer, 7033: color filter layer, 7034: overcoat layer, 7035: protective insulating layer, 7040: connection electrode layer, 7041: oxide insulating layer, 7042: insulating layer, 7043: color filter layer, 7044: overcoat layer, 7045: protective insulating layer, 7051: oxide insulating layer, 7052: protective insulating layer, 7053: planarizing insulating layer, 7055: insulating layer, 7060: gate insulating layer, 7070: gate insulating layer, 9400: communication device, 9401: housing, 9402: operation button, 9403: external input terminal, 9404: microphone, 9405: speaker, 9406: light-emitting portion, 9410: display device, 9411: housing, 9412: display portion, 9413: operation button, 9600: television device, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: joint portion, 9900: slot machine, 9901: housing, 9903: display portion.

The invention claimed is:

1. A semiconductor device comprising:
a gate electrode layer;
a gate insulating layer over the gate electrode layer;
an oxide semiconductor layer over the gate insulating layer, the oxide semiconductor layer comprising:
a first region;
a second region;
a third region between the first region and the second region;
a fourth region between the first region and the third region; and
a fifth region between the second region and the third region;
a first insulating layer over the oxide semiconductor layer, the first insulating layer comprising oxygen;
a source electrode layer over the oxide semiconductor layer; and
a drain electrode layer over the oxide semiconductor layer,
wherein the first region is in contact with the source electrode layer,
wherein the second region is in contact with the drain electrode layer,
wherein the third region is in contact with the first insulating layer,
wherein the fourth region has a thickness less than the third region,
wherein the fifth region has a thickness less than the third region, and
wherein the oxide semiconductor layer comprises a nanocrystal.

2. The semiconductor device according to claim 1,
wherein the source electrode layer and the drain electrode layer comprise titanium.

3. The semiconductor device according to claim 1,
wherein the first insulating layer further comprises silicon.

4. The semiconductor device according to claim 1,
wherein the oxide semiconductor layer comprises indium.

5. The semiconductor device according to claim 1,
wherein the thickness of the fourth region is less than the first region and the second region, and
wherein the thickness of the fifth region is less than the first region and the second region.

6. The semiconductor device according to claim 1, further comprising a second insulating layer over the oxide semiconductor layer, the first insulating layer, the source electrode layer and the drain electrode layer,
wherein the second insulating layer is in contact with the fourth region of the oxide semiconductor layer and the fifth region of the oxide semiconductor layer.

7. The semiconductor device according to claim 6,
wherein the second insulating layer comprises oxygen.

8. A semiconductor device comprising:
a gate electrode layer;
a gate insulating layer over the gate electrode layer;
an oxide semiconductor layer over the gate insulating layer, the oxide semiconductor layer comprising:
a first region;
a second region;
a third region between the first region and the second region;
a fourth region between the first region and the third region; and
a fifth region between the second region and the third region;
a first insulating layer over the oxide semiconductor layer, the first insulating layer comprising oxygen;
a source electrode layer over the oxide semiconductor layer; and
a drain electrode layer over the oxide semiconductor layer,
wherein the first region is in contact with the source electrode layer,
wherein the second region is in contact with the drain electrode layer,
wherein the third region is in contact with the first insulating layer,
wherein the fourth region has a thickness less than the third region,
wherein the fifth region has a thickness less than the third region,
wherein the oxide semiconductor layer comprises a nanocrystal, and
wherein a size of the nanocrystal is greater than or equal to 1 nm and less than or equal to 20 nm.

9. The semiconductor device according to claim 8,
wherein the source electrode layer and the drain electrode layer comprise titanium.

10. The semiconductor device according to claim 8,
wherein the first insulating layer further comprises silicon.

11. The semiconductor device according to claim 8,
wherein the oxide semiconductor layer comprises indium.

12. The semiconductor device according to claim 8,
wherein the thickness of the fourth region is less than the first region and the second region, and
wherein the thickness of the fifth region is less than the first region and the second region.

13. The semiconductor device according to claim 8, further comprising a second insulating layer over the oxide semiconductor layer, the first insulating layer, the source electrode layer and the drain electrode layer,
wherein the second insulating layer is in contact with the fourth region of the oxide semiconductor layer and the fifth region of the oxide semiconductor layer.

14. The semiconductor device according to claim 13, wherein the second insulating layer comprises oxygen.

* * * * *